US012669538B2

(12) United States Patent
Chung et al.

(10) Patent No.: US 12,669,538 B2
(45) Date of Patent: Jun. 30, 2026

(54) APPARATUS FOR MEASURING A GATE LEAKAGE CURRENT OF A TRANSISTOR

(71) Applicant: CITY UNIVERSITY OF HONG KONG, Kowloon (HK)

(72) Inventors: Shu Hung Henry Chung, Hong Kong (HK); Ho Tin Tang, Tsuen Wan (HK)

(73) Assignee: CITY UNIVERSITY OF HONG KONG, Kowloon (HK)

( * ) Notice: Subject to any disclaimer, the term of this patent is extended or adjusted under 35 U.S.C. 154(b) by 178 days.

(21) Appl. No.: 18/656,143

(22) Filed: May 6, 2024

(65) Prior Publication Data

US 2025/0341565 A1     Nov. 6, 2025

(51) Int. Cl.
| | |
|---|---|
| *G01R 31/30* | (2006.01) |
| *G01R 31/26* | (2020.01) |
| *H03F 3/45* | (2006.01) |

(52) U.S. Cl.
CPC ..... *G01R 31/3008* (2013.01); *G01R 31/2621* (2013.01); *H03F 3/45174* (2013.01); *H03F 2200/261* (2013.01)

(58) Field of Classification Search
CPC ... H03F 3/20; H03F 3/21; H03F 3/217; H03F 3/217145; H03F 3/45071; H03F 3/45076; H03F 3/4508; H03F 3/45174; H03F 3/45179; H03F 3/45273; G01R 31/26; G01R 31/2601; G01R 31/2607; G01R 31/2621; G01R 31/30; G01R 31/3004; G01R 31/3008; G01R 31/50; G01R 31/52
See application file for complete search history.

(56) References Cited

U.S. PATENT DOCUMENTS

| | | | | | |
|---|---|---|---|---|---|
| 6,348,806 | B1* | 2/2002 | Okandan | .............. | G01R 31/275 |
| | | | | | 324/762.02 |
| 11,145,382 | B1* | 10/2021 | Ramanan | ......... | G11C 29/12005 |
| 2006/0012391 | A1* | 1/2006 | Huang | ................. | G01R 31/275 |
| | | | | | 324/762.09 |
| 2006/0097774 | A1* | 5/2006 | Hasegawa | ............... | G05F 3/262 |
| | | | | | 327/538 |
| 2006/0214695 | A1* | 9/2006 | Lih | .................... | H03K 19/0963 |
| | | | | | 326/98 |
| 2012/0326690 | A1* | 12/2012 | Sicard | .................. | H03K 17/687 |
| | | | | | 323/299 |

(Continued)

OTHER PUBLICATIONS

F. Erturk and B. Akin, "A method for online ageing detection in SiC MOSFETs," 2017 IEEE Applied Power Electronics Conference and Exposition (APEC), 2017, pp. 3576-3581.

(Continued)

*Primary Examiner* — Huy Q Phan
*Assistant Examiner* — David B Frederiksen
(74) *Attorney, Agent, or Firm* — Merchant & Gould P.C.

(57) ABSTRACT

An apparatus for measuring a gate leakage current of a MOSFET. The apparatus includes a current mirror adapted to be connected to a gate of a MOSFET, a gate driver adapted to generate a driving signal for the MOSFET, and a sensing resistor connected to the current mirror. An input current path of the current mirror is adapted to receive a gate leakage current of the MOSFET. The current mirror provides a high sensitivity of the measurement because the voltage across the current mirror is nearly constant, which therefore caters for different situations no matter if the gate leakage current is high or low.

12 Claims, 46 Drawing Sheets

(56) References Cited

U.S. PATENT DOCUMENTS

| | | | |
|---|---|---|---|
| 2018/0059166 A1* | 3/2018 | Bodano | G01R 31/27 |
| 2021/0325443 A1* | 10/2021 | Neidorff | G01R 31/3008 |
| 2023/0408577 A1* | 12/2023 | Sobolewski | G01R 31/3008 |
| 2024/0072530 A1* | 2/2024 | Forejtek | H03K 17/0822 |

OTHER PUBLICATIONS

F. Erturk, E. Ugur, J. Olson and B. Akin, "Real-Time Aging Detection of SiC MOSFETs," in IEEE Transactions on Industry Applications, vol. 55, No. 1, pp. 600-609, Jan.-Feb. 2019.

J. Wei et al., "Comprehensive Analysis of Electrical Parameters Degradations for SiC Power MOSFETs Under Repetitive Short-Circuit Stress," in IEEE Transactions on Electron Devices, vol. 65, No. 12, pp. 5440-5447, Dec. 2018.

H. Du, P. Diaz Reigosa, L. Ceccarelli and F. Iannuzzo, "Impact of Repetitive Short-Circuit Tests on the Normal Operation of SiC MOSFETs Considering Case Temperature Influence," in IEEE Journal of Emerging and Selected Topics in Power Electronics, vol. 8, No. 1, pp. 195-205, Mar. 2020.

J. Weckbrodt, N. Ginot, C. Batard and S. Azzopardi, "Monitoring of Gate Leakage Current on SiC Power MOSFETs: An Estimation Method for Smart Gate Drivers," in IEEE Transactions on Power Electronics, vol. 36, No. 8, pp. 8752-8760, Aug. 2021.

P. Wang, J. Zatarski, A. Banerjee and J. Donnal, "Condition Monitoring of SiC MOSFETs Utilizing Gate Leakage Current," 2020 IEEE Applied Power Electronics Conference and Exposition (APEC), New Orleans, LA, USA, 2020, pp. 1837-1843.

Z. Ni, Y. Li, X. Lyu, O. P. Yadav, and D. Cao, "Miller plateau as an indicator of SiC MOSFET gate oxide degradation," in Proc. IEEE Appl. Power Electron. Conf. Expo., Mar. 2018, pp. 1280-1287.

S. Pu, E. Ugur, F. Yang, G. Wang, and B. Akin, "In-situ degradation monitoring of SiC MOSFET based on switching transient measurement," IEEE Trans. Ind. Electron., pp. 1-1, 2019.

H. Tang, H.Chung and K.Chen, "Adaptive Level-Shift Gate Driver With Indirect Gate Oxide Health Monitoring for Suppressing Crosstalk of SiC MOSFETs," in IEEE Transactions on Power Electronics, vol. 38, No. 8, pp. 10196-10212, Aug. 2023.

A. Borghese, A. Di Costanzo, M. Riccio, L. Maresca, G. Breglio, and A. Irace, "Gate Current in p-GaN Gate HEMTs as a Channel Temperature Sensitive Parameter: A Comparative Study between Schottky- and Ohmic-Gate GaN HEMTs," Energies, vol. 14, No. 23, p. 8055, Dec. 2021.

* cited by examiner

APPARATUS FOR MEASURING A GATE LEAKAGE CURRENT OF A TRANSISTOR

FIELD OF INVENTION

This invention relates to electronic circuits, and in particular to circuits for measuring a gate leakage current of a transistor.

BACKGROUND OF INVENTION

Silicon carbide (SiC), which belongs to the wide bandgap family of materials, is a semiconductor compound containing silicon and carbon. It is utilized to produce switching devices, such as SiC MOSFETs, for high-power applications such as solar inverters, electric vehicles, and motor drives. Compared with traditional silicon (Si) MOSFETs, SiC MOSFETs enable higher switching speeds and breakdown voltages, achieving higher switching frequency and efficiency, and lower switching loss. However, gate oxide degradation is more severe in SiC MOSFETs than in Si MOSFETs because of the thinner gate oxide thickness, which causes a higher electric field across the gate oxide. Thus, gate oxide failure is well known to be one of the failure mechanisms in SiC MOSFETs.

Recently, it has been observed that gate-source leakage current is an effective precursor for real-time monitoring of gate-oxide conditions of SiC MOSFETs. The on-state gate-source leakage current can be increased significantly over time. A brand-new SiC device has the on-state gate-source leakage current on the order of hundreds of nano-Amperes (nA), but the value may increase to tens of (micro-Amperes) μA or (mini-Amperes) mA after aging, even if the device is still able to perform the switching function.

Various prior art techniques have been proposed to detect the leakage current or estimate the on-state gate-source resistance to perform real-time monitoring of gate oxide conditions. Since the gate current is proportional to the voltage across the gate resistor, the most straightforward method is based on measuring the voltage across $R_{on}$ to indirectly determine the leakage current. However, because of various drawbacks in this method, the direct measurement of the gate leakage current by a sensing resistor is only suitable for measuring the gate leakage current of MOSFETs close to the end of life, because by then the gate leakage current would have reached an extreme value. Another conventional method proposes to employ capacitors to collect the charge derived from the leakage current. By observing the time taken for the capacitor voltage to reach a predetermined threshold, the magnitude of the leakage current can be indirectly determined. However, because capacitor voltage is easily influenced by a lot of factors, there is a need for calibration, and the estimation of leakage current needs consideration of duty cycle, which make the measurement inconvenient and error-prone.

SUMMARY OF INVENTION

In the light of the foregoing background, it is an object of the present invention to focuses on the above-mentioned weakness and propose alternative method and apparatus of measuring gate leakage current of a transistor.

The above object is met by the combination of features of the main claim; the sub-claims disclose further advantageous embodiments of the invention.

One skilled in the art will derive from the following description other objects of the invention. Therefore, the foregoing statements of object are not exhaustive and serve merely to illustrate some of the many objects of the present invention.

Accordingly, the present invention in one aspect is an apparatus for measuring a gate leakage current of a MOSFET. The apparatus includes a current mirror adapted to be connected to a gate of a MOSFET, a gate driver adapted to generate a driving signal for the MOSFET, and a sensing resistor connected to the current mirror. An input current path of the current mirror is adapted to receive a gate leakage current of the MOSFET. The sensing resistor is located on an output current path of the current mirror.

In some embodiments, the apparatus further includes a turn-on resistor and a turn-off resistor, both of which are adapted to be connected to the gate of the MOSFET.

In some embodiments, the turn-on resistor is located on the input current path of the current mirror. The turn-off resistor has one end adapted to be connected to the MOSFET, and another end connected to the gate driver.

In some embodiments, the current mirror contains a first transistor and a second transistor having their base connected together. A collector of the first transistor is adapted to be connected to the gate of the MOSFET. A collector of the second transistor is connected to the sensing resistor.

In some embodiments, the collector of the first transistor is connected directly to the base of thereof. The apparatus further contains a diode that is connected between the collector and the base of the second transistor.

In some embodiments, an emitter of the first transistor and an emitter of the second transistor are connected directly to the gate driver.

In some embodiments, the apparatus further includes a bypass switch connected in parallel to the current mirror. The bypass switch is adapted to bypass the current mirror during a turn-on process of the MOSFET.

In some embodiments, the bypass switch contains a third transistor. The third transistor is located on a current path from the gate driver to MOSFET.

In some embodiments, an emitter of the third transistor is connected to the gate driver. A collector of the third transistor is adapted to connect to the MOSFET. A base of the third transistor is connected to the gate driver through a RC circuit.

In some embodiments, the apparatus further includes a discharging circuit connected to the current mirror. The discharging circuit is adapted to shorten a timer period required for the first transistor and the second transistor to transit from a saturation mode to a linear mode.

In some embodiments, the discharging circuit contains a comparator which has a first input connected to a reference voltage and a second input connected to the sensing resistor, a fourth transistor having a base connected an output of the comparator; a fourth resistor adapted to be connected between a collector of the fourth transistor and the gate of the MOSFET; and a third resistor connected between the base of the fourth transistor and a collector of the first transistor.

In some embodiments, the apparatus includes a diode connected between the base and the collector of the fourth transistor.

In some embodiments, one end of the sensing resistor is connected to the current mirror, and another end of the of the sensing resistor is connected to a source of the MOSFET.

Embodiments of the invention therefore provide apparatus and method for measuring gate leakage current of a MOSFET, which utilize a current mirror to perform switching operation and monitoring the gate source leakage current simultaneously. The current mirror provides a high sensitivity of the measurement because the voltage across the current mirror is nearly constant, which therefore caters for different situations no matter if the gate leakage current is high or low. In some embodiments of the invention, with a bypass switch the gate-source voltage of the MOSFET to be tested can be quickly increased, therefore shortening the time period required for the MOSFET to generate a steady-state leakage current for the test. As such, compared to some embodiments in which only the current mirror is present but without the bypass switch, the switching speed of the MOSFET to be tested is greatly improved when the bypass switch is configured in parallel with the current mirror in the circuit, which is comparable to the switching speed of MOFFET by conventional test circuits in which no current mirror is used. In some embodiments of the invention, with a discharging circuit the dynamic response of the current measurement circuit is also improved, which significantly shorten the time of measuring the gate-source leakage current. Moreover, the sensing operation of the current measurement circuit is independent of the duty cycle of the gate signal.

BRIEF DESCRIPTION OF FIGURES

The foregoing and further features of the present invention will be apparent from the following description of preferred embodiments which are provided by way of example only in connection with the accompanying figures, of which:

FIG. 6*i* shows the waveforms of $v_{gs}$, $v_s$ and $i_g$ when $R_{gss}$ equals to 4.7 kΩ in the simulation.

FIG. 7 shows the schematic diagram of a test circuit for testing the performance of various circuits for measuring gate leakage current of a SiC MOSFET, according to an embodiment of the invention.

In the drawings, like numerals indicate like parts throughout the several embodiments described herein.

DETAILED DESCRIPTION OF THE PREFERRED EMBODIMENTS

In the claims which follow and in the preceding description of the invention, except where the context requires otherwise due to express language or necessary implication, the word "comprise" or variations such as "comprises" or "comprising" is used in an inclusive sense, i.e. to specify the presence of the stated features but not to preclude the presence or addition of further features in various embodiments of the invention.

As used herein and in the claims, "couple" or "connect" refers to electrical coupling or connection either directly or indirectly via one or more electrical means unless otherwise stated. When describing a "direct connection", it means two circuit components, nodes, or terminals are connected to each other without any intermediate components therebetween.

Figure 1:
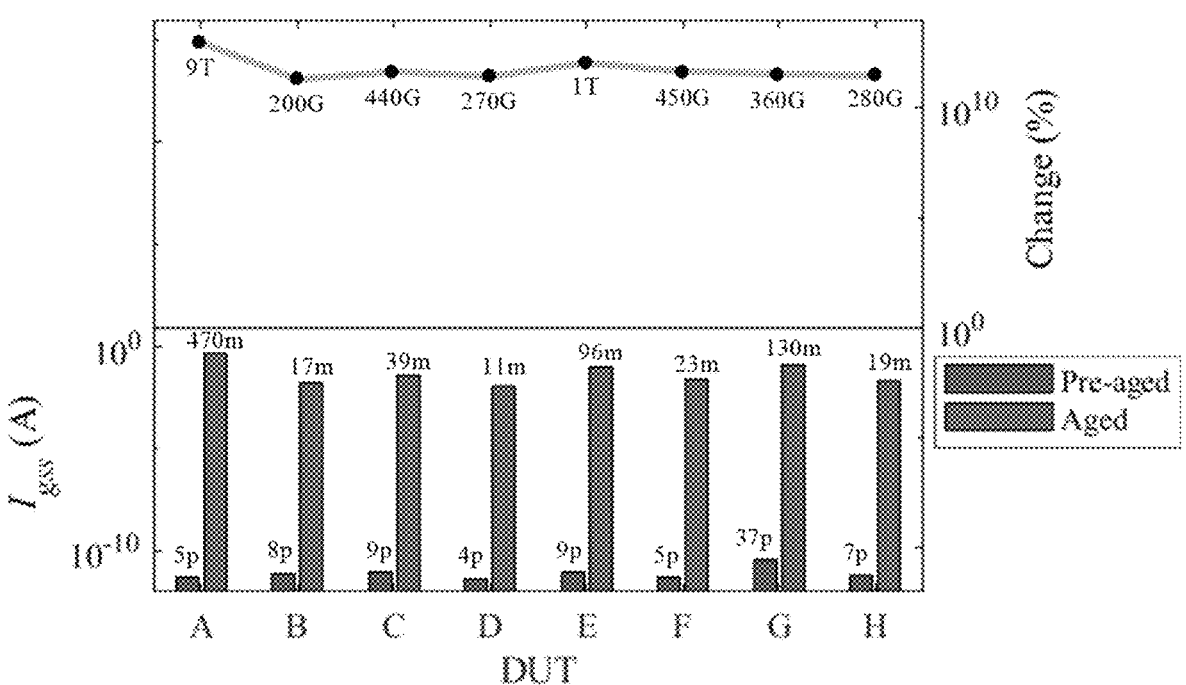
FIG. 1 shows a comparison of measured gate-source leakage current $I_{gss}$ of eight devices before and after undergoing 4000 cycles of short-circuit-current (SC) stress.

Before describing apparatuses for gate leakage current detection according to exemplary embodiments of the invention, the intrinsic characteristics of SiC MOSFETs in terms of gate-source leakage current will be discussed. FIG. 1 shows a comparison of the measured gate-source leakage current $I_{gss}$ of eight SiC MOSFET devices before and after undergoing 4000 cycles of short-circuit-current (SC) stress. The results reveal a notable increase in $I_{gss}$, with a significant percentage increment observed from a few picoamperes (pA) to tens or even hundreds of mA.

Figure 2:
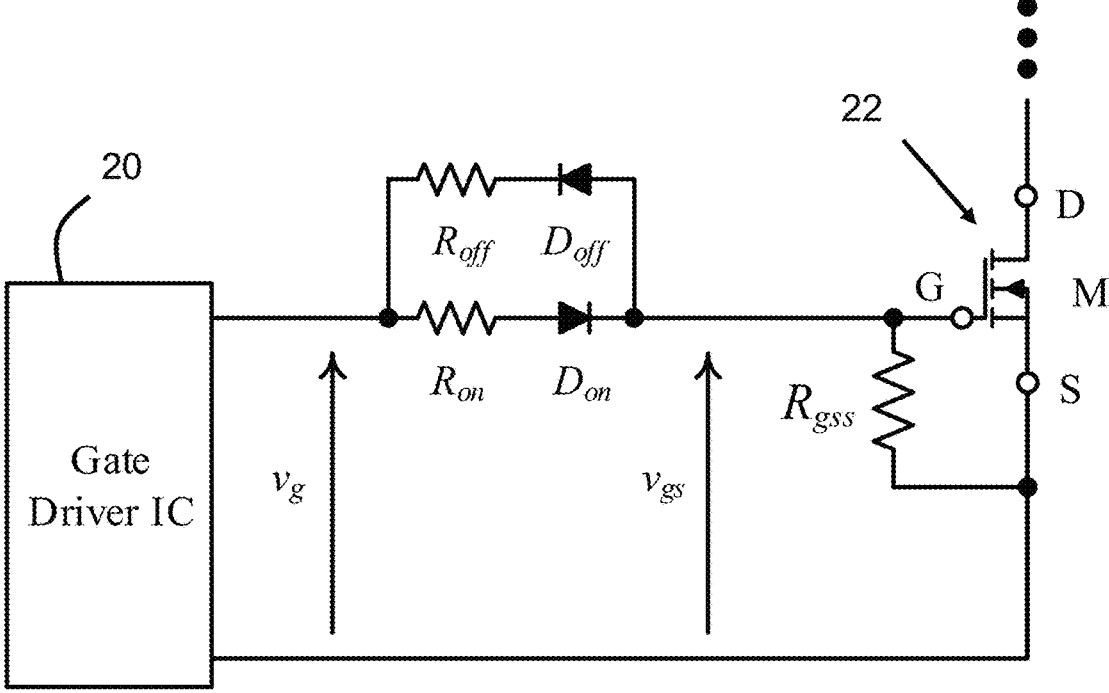
FIG. 2 shows an exemplary gate-driving circuit for a MOSFET.

FIG. 2 shows an exemplary gate-driving circuit, in which a MOSFET driver in the form of a gate driver IC 20 drives a SiC MOSFET 22 via a polarized resistive network. The input gate of the MOSFET 22 is modelled by a capacitor $C_{gs}$ to represent the gate-source capacitance and a resistor $R_{gss}$ to represent the gate-source leakage resistance. The gate driver IC 20 delivers a logical "HIGH" signal to turn on the MOSFET 22 via the diode $D_{ON}$ and the turn-on gate resistor $R_{ON}$. Conversely, the gate driver IC 20 delivers a logical "LOW" signal to turn off the MOSFET 22 via the diode $D_{OFF}$ and the turn-off gate resistor $R_{OFF}$. $R_{ON}$ and $R_{OFF}$ are sometimes of different values to control the turn-on and turn-off speeds. The polarized resistive network can be of other structures, but the objective of controlling the turn-on and turn-off profiles is the same. To reduce switching losses, the values of $R_{ON}$ and $R_{OFF}$ typically range from several ohms to tens of ohms.

Figure 3A:
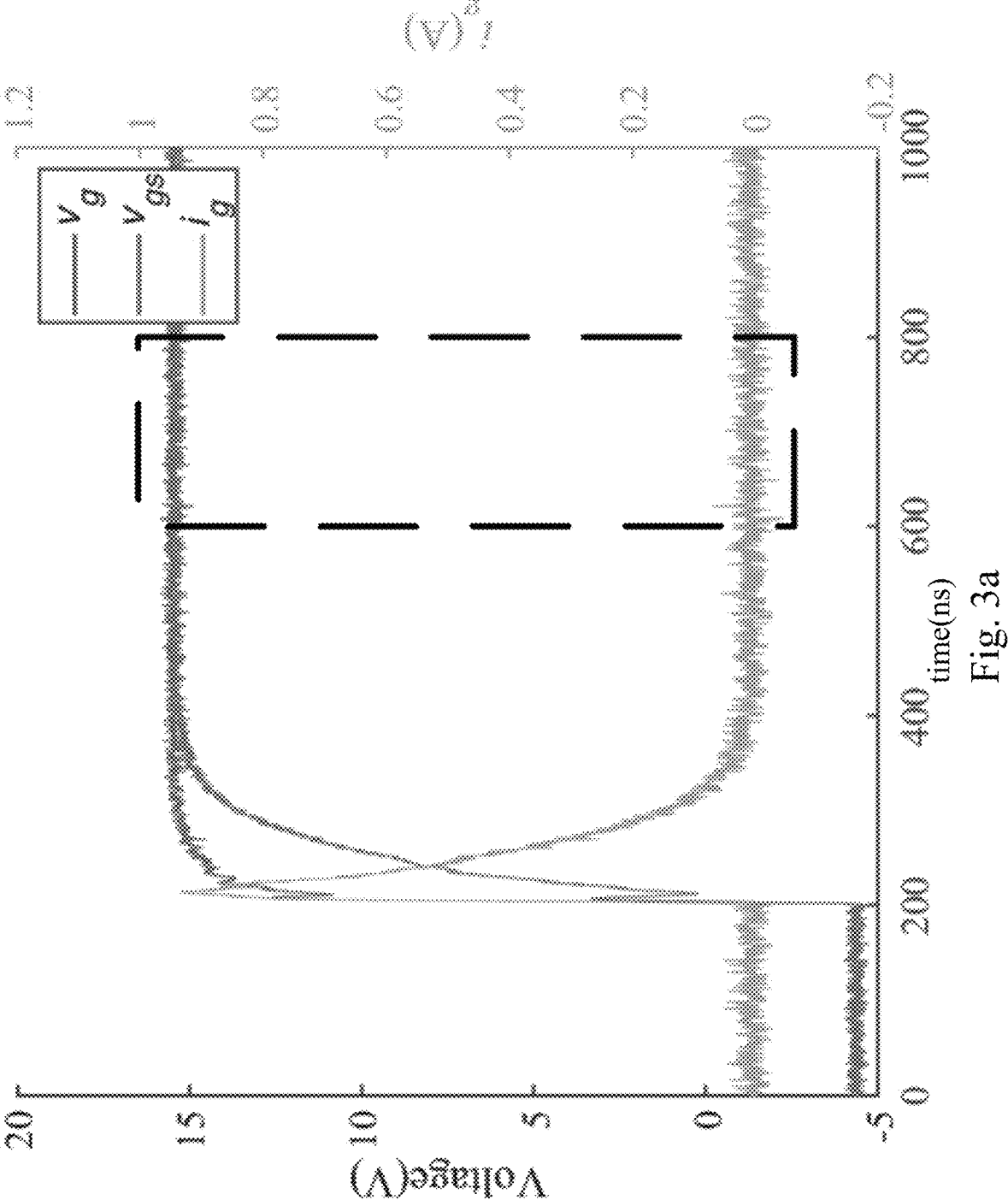
FIG. 3*a* shows experimental results of the output of a MOSFET driver, $v_g$, gate-source voltage, $v_{gs}$, and gate current, $i_g$ for a brand new SiC MOSFET.
Figure 3B:
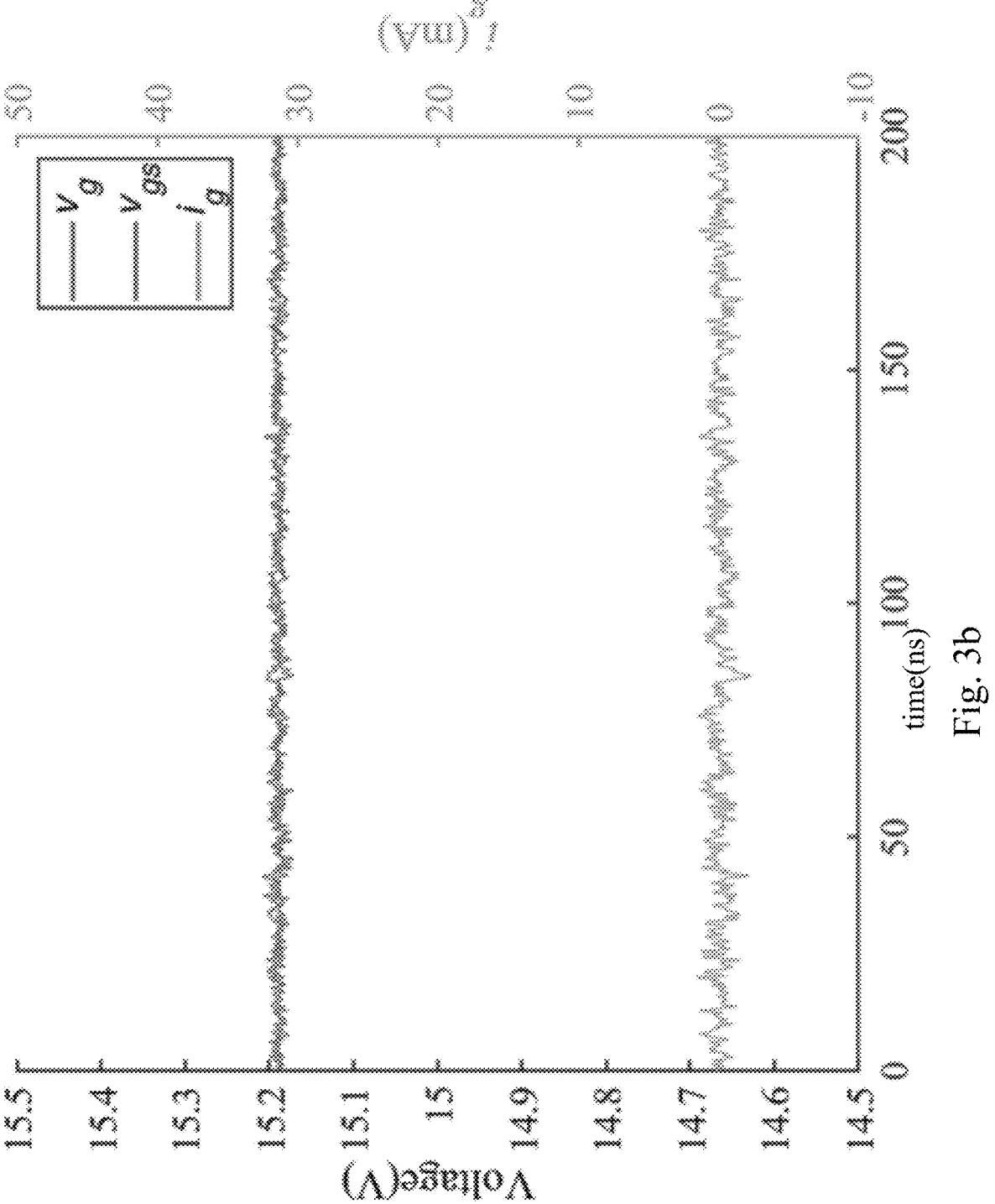
FIG. 3*b* is an enlarged view of steady-state waveforms as marked by the dash-lined block in FIG. 3*a*.
Figure 3C:
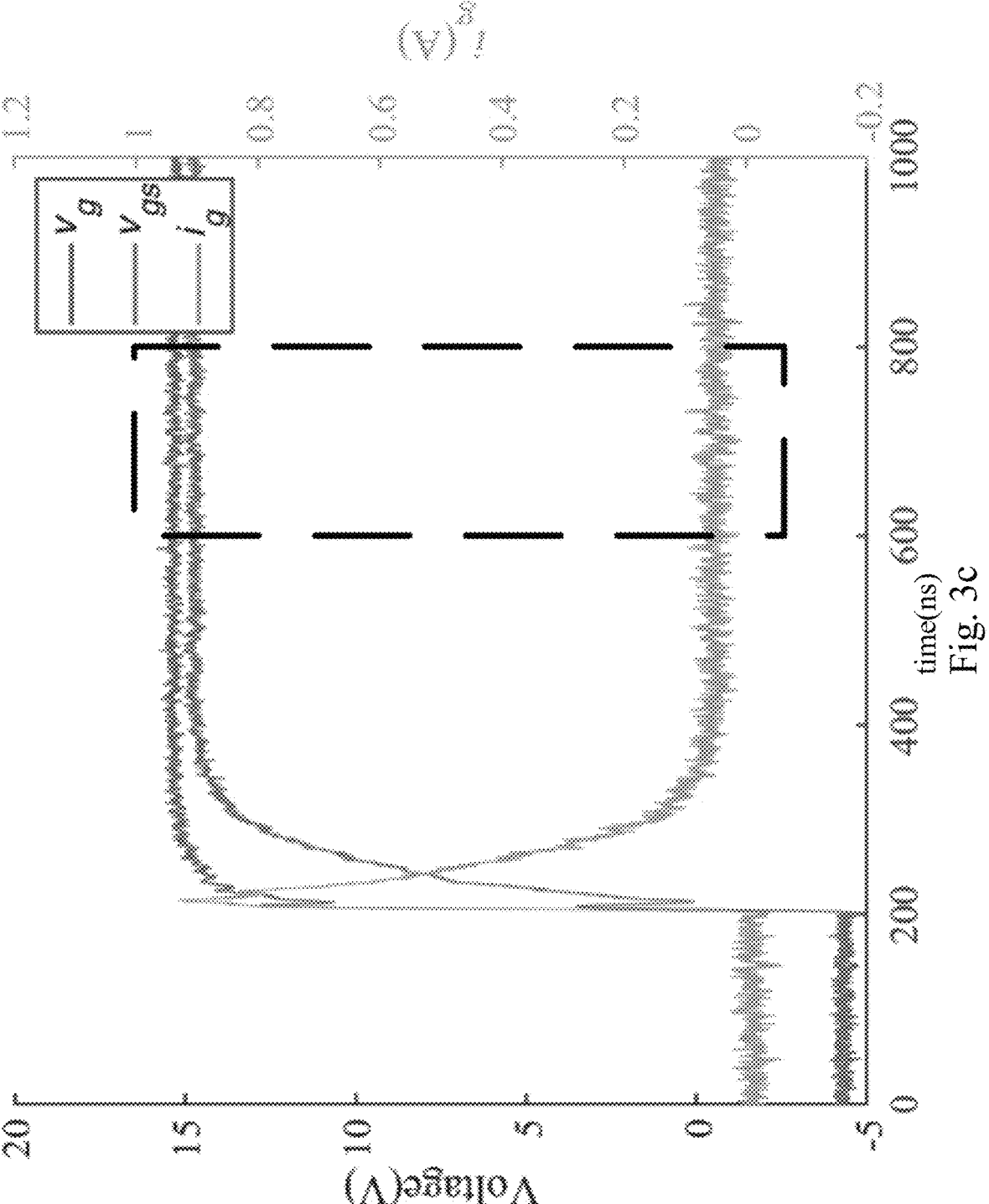
FIG. 3*c* shows experimental results of the output of a MOSFET driver, $v_g$, gate-source voltage, $v_{gs}$, and gate current, $i_g$, after the SiC MOSFET of FIG. 3*a* has been aged for 4000 power cycles.
Figure 3D:
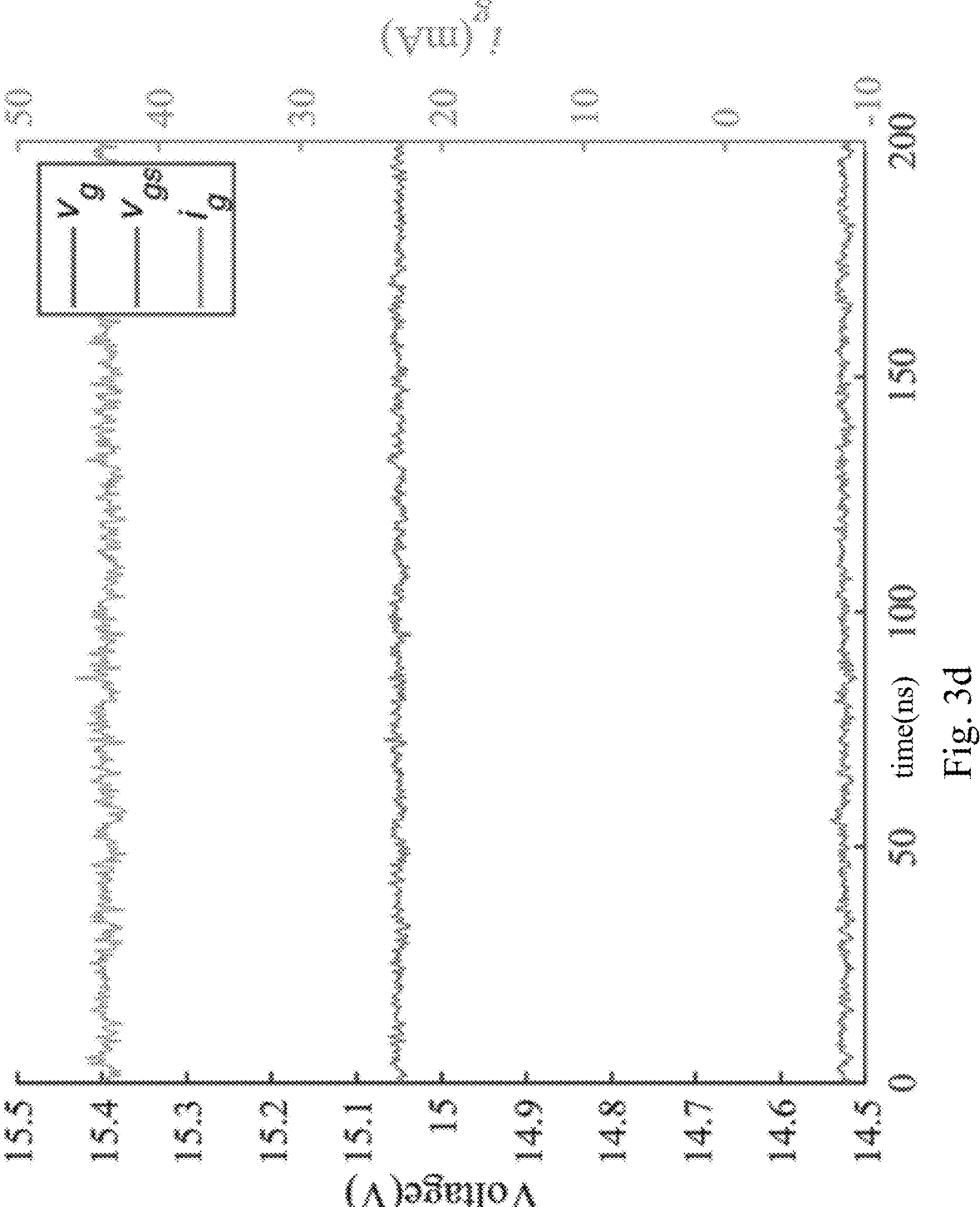
FIG. 3*d* is an enlarged view of steady-state waveforms as marked by the dash-lined block in FIG. 3*c*.

FIGS. 3*a*-3*d* show the experimental results of the output of a MOSFET driver, $v_g$, gate-source voltage, $v_{gs}$, and gate current, $i_g$. FIG. 3*a* shows the results for a brand new SiC MOSFET, and FIG. 3*b* shows the magnified steady-state waveforms. FIG. 3*c* and FIG. 3*d* show the corresponding results after aging the same SiC MOSFET for 4000 power cycles respectively. Upon turning on the SiC MOSFET, $i_g$ contains a high input current pulse through $C_{gs}$ because $C_{gs}$ is initially uncharged. When $C_{gs}$ has been fully charged, a relatively steady-state current will flow through $R_{gss}$, i.e., the on-state gate-source leakage current as shown in FIG. 3*b* and FIG. 3*d*. One can see that the gate leakage current of the SiC MOSFET has an increase from nearly zero to 43 mA after the above-mentioned power cycling. This increase results in a loading effect on the MOSFET driver output, leading to a reduction in $v_g$ from 15.2V to 15.05V and $v_{gs}$ from 15.2V to 14.52V.

Various prior art techniques have been proposed to detect the leakage current or estimate the on-state gate-source resistance to perform real-time monitoring of gate oxide conditions. Since the gate current is proportional to the voltage across the gate resistor, the most straightforward method is based on measuring the voltage across $R_{on}$ to indirectly determine the leakage current. However, there are practical challenges in the voltage measurement circuit which include 1) the amplifier in the measurement circuit must have a wide common-mode voltage capability; 2) the amplifier should have wide bandwidth; 3) the input bias current of the amplifier should be at least one order of magnitude less than the target gate leakage current; and 4) input offset voltage of the amplifier should be at least one order of magnitude smaller than the minimum threshold voltage on the resistor. As a result, the direct measurement of voltage across $R_{on}$ is only suitable for measuring the gate leakage current of MOSFETs when they are close to their end of life, because by then the gate leakage current would have reached an extreme value.

Instead of directly measuring the leakage current, an alternative method involves employing capacitors to collect the charge derived from the leakage current. By observing the time taken for the capacitor voltage to reach a predetermined threshold, the magnitude of the leakage current can be indirectly determined. However, it's important to note that the capacitor voltage is influenced not only by the leakage current but also by the durations of the rise time and fall time of the gate-source voltage. Thus, calibration is necessary to mitigate the impact of these voltage transitions on the calculation of the leakage current. Additionally, the rate of change of the capacitor voltage varies with the duty cycle, so it's essential to consider the duty cycle when estimating the leakage current. Building upon the above approach, an extension of the approach has been proposed in which the measurement of the average gate-source voltage is introduced, aiming to eliminate the influence of the duty cycle. By calculating the ratio between the measured average gate-source voltage and the charge accumulated on the capacitor, the gate leakage resistance can be determined.

However, calibration is still required in this extended approach to address the impact of voltage transitions on the accuracy of the measurement.

Inventors of the present invention have therefore realized that although in some prior art methods, measurement of the gate leakage current can be achieved by using a series resistor which is the most straightforward way, such methods did not consider the fluctuation of the gate leakage current. For improved output sensitivity, it is therefore preferable to use a large series resistor when the gate leakage current is low. Conversely, when the gate leakage current is high, a small series resistor is more suitable. This approach ensures accurate and effective measurement of the gate leakage current. However, it is crucial to note that using a large series resistor can influence the waveshape of the gate-source voltage negatively.

Figure 4:
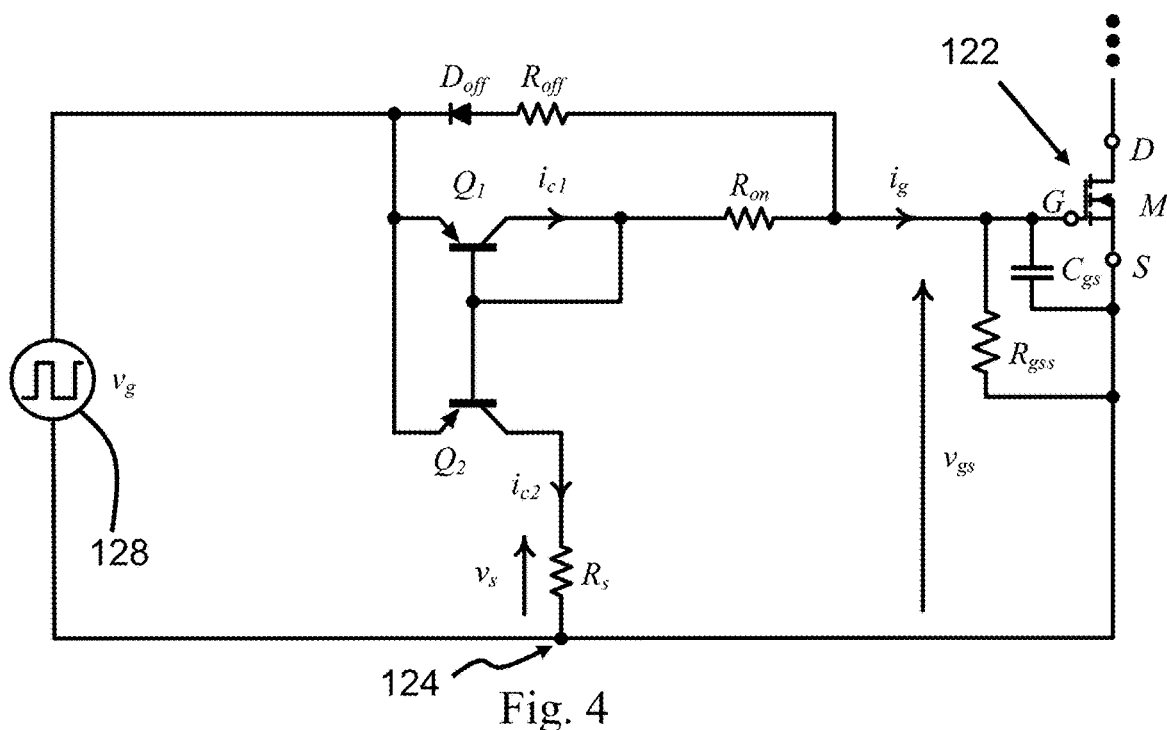
FIG. 4 shows a simplified circuit structure of an apparatus for measuring gate-leakage current according to one embodiment of the invention.

Instead of using a series resistor, one embodiment of the current invention which is an apparatus for measuring a gate leakage current of a MOSFET utilizing a current mirror, as depicted in FIG. 4, which is used to mirror the gate leakage current. FIG. 4 also shows a SiC MOSFET 122 that is to be tested by the apparatus. The current mirror in the current measurement circuit of FIG. 4 is formed by transistors $Q_1$ and $Q_2$ which in one example are both PNP transistors. Bases of $Q_1$ and $Q_2$ are connected together, and they are connected to the collector of $Q_1$. In other words, the collector and the base of $Q_1$ are shorted. The emitters of both $Q_1$ and $Q_2$ are connected to a voltage source 128 that functions as a gate driver and is able to generate a gate driving signal such as a square wave. The collector of $Q_2$ is connected to a sensing resistor $R_s$, which in turn has a reference node 124 connected both to the voltage source 128 and to a source of the MOSFET 122. The collector of $Q_1$ is connected to a first end of a turn-on resistor $R_{on}$, and a second end of $R_{on}$ is connected to a gate of the MOSFET 122. For a turn-off resistor $R_{off}$ in the circuit, it has a first end connected to the voltage source 128 through a diode $D_{off}$, and a second end connected to the gate of the MOSFET 122. The diode $D_{off}$ has a positive terminal connected to the turn-off resistor $R_{off}$ and a negative terminal connected to the voltage source 228.

The current mirror in FIG. 4 is adapted to mirror the current passing through an input current path of the current mirror, which is the path of the collector current $i_{c1}$ of $Q_1$. $Q_1$ is thus in the input branch of the current mirror, while $Q_2$ is in the output branch of the current mirror. The gate current $i_g$ flows through $Q_1$ and the collector current $i_{c1}$ is almost the same as $i_g$ as the base current of $Q_1$ is much smaller than $i_{c1}$. The collector current of $Q_2$ is the mirrored current of $i_{c1}$ and is therefore also almost the same as the gate current $i_g$. The voltage across $R_s$ can then reflect the gate current $i_g$. The gate resistors $R_{on}$ and $R_{off}$ serve the same functions as those described above with respect to FIG. 2.

The voltage across the current mirror is nearly constant. Therefore, when the magnitude of the gate leakage current is small, the equivalent resistance is large. Conversely, when the magnitude of the gate leakage current is large, the equivalent resistance is small. The sensitivity of the apparatus in FIG. 4 as compared to conventional measuring circuits is therefore high, based on the analysis provided previously. In addition, in FIG. 4 the reference node 124 of the sensing resistor is directly connected to the source of the MOSFET 122, which eliminates the need for a differential measurement to measure the voltage across the series resistor. As the mirrored current $i_{c2}$ is connected to the sensing resistor $R_s$, an operating range of the current measurement is set, without affecting the gate-source voltage $v_{gs}$. This approach simplifies the measurement process, making it more efficient and straightforward.

Figure 5:
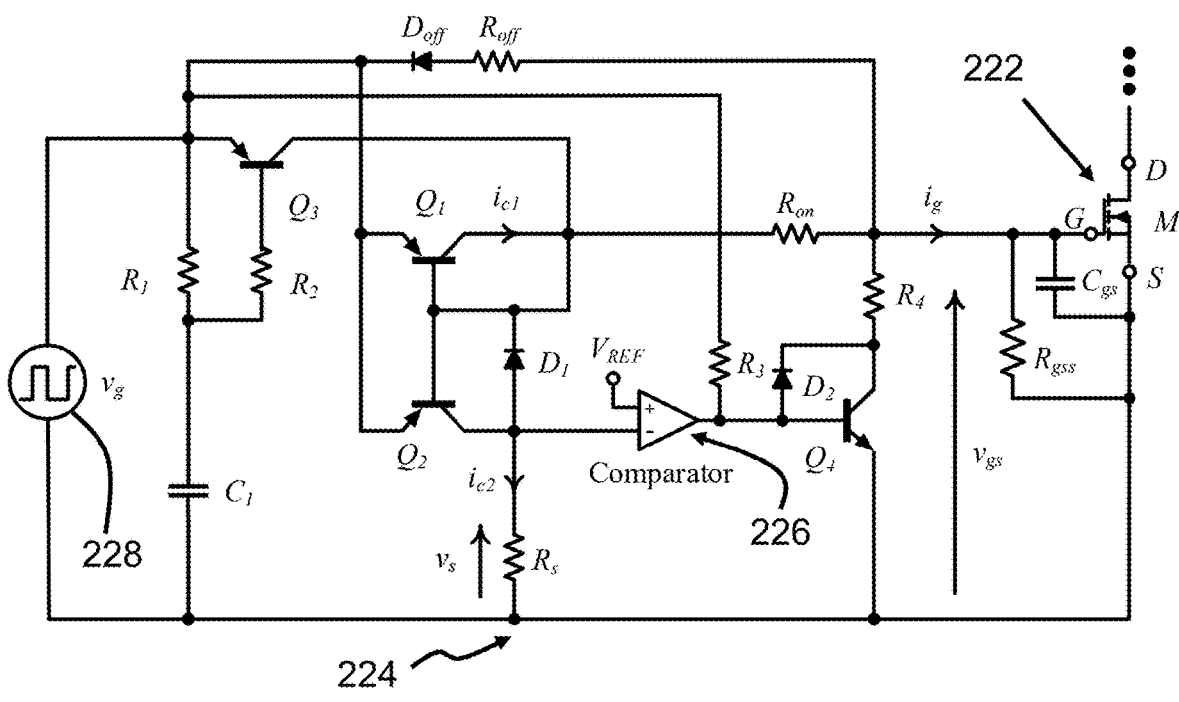
FIG. 5 shows a complete circuit structure an apparatus for measuring gate-leakage current according to another embodiment of the invention.
Figure 6A:
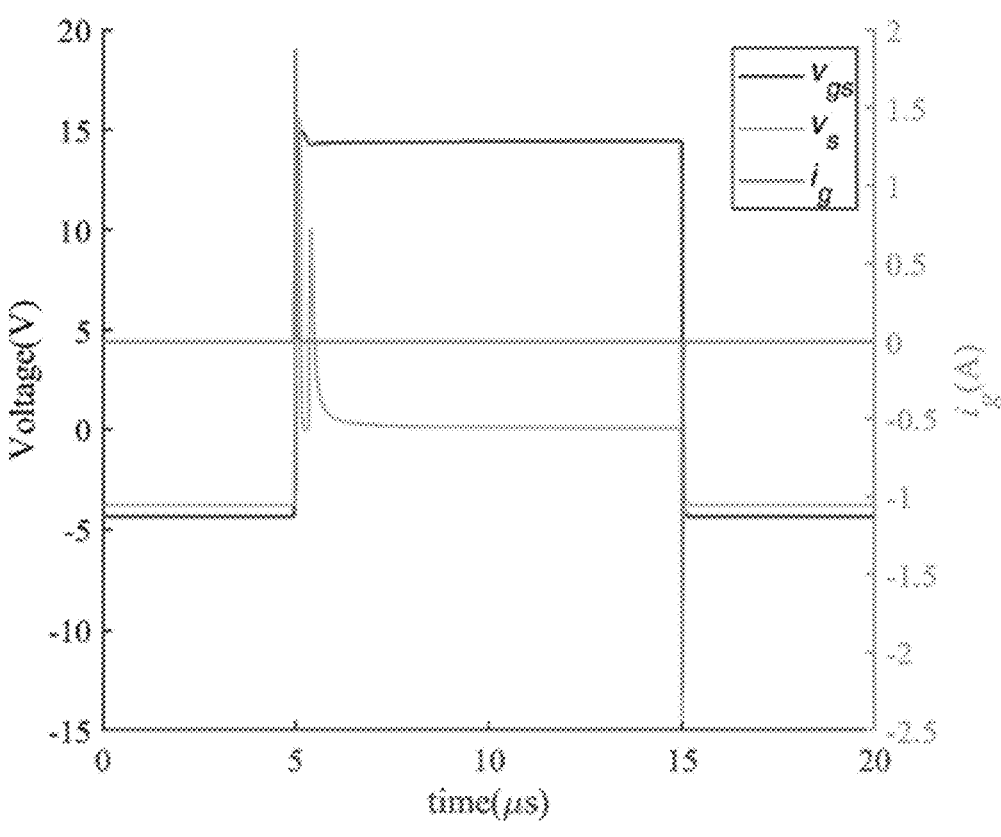
FIG. 6*a* shows the waveforms of $v_{gs}$, $v_s$ and $i_g$ when $R_{gss}$ equals to ∞, in a simulation of the circuit in FIG. 5.
Figure 6B:
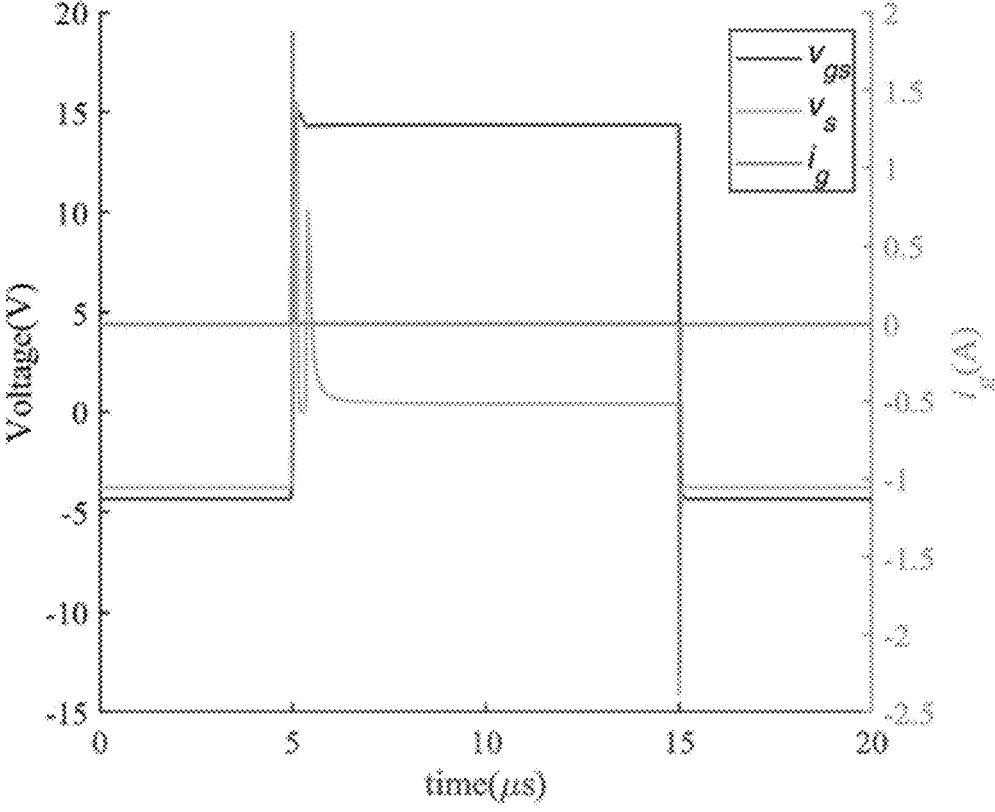
FIG. 6*b* shows the waveforms of $v_{gs}$, $v_s$ and $i_g$ when $R_{gss}$ equals to 300 kΩ in the simulation.
Figure 6C:
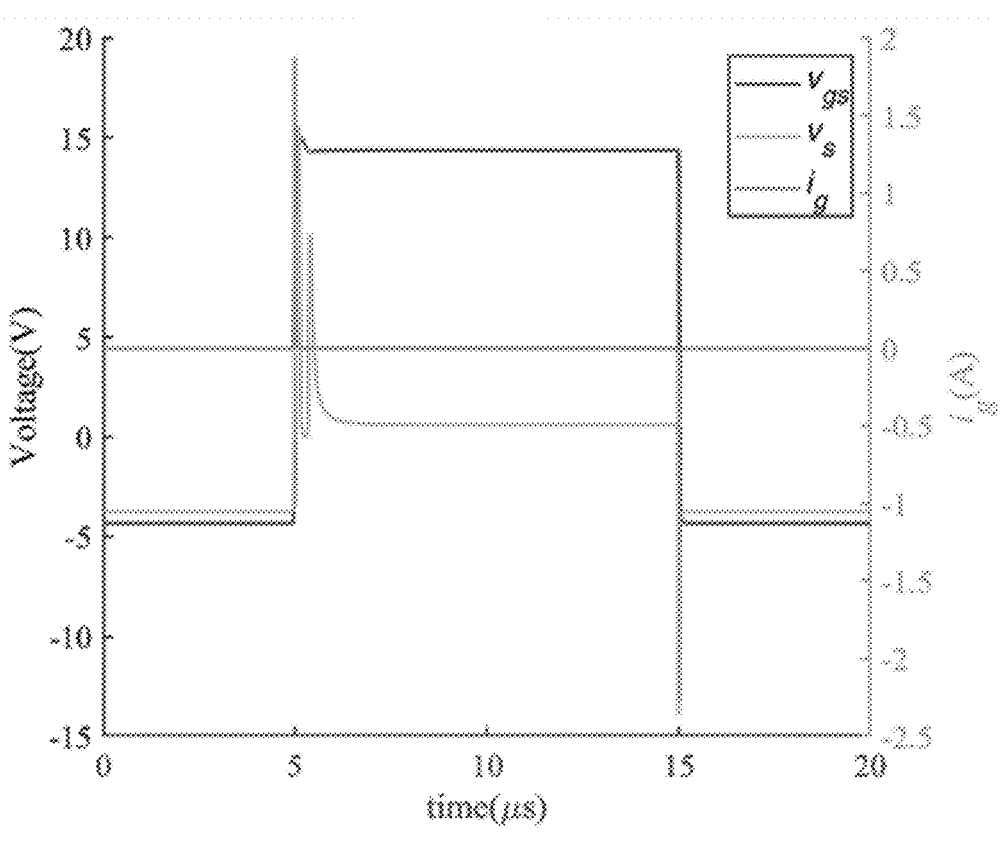
FIG. 6*c* shows the waveforms of $v_{gs}$, $v_s$ and $i_g$ when $R_{gss}$ equals to 200 kΩ in the simulation.
Figure 6D:
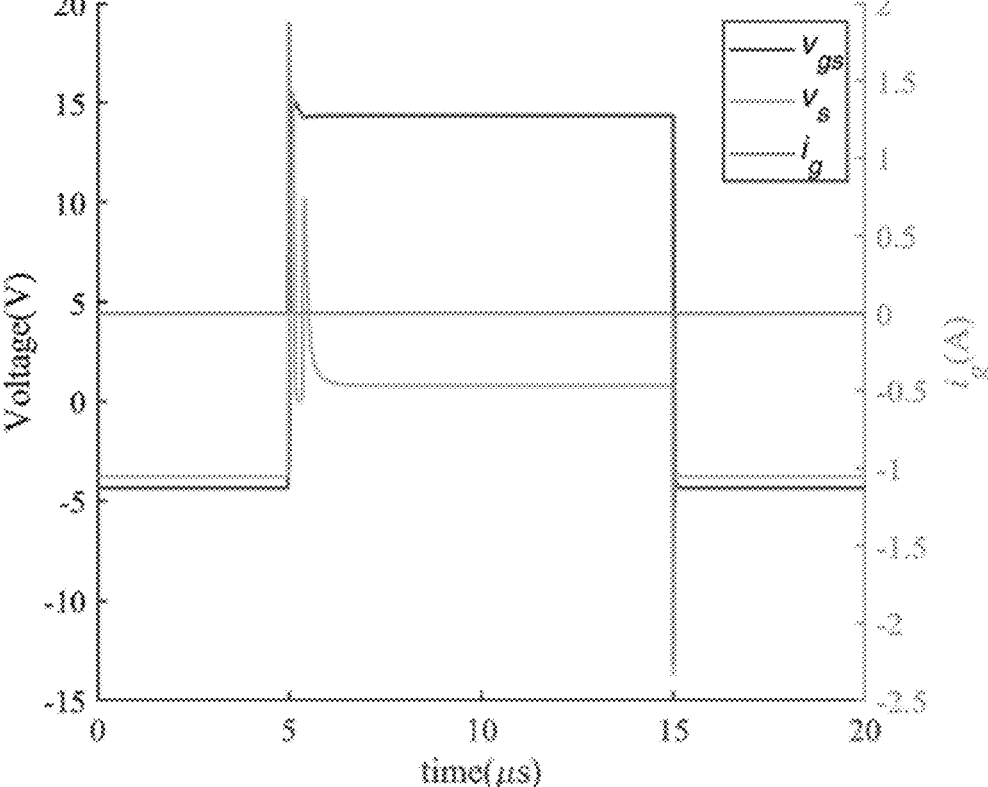
FIG. 6*d* shows the waveforms of $v_{gs}$, $v_s$ and $i_g$ when $R_{gss}$ equals to 150 kΩ in the simulation.
Figures 6E, 6F:
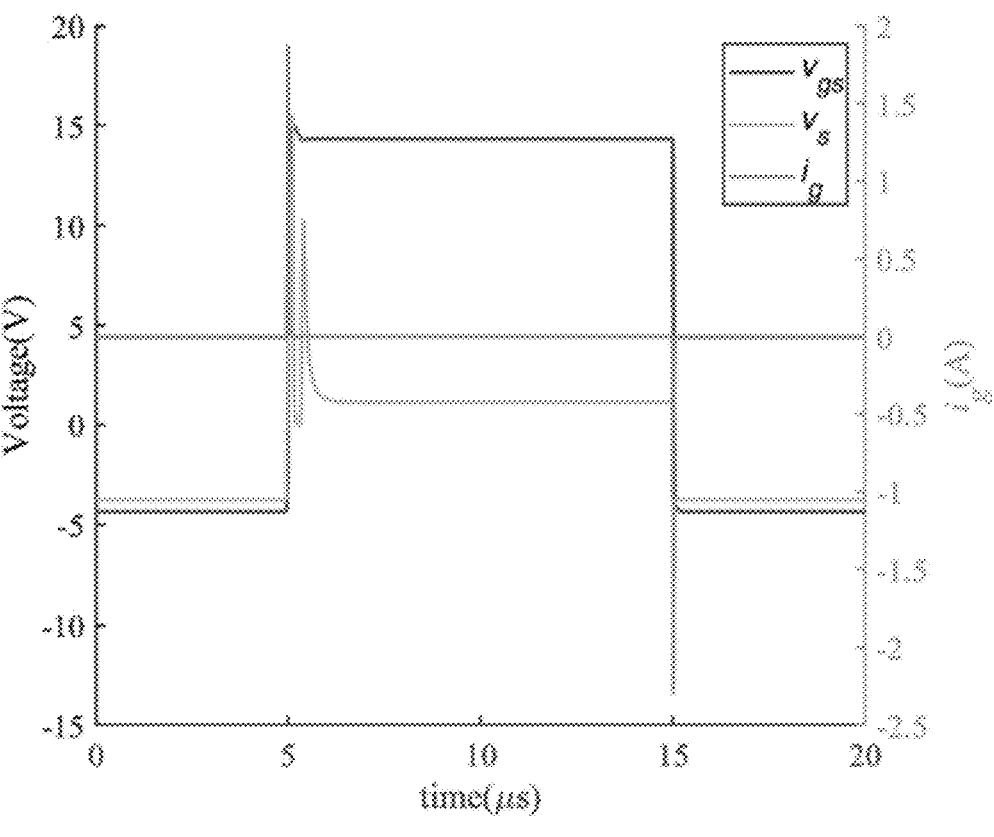
FIG. 6*e* shows the waveforms of $v_{gs}$, $v_s$ and $i_g$ when $R_{gss}$ equals to 100 kΩ in the simulation.
FIG. 6*f* shows the waveforms of $v_{gs}$, $v_s$ and $i_g$ when $R_{gss}$ equals to 47 kΩ in the simulation.
Figures 6G, 6H:
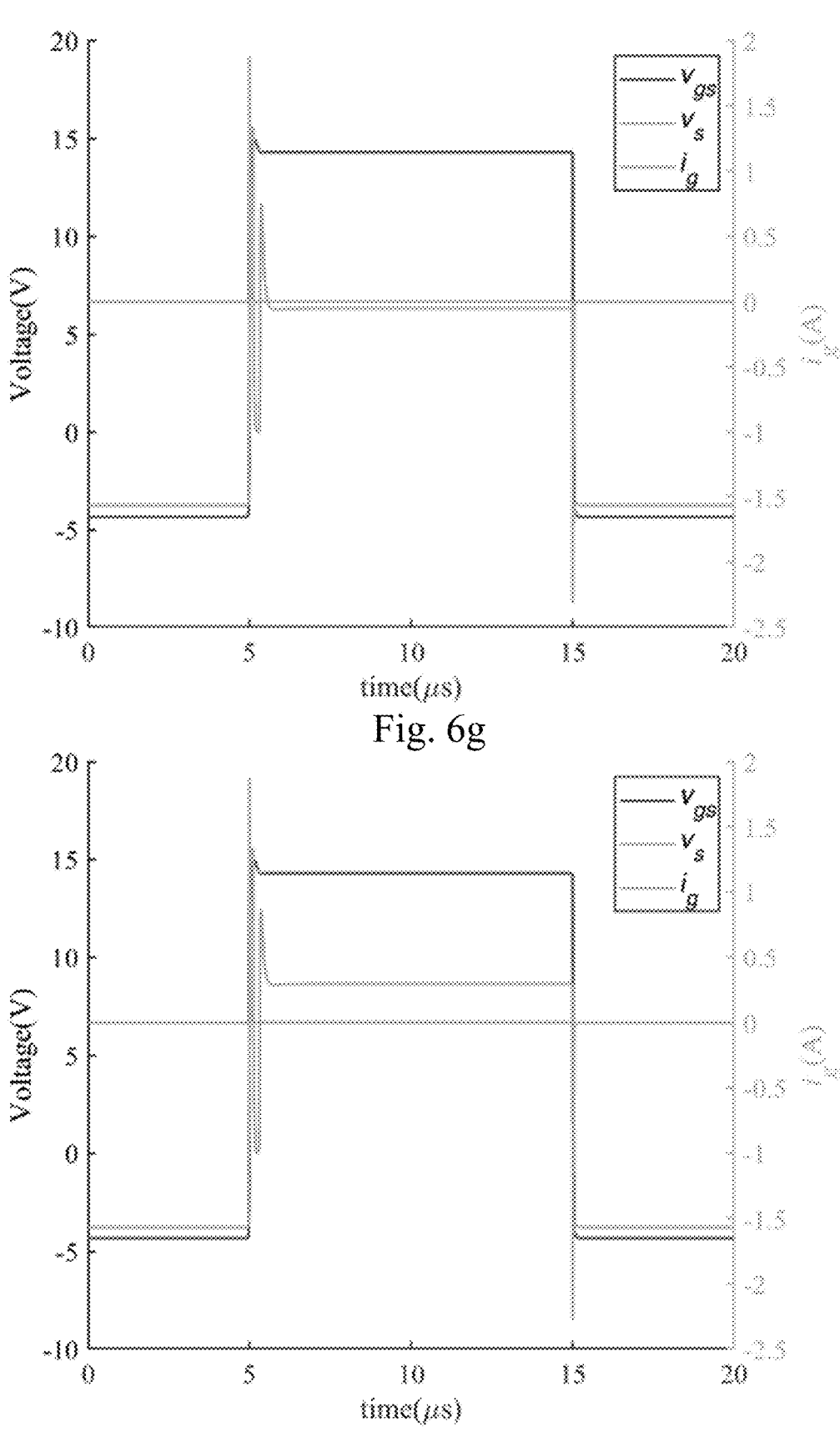
FIG. 6*g* shows the waveforms of $v_{gs}$, $v_s$ and $i_g$ when $R_{gss}$ equals to 15 kΩ in the simulation.
FIG. 6*h* shows the waveforms of $v_{gs}$, $v_s$ and $i_g$ when $R_{gss}$ equals to 10 kΩ in the simulation.

Turning to FIG. 5, according to another embodiment of the invention there is provided an apparatus for measuring a gate leakage current of a SiC MOSFET 222. Similar to the circuit in FIG. 4, the core part of the current measurement circuit in FIG. 5 contains a current mirror that has a same configuration as that in FIG. 4, which will not be described herein again for the sake of brevity. Compared to the circuit of FIG. 4, the circuit in FIG. 5 additionally contains a bypass switch and a discharging circuit. As a steady-state leakage current could be observed only after the MOSFET 222 has been turned on completely, the bypass switch, which is implemented by transistor $Q_3$, is connected in parallel with the current mirror. In particular, an emitter of the $Q_3$, and those of the transistors $Q_1$ and $Q_2$, are connected to the voltage source 228 at the same time. Also, a collector of the transistor $Q_3$ is connected, and those of the transistors $Q_1$ and $Q_2$, are all connected to the gate of the MOSFET 222 through the turn-on resistor $R_{on}$. Upon turning on the MOSFET 222, the bypass transistor $Q_3$ will be turned on to drive the MOSFET 222, so that the gate-source voltage $v_{gs}$ is increased in a short time. Afterwards, the current mirror is engaged to perform the steady-state gate leakage current measurement.

The bypass switch includes the transistor $Q_3$, and additionally a first resistor $R_1$, a second resistor $R_2$, and a capacitor $C_1$. The resistors $R_1$, $R_2$ and the capacitor $C_1$ form a RC circuit, which connects the base of the transistor $Q_3$ to the voltage source 228. A first end of $R_1$ is connected to the voltage source 228 and the emitter of the transistor $Q_3$. A first end of $R_2$ is connected to the base of the transistor $Q_3$. Second ends of $R_1$ and $R_2$ are connected to a first end of the capacitor $C_1$, while a second end of $C_1$ is connected to the reference node 224 of the sensing resistor $R_s$ to which the source of the MOSFET 222 is also connected.

The discharging circuit includes a fourth transistor $Q_4$ in the circuit, a comparator 226, resistors $R_3$ and $R_4$, and diodes $D_1$ and $D_2$. The diode $D_1$ has a positive terminal connected to a collector of $Q_2$, and a negative terminal connected to the base and a collector of $Q_1$ (the two of which are connected together as mentioned above). The positive terminal of the diode $D_1$ also connects to an end of the sensing resistor $R_s$. The comparator 226 has a first input connected to a reference voltage VREF and a second input connected to the collector of $Q_2$ (and thus also to the sensing resistor $R_s$ and the positive terminal of the diode $D_1$). The output of the comparator 226 is connected to a base of the transistor $Q_4$, and also to a first end of the resistor $R_3$ as well as a positive terminal of the diode $D_2$. A second end of the resistor $R_3$ is connected to the voltage source 228. A negative end of the diode $D_2$ is connected to a collector of $Q_4$, and to a first end of the resistor $R_4$. A second end of $R_4$ is connected to the gate of the MOSFET 222. Finally, an emitter of $Q_4$ is connected to the reference node 224.

Having described the circuit components in the apparatus of FIG. 5, now the working principle of the circuit will be described. When $v_g$ is changed from logical "HIGH" to logical "LOW", the voltage level of $v_g$ will change from positive to zero or negative in order to turn off the MOSFET. However, at this moment $v_{gs}$ is still at a high potential because of the gate-source capacitance $C_{gs}$ that contains charges. Thus, $v_{gs} > v_g$, and $D_{off}$ is forwardly biased. $C_{gs}$ will be discharged via $R_{off}$ and the voltage source 228. The base voltages of $Q_1$, $Q_2$, and $Q_3$ are thus both positive, and $Q_1$, $Q_2$, and $Q_3$ operate in the cut off region. When $C_{gs}$ has been fully discharged, $v_{gs} = v_g$, which is zero or negative. Again, $Q_1$, $Q_2$, and $Q_3$ are still in the cut off region. In other words, the current mirror does not operate when the MOSFET is off. The voltage across $R_s$, which is $v_s$, is zero.

When $v_g$ is changed from logical "LOW" to logical "HIGH", the voltage level of $v_g$ will change from zero or negative to positive to turn on the SiC MOSFET. However, $v_{gs}$ is still zero or negative because of the presence of the gate-source capacitance $C_{gs}$. Thus, the base-emitter voltages of $Q_1$ and $Q_2$ are thus both negative, and $Q_1$ and $Q_2$ momentarily saturate. The voltage across $C_1$ at this moment is still zero or negative. Thus, the base-emitter voltages of $Q_3$ is negative. $Q_3$ saturates and the duration of such saturation is controlled by the values of $R_1$, $R_2$ and $C_1$. A high current pulse will flow through the gate resistor $R_{ON}$, $Q_3$, and $C_{gs}$. The gate current $i_g$ can be approximated by $$i_g = \frac{v_g - v_{CE,sat}}{R_{ON}} \tag{1}$$

where $v_{CE,sat}$ is the collector-emitter saturation voltage of $Q_1$, $Q_2$ and $Q_3$.

The voltage across $R_s$, which is $v_s$, is $$v_s = v_g - v_{CE,sat} \tag{2}$$

As $C_{gs}$ is charged up, the gate current and $v_s$ drop. $Q_1$ and $Q_2$ will gradually change from operating in the saturation mode to the cutoff mode. They will enter into the linear mode when $C_{gs}$ discharges to a certain voltage level, at which the gate current will then be equal to the gate-source leakage current. Such duration is thus dependent on the discharging impedance across $C_{gs}$, such as gate-source leakage resistance, leakage current of $Q_1$ and $Q_2$, etc. In order to shorten the transition of $Q_1$ and $Q_2$ from the saturation mode to linear mode, the discharging circuit is used. When the device is turned on, $Q_4$ is also turned on by $v_g$ through $R_3$. Thus, $C_{gs}$ will discharge through $R_4$. Until the current mirror operates and $v_s$ rises. The comparator generates a "LOW" to turn off $Q_4$. The discharging circuit therefore significantly shortens the time of measuring the gate-source leakage current.

Assume that the base currents of $Q_1$ and $Q_2$ are much smaller than their collector currents. The collector current of $Q_1$, which is $i_{c1}$, is close to the gate current. Thus, $$i_{c1} \approx i_g \tag{3}$$

$Q_1$ and $Q_2$ have similar electrical characteristics. The collector current of $Q_2$, which is $i_{c2}$, is therefore $$i_{c2} \approx i_{c1} \approx i_g \tag{4}$$

The current through $R_s$ is the same as $i_g$. $v_s$ is equal to $$v_s \approx i_g R_s \tag{5}$$

Thus, the gate leakage current $i_{ss}$ can be estimated by sensing $v_s$ that $$i_{gas} \approx \frac{1}{R_s} v_s \tag{6}$$

With the current mirror, the current through $R_s$, which is $i_s$, mirrors $i_{gss}$.

The diodes $D_1$ and $D_2$ are used to desaturate $Q_2$ and $Q_4$ at turn on.

Next, the simulation results of the circuit in FIG. 5 will be discussed. In the simulation, the output of the voltage source 228 is set to switch between −5V and +15V. The component part numbers and values are given in Table I below. With $R_s$=4.7 k$\Omega$, FIGS. 6a-6i show the waveforms of $v_{gs}$, $v_s$ and $i_g$ when $R_{gss}$ equals to $\infty$, 300 k$\Omega$, 200 k$\Omega$, 150 k$\Omega$, 100 k$\Omega$, 47 k$\Omega$, 15 k$\Omega$, 10 k$\Omega$ and 4.7 k$\Omega$, respectively. It can be observed that $v_s$ is 15V in a short period for all $R_{gss}$ because of the $i_g$ due to switching transient and then keeps at steady state voltage according to the value of $R_{gss}$. After $R_{gss}$ decreases, the steady state voltage of $v_s$ increases. When $R_{gss}$ equals 4.7 k$\Omega$ which means $i_{gss}$ equals to 3.2 mA, $v_s$ increases to 14.2V at a steady state.

TABLE I

| Component Part Nos. and Values | | | |
|---|---|---|---|
| Component | Part no./Value | Component | Part no./Value |
| $R_1$ | 510 $\Omega$ | $C_1$ | 120 pF |
| $R_2$ | 100 $\Omega$ | $Q_1$ | 2N4126 |
| $R_3$ | 20 k$\Omega$ | $Q_2$ | 2N4126 |
| $R_4$ | 2.7 k$\Omega$ | $Q_3$ | 2N4126 |
| $R_s$ | 4.7 k$\Omega$ | $Q_4$ | 2N3391 |
| $R_{ON}$ | 4.7 $\Omega$ | $D_1$ | 1N4148 |
| $R_{OFF}$ | 4.7 $\Omega$ | $D_2$ | 1N4148 |
| | | $D_{OFF}$ | 1N4148 |

Figures 6I, 7:
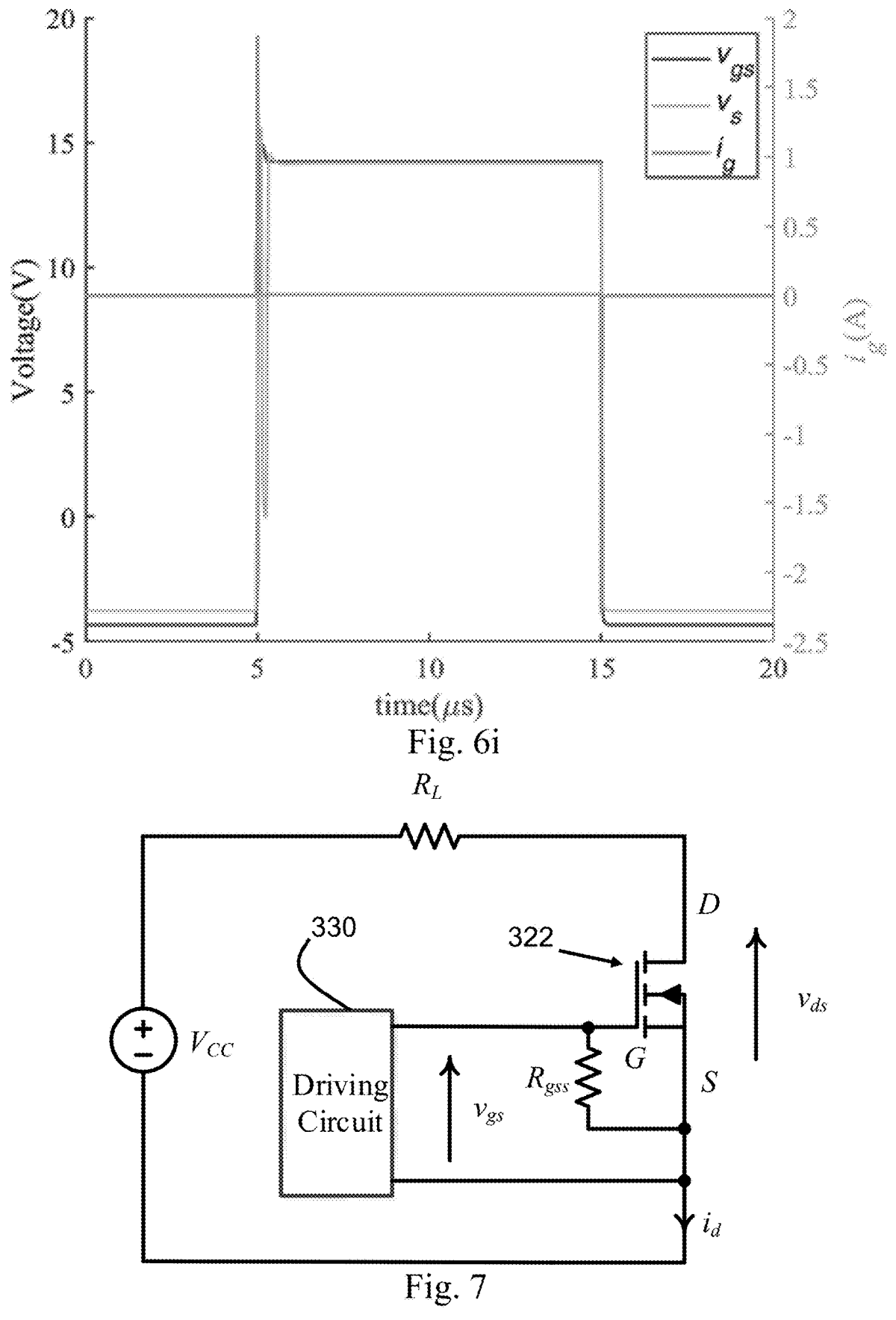

Besides the simulation, the apparatus for measuring the gate leakage circuit in FIG. 5 has also been validated experimentally. FIG. 7 shows the test circuit used for the experiment, which includes a SiC MOSFET 322, a driving circuit 330 in FIG. 7, and a load resistor $R_L$. The supply voltage to the SiC MOSFET 322 is $V_{CC}$. The switching frequency is 50 kHz. A resistor $R_{gss}$, which is connected across the gate and source of the SiC MOSFET, is used to adjust the steady-state gate current to emulate the gate leakage current of the SiC MOSFET. The emulated gate leakage current will be small when $R_{gss}$ is large. Conversely, it will be large when $R_{gss}$ is small. Three different driving circuits have been tested, which are respectively the circuit shown in FIG. 5, the circuit shown in FIG. 8a (which does not have a current mirror), and the circuit shown in FIG. 8b (which does not have a current mirror or a polarized resistive network, and includes simply a gate resistor). These three driving circuits individually represent the driving circuit 330 when they are implemented in the test circuit. The component part numbers and values of the three driving circuits are given in Table II. The measured waveforms of the drain-source voltage, $v_{ds}$, gate-source voltage, $v_{gs}$, output voltage of the gate driver, $v_g$, and drain current, $i_d$, upon turning on the SiC MOSFET for the three circuits are given in FIGS. 9a-9c respectively. No $R_{gss}$ is connected to the driving circuit. The drain-source voltage before turning on is 20V.

The transient and steady-state characteristics are given in Table II. The nomenclature of the symbols is given as follows:

$V_{ds,ON}$: Steady-state on-state value of $v_{ds}$ $t_{ds,f}$: Fall time of $v_{ds}$ (From 90% to 10% of the steady-state value)

$V_{g,ON}$: Steady-state on-state value of $v_g$ $t_{g,r}$: Rise time of $v_g$ (From 10% to 90% of the steady-state value)

$V_{gs,ON}$: Steady-state on-state value of $v_{gs}$ $t_{gs,r}$: Rise time of $v_{gs}$ (From 10% to 90% of the steady-state value)

$I_{d,ON}$: Steady-state on-state value of $i_d$ $t_{d,r}$: Rise time of $i_d$ (From 10% to 90% of the steady-state value)

TABLE II

Component Part Nos. and Values

Figures 8A, 8B:
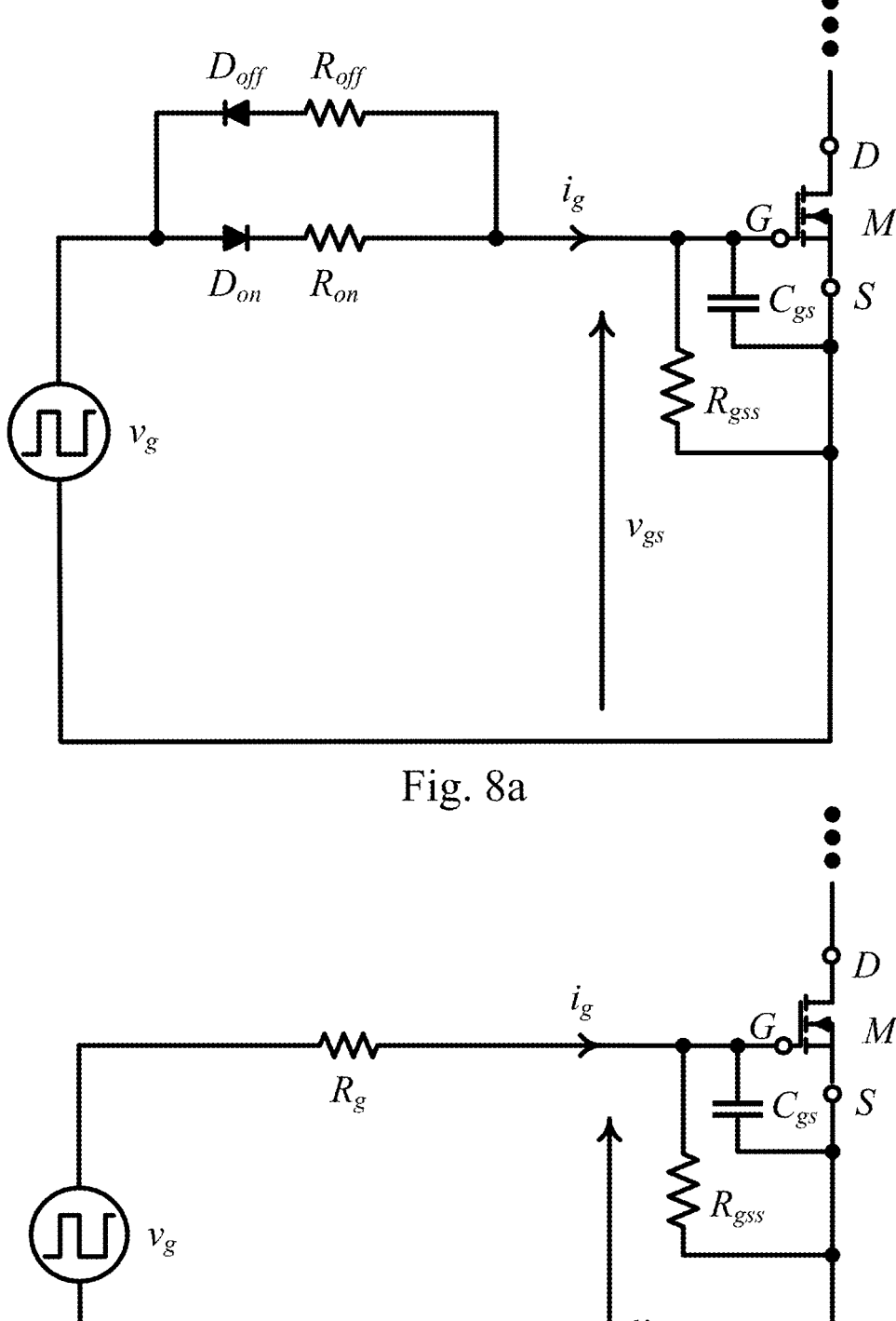
FIG. 8*a* shows one gate driving circuit used for comparison in the experimental setup.
FIG. 8*b* shows another gate driving circuit used for comparison in the experimental setup.
Figure 9A:
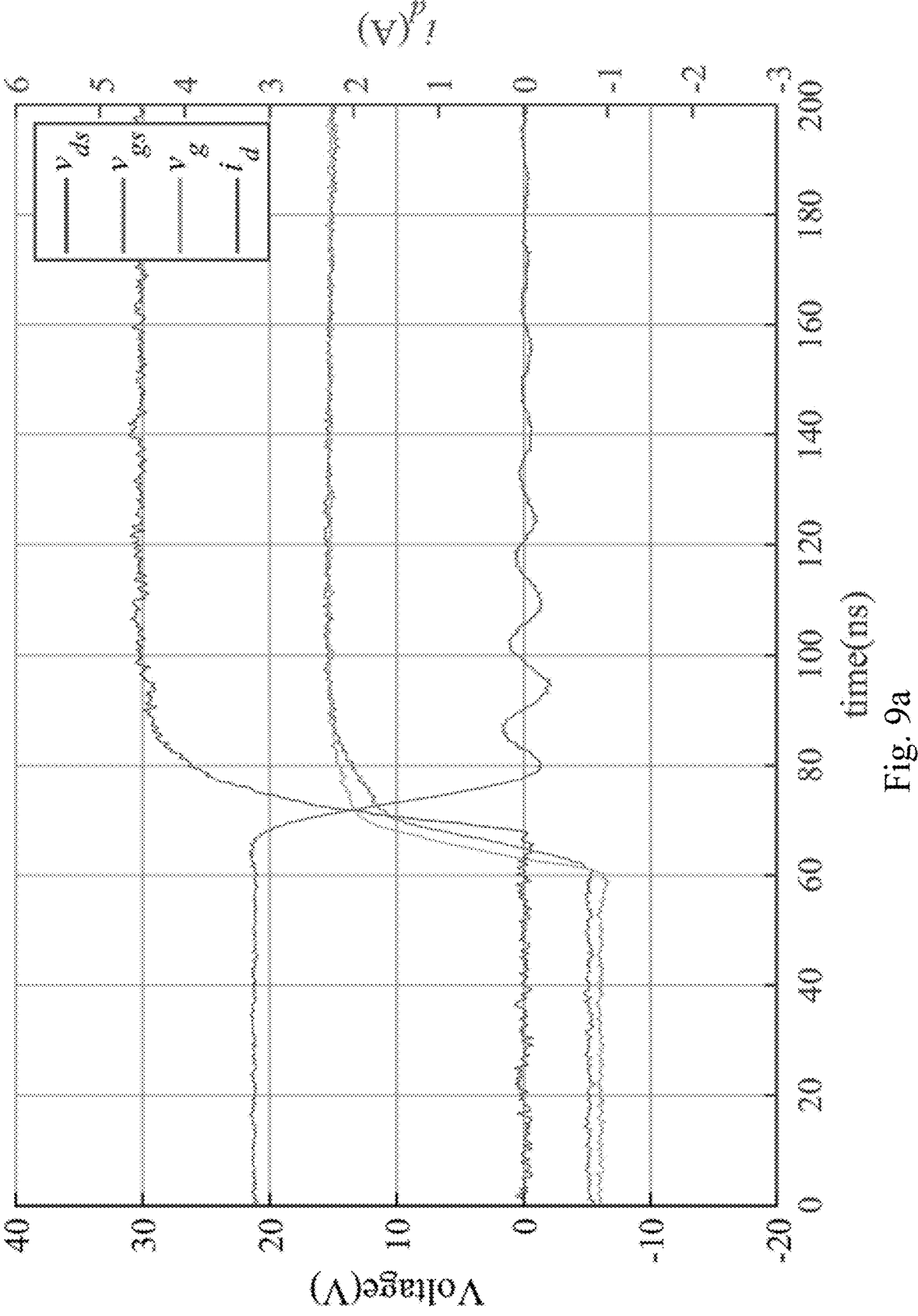
FIG. 9*a* shows measured waveforms of the drain-source voltage, $v_{ds}$, gate-source voltage, $v_{gs}$, output voltage of the gate driver, $v_g$, and drain current, $i_d$, upon turning on the SiC MOSFET for the circuit in FIG. 5 in the experiment.
Figure 9B:
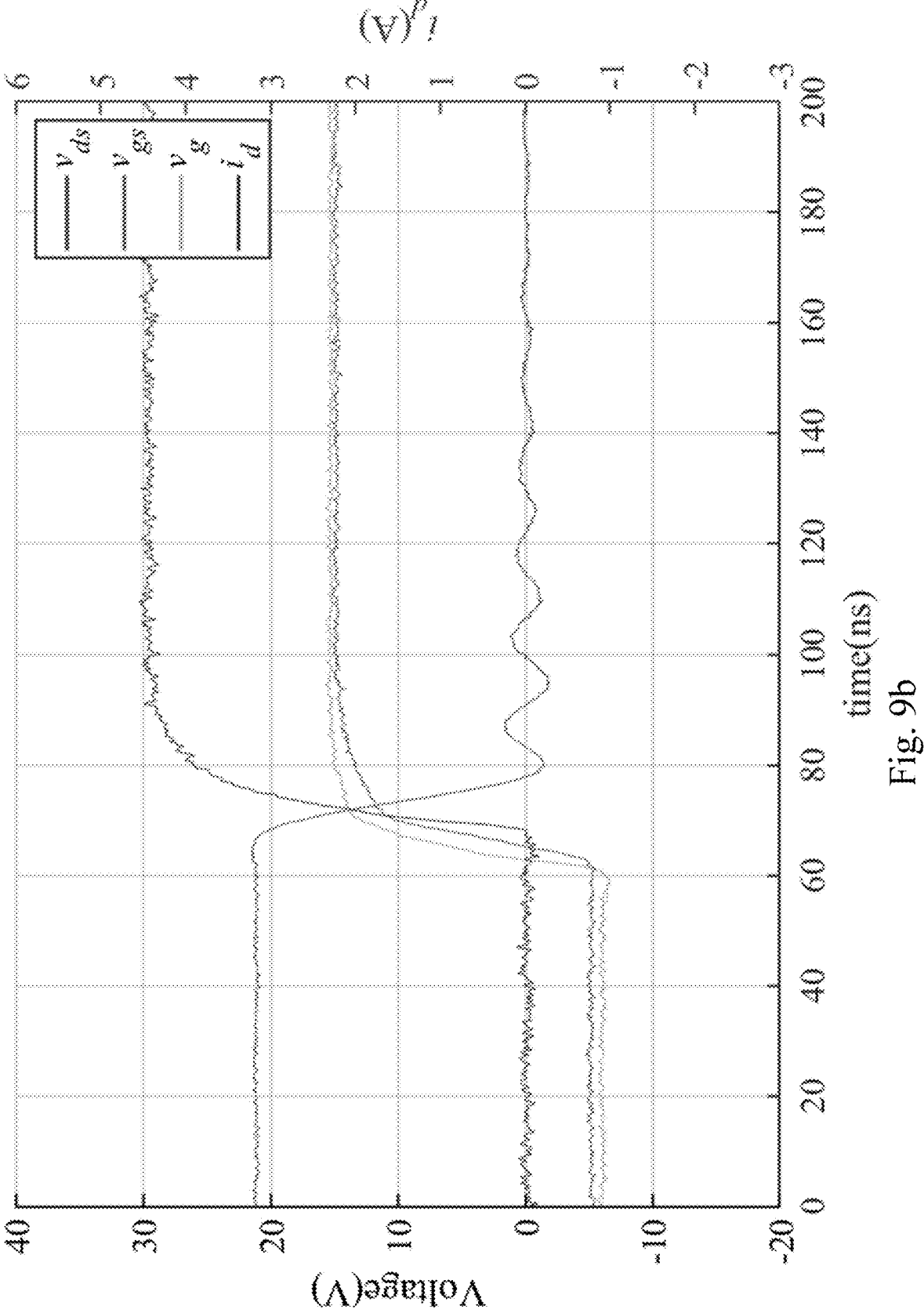
FIG. 9*b* shows measured waveforms of the drain-source voltage, $v_{ds}$, gate-source voltage, $v_{gs}$, output voltage of the gate driver, $v_g$, and drain current, $i_d$, upon turning on the SiC MOSFET for the circuit in FIG. 8*a* in the experiment.
Figure 9C:
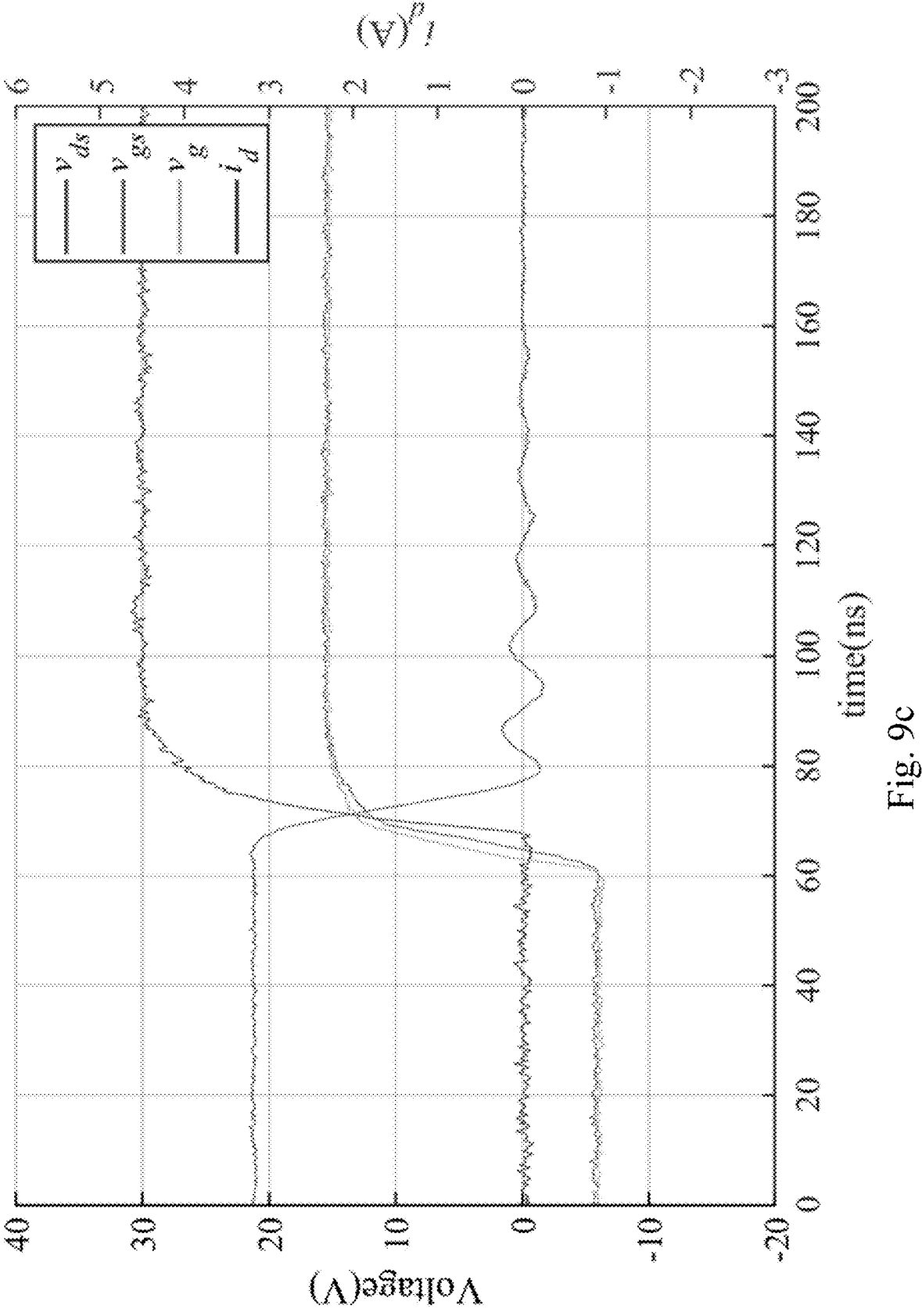
FIG. 9*c* shows measured waveforms of the drain-source voltage, $v_{ds}$, gate-source voltage, $v_{gs}$, output voltage of the gate driver, $v_g$, and drain current, $i_d$, upon turning on the SiC MOSFET for the circuit in FIG. 8*b* in the experiment.

| Component | Part no. / Value | Component | Part no. / Value |
|---|---|---|---|
| For the circuit shown in FIG. 5: | | | |
| $R_1$ | 510 Ω | $C_1$ | 120 pF |
| $R_2$ | 100 Ω | $Q_1$ | 2SA1978 |
| $R_3$ | 20 kΩ | $Q_2$ | 2SA1978 |
| $R_4$ | 2.7 kΩ | $Q_3$ | 2SA1978 |
| $R_s$ | 4.7 kQ | $Q_4$ | MMBTH10 |
| $R_{on}$ | 4.7 Ω | $D_1$ | DB2731400L |
| $R_{off}$ | 4.7 Ω | $D_2$ | DB2731400L |
| | | $D_{off}$ | 1N4148 |
| For the circuit shown in FIG. 8a: | | | |
| $R_{on}$ | 4.7 Ω | $R_{off}$ | 4.7 Ω |
| $D_{off}$ | 1N4148 | $D_{off}$ | 1N4148 |
| For the circuit shown in FIG. 8b: | | | |
| $R_g$ | 4.7 Ω | | |

TABLE III

Transient and Steady-State Characteristics

| Parameter | Circuit shown in FIG. 5 | Circuit shown in FIG. 8a | Circuit shown in FIG. 8b |
|---|---|---|---|
| $V_{ds,ON}$ | 0 V | 0 V | 0 V |
| $t_{ds,f}$ | 7 ns | 7 ns | 7 ns |
| $V_{g,ON}$ | 15 V | 15 V | 15 V |
| $t_{g,r}$ | 9.2 ns | 8.4 ns | 8.8 ns |
| $V_{gs,ON}$ | 14.3 V | 14.5 V | 15 V |
| $t_{gs,r}$ | 13.2 ns | 12.6 ns | 10.6 ns |
| $I_{d,ON}$ | 4.6 A | 4.6 A | 4.6 A |
| $t_{d,r}$ | 13.8 ns | 13.6 ns | 13.6 ns |

Based on the measured parameters, it can be observed that the driving circuit/current measurement circuit in FIG. 5 slightly lengthen the rise time of $v_g$ and $v_{gs}$, but the turn-on time of $v_{ds}$ and $i_d$ is nearly the same. The steady-state gate-source voltage slightly drops, because of the small voltage drop across the current mirror.

Figure 10A:
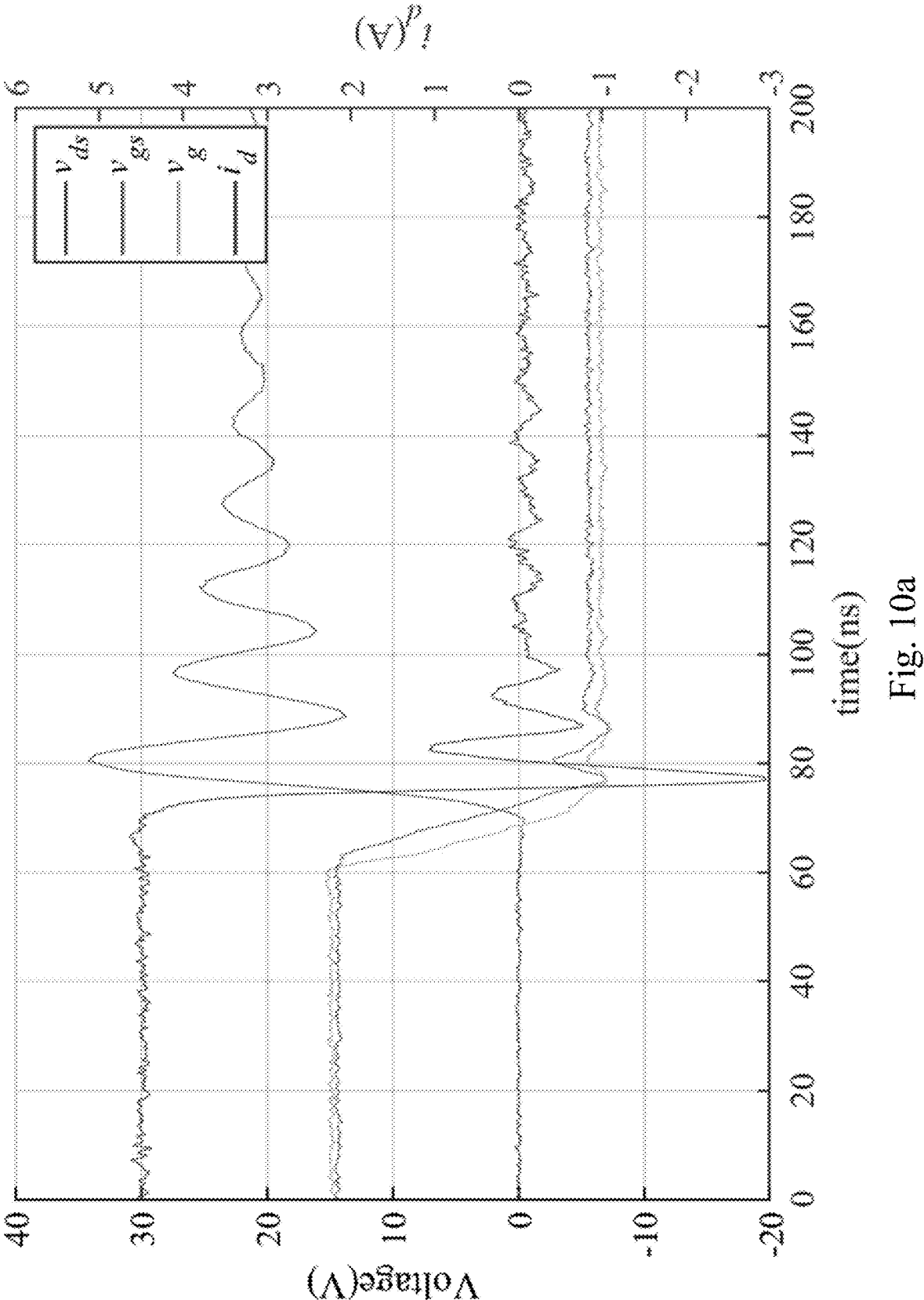
FIG. 10*a* shows measured waveforms of the drain-source voltage, $v_{ds}$, gate-source voltage, $v_{gs}$, output voltage of the gate driver, $v_g$, and drain current, $i_d$, upon turning off the SiC MOSFET for the circuit in FIG. 5 in the experiment.
Figure 10B:
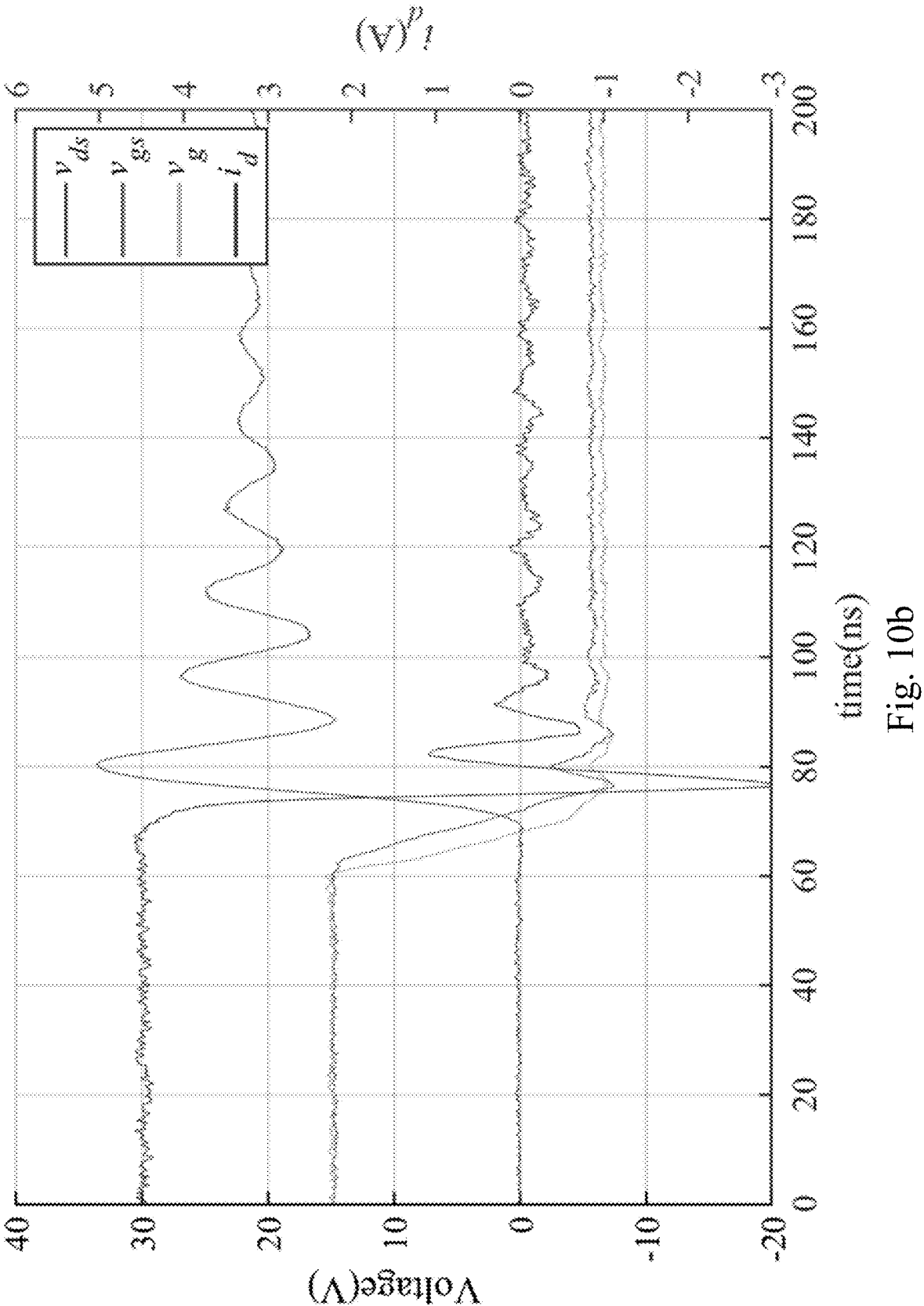
FIG. 10*b* shows measured waveforms of the drain-source voltage, $v_{ds}$, gate-source voltage, $v_{gs}$, output voltage of the gate driver, $v_g$, and drain current, $i_d$, upon turning off the SiC MOSFET for the circuit in FIG. 8*a* in the experiment.
Figure 10C:
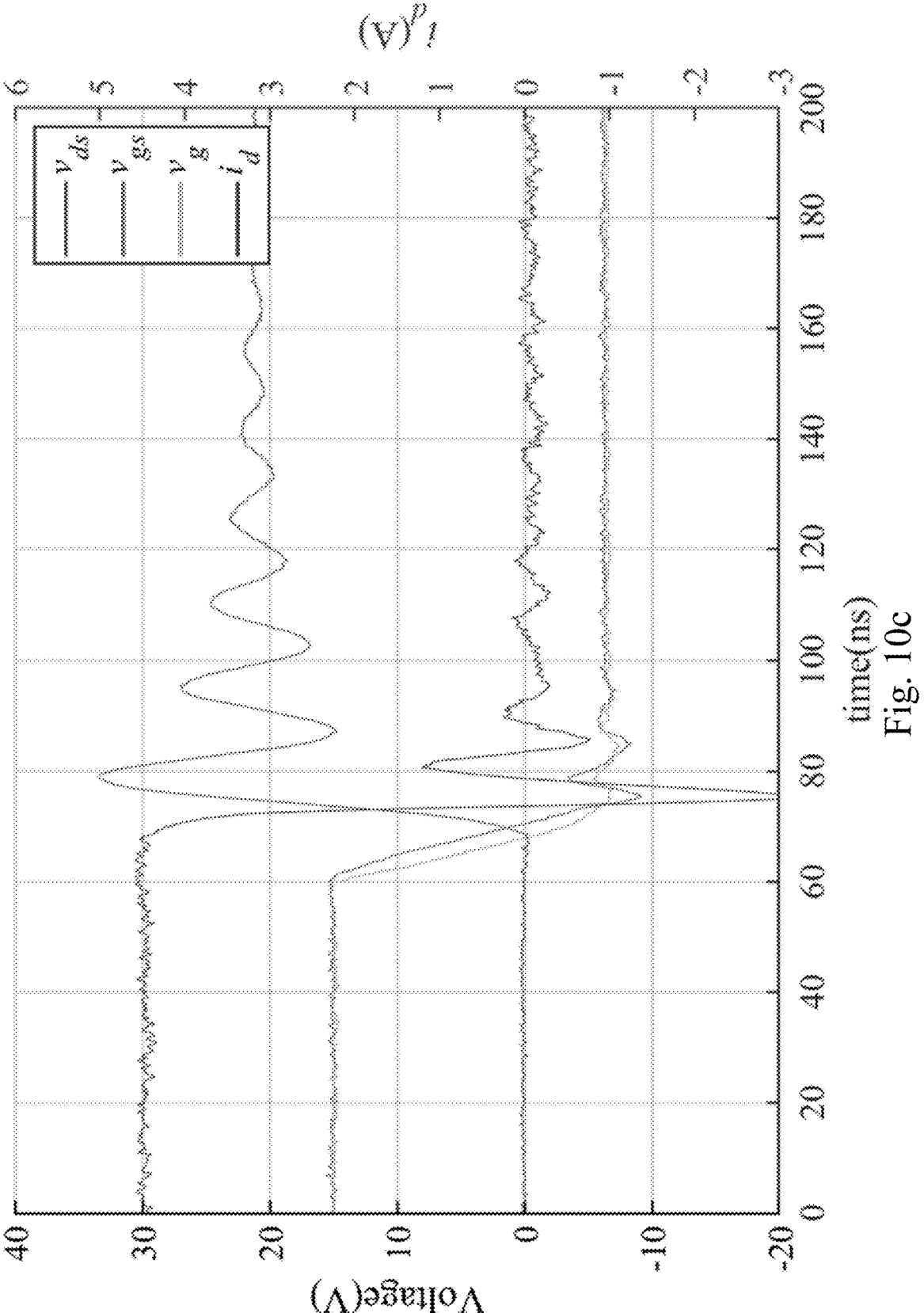
FIG. 10*c* shows measured waveforms of the drain-source voltage, $v_{ds}$, gate-source voltage, $v_{gs}$, output voltage of the gate driver, $v_g$, and drain current, $i_d$, upon turning off the SiC MOSFET for the circuit in FIG. 8*b* in the experiment.
Figure 11A:
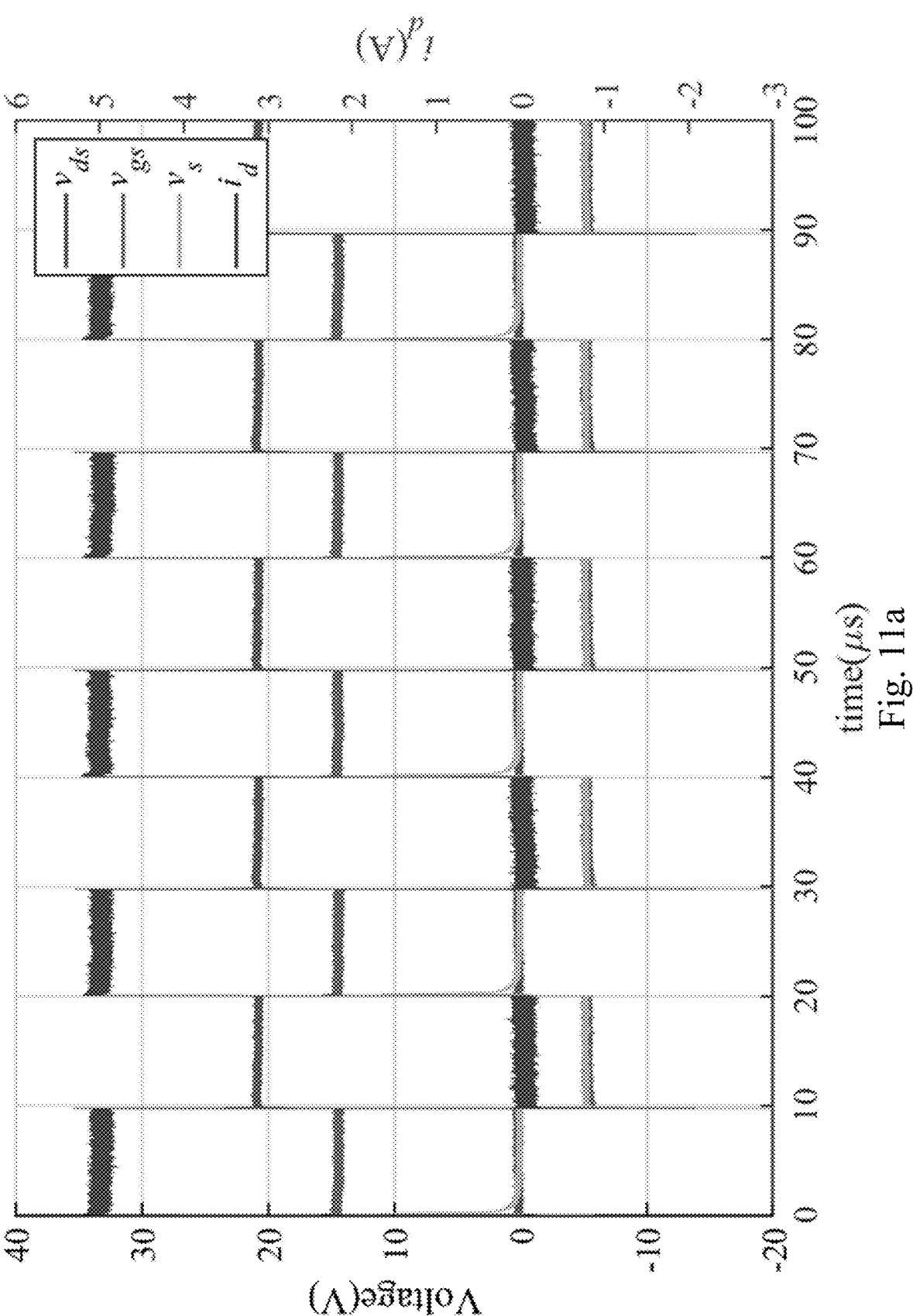
FIG. 11*a* shows the waveforms of $v_{ds}$, $v_{gs}$, $v_s$ and $i_d$ under D=0.5, when $R_{gss}$ equals to ∞, in a simulation of the circuit in FIG. 5.
Figure 11B:
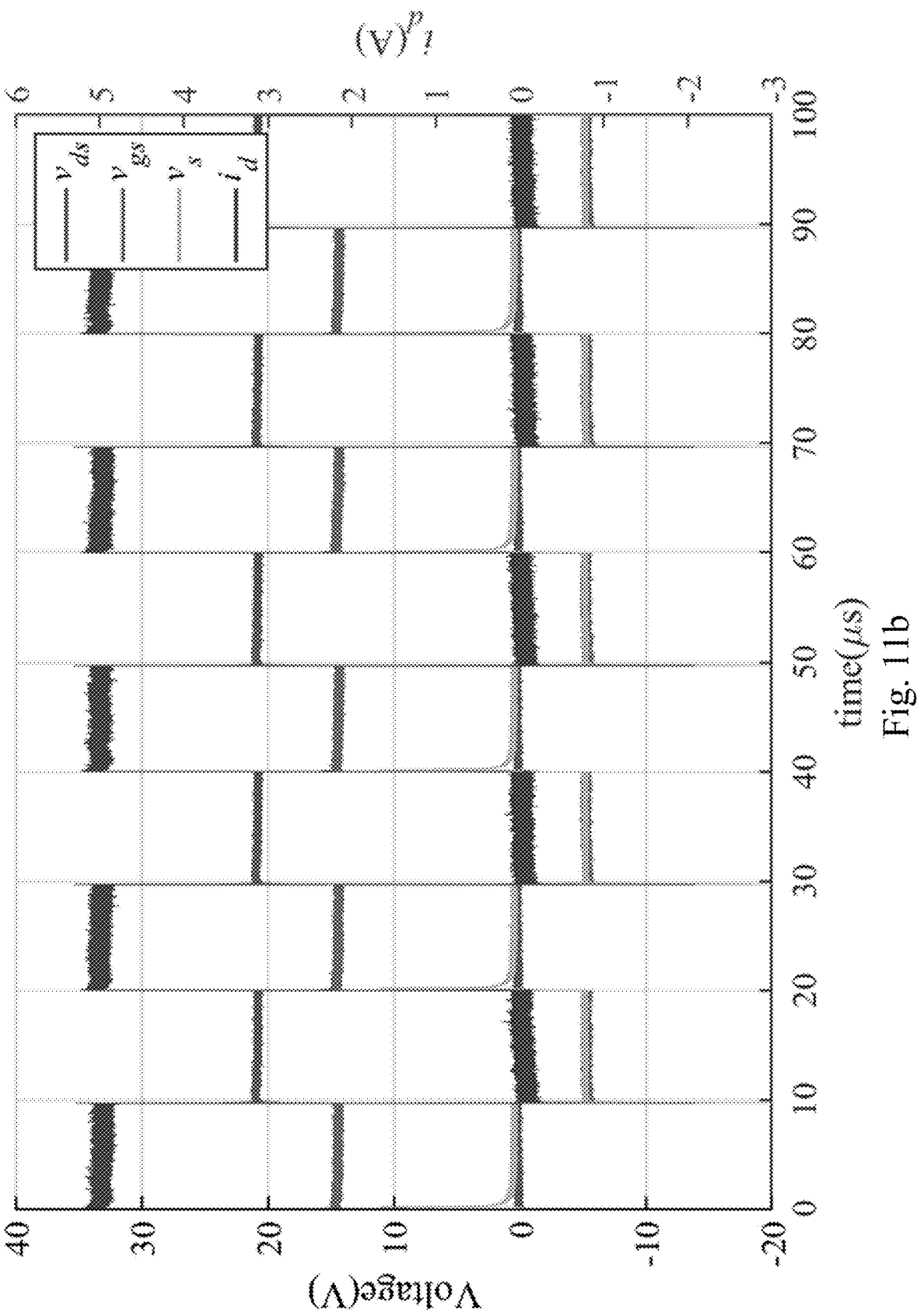
FIG. 11*b* shows the waveforms of $v_{ds}$, $v_{gs}$, $v_s$ and $i_d$ under D=0.5, when $R_{gss}$ equals to 300 kΩ in the simulation.
Figure 11C:
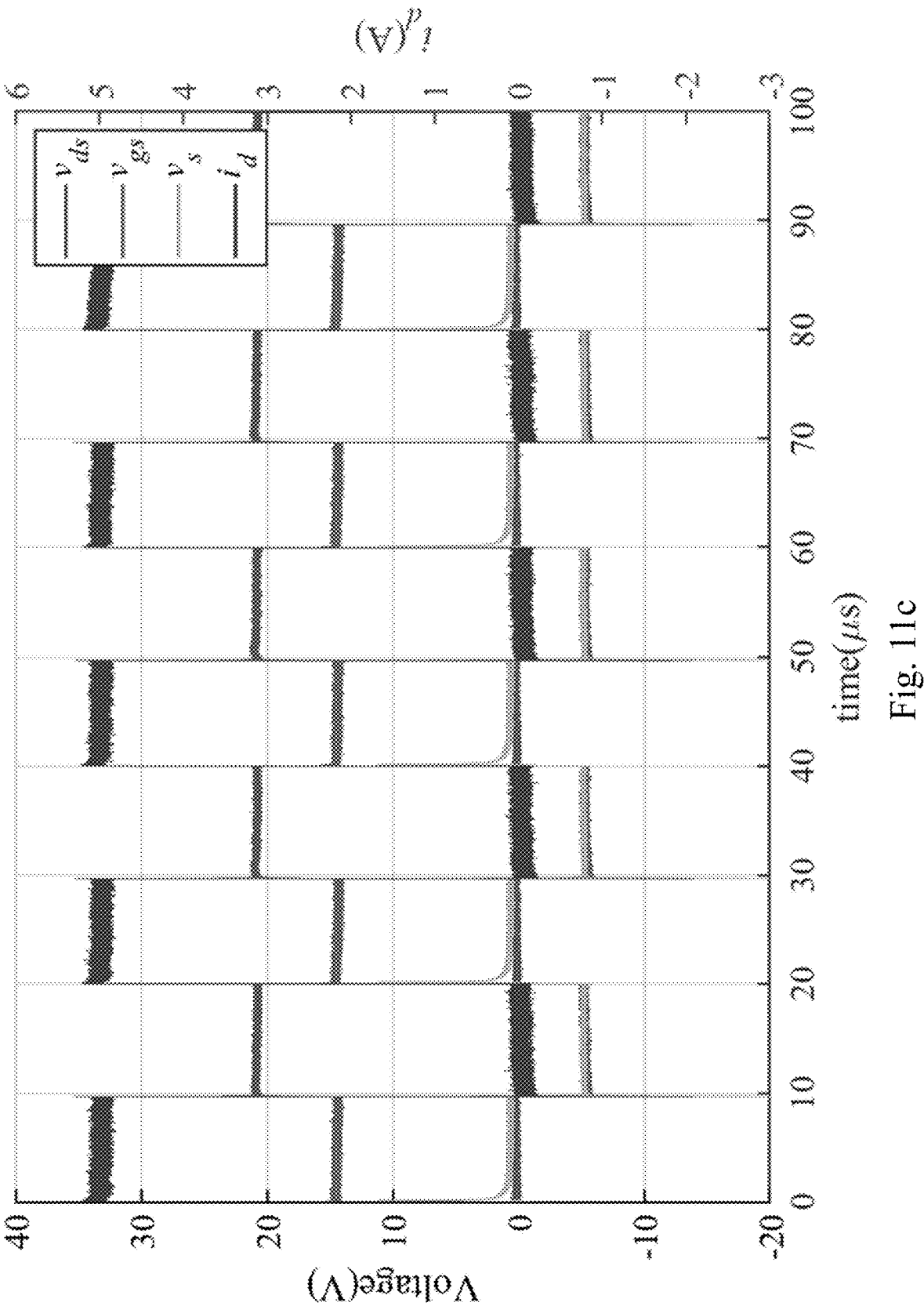
FIG. 11*c* shows the waveforms of $v_{ds}$, $v_{gs}$, $v_s$ and $i_d$ under D=0.5, when $R_{gss}$ equals to 200 kΩ in the simulation.
Figure 11D:
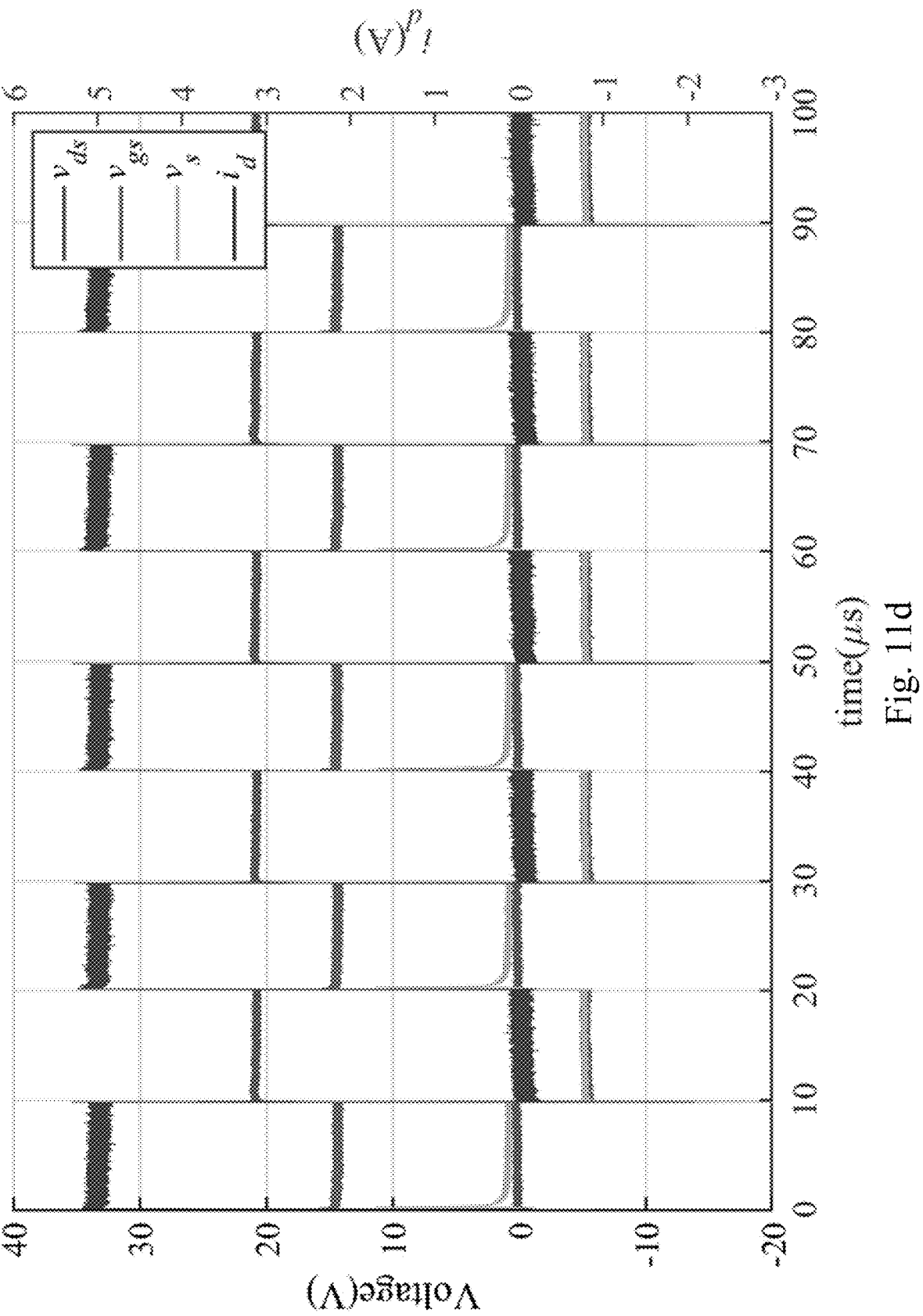
FIG. 11*d* shows the waveforms of $v_{ds}$, $v_{gs}$, $v_s$ and $i_d$ under D=0.5, when $R_{gss}$ equals to 150 kΩ in the simulation.
Figure 11E:
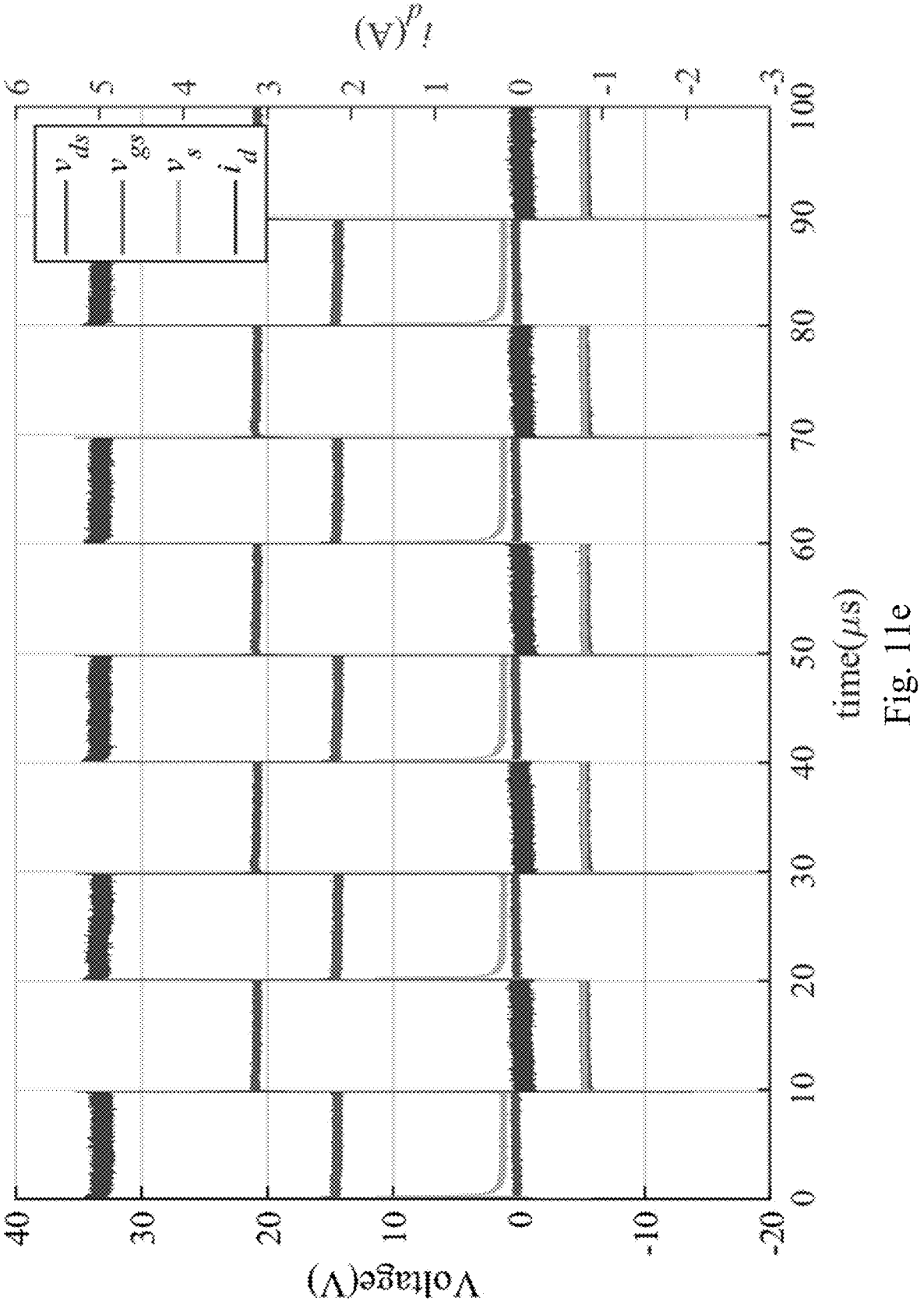
FIG. 11*e* shows the waveforms of $v_{ds}$, $v_{gs}$, $v_s$ and $i_d$ under D=0.5, when $R_{gss}$ equals to 100 kΩ in the simulation.
Figure 11F:
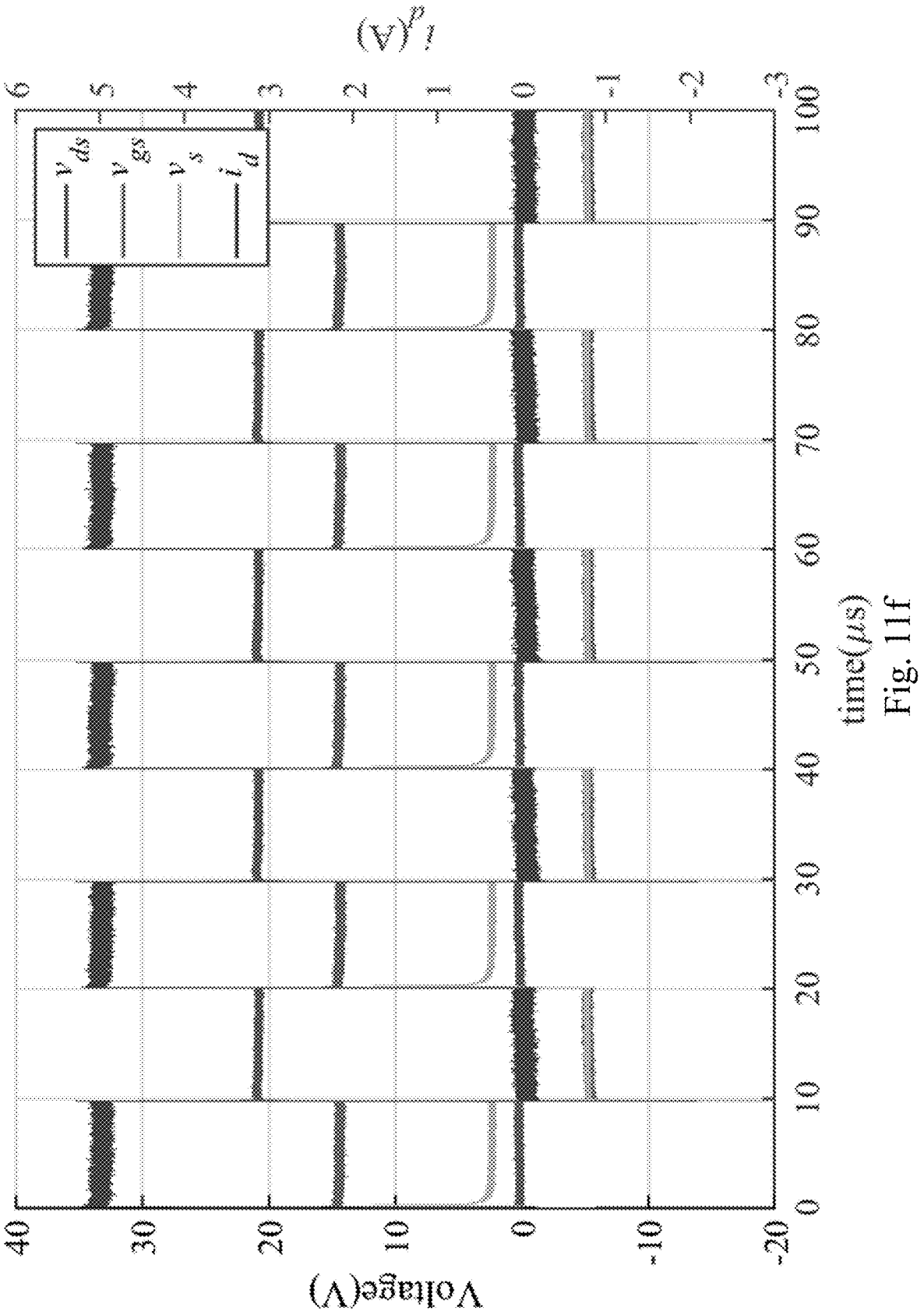
FIG. 11*f* shows the waveforms of $v_{ds}$, $v_{gs}$, $v_s$ and $i_d$ under D=0.5, when $R_{gss}$ equals to 47 kΩ in the simulation.
Figure 11G:
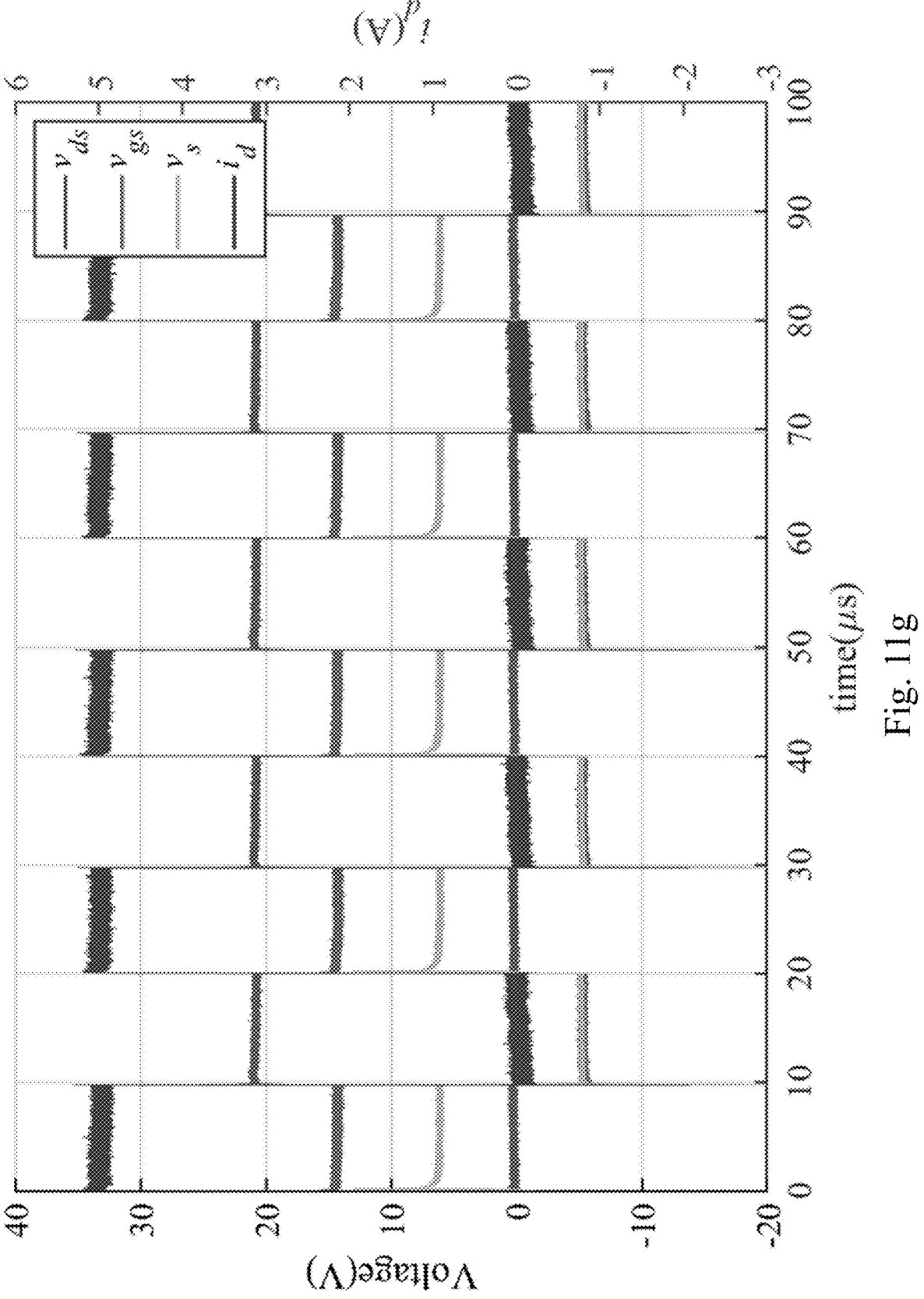
FIG. 11*g* shows the waveforms of $v_{ds}$, $v_{gs}$, $v_s$ and $i_d$ under D=0.5, when $R_{gss}$ equals to 15 kΩ in the simulation.
Figure 11H:
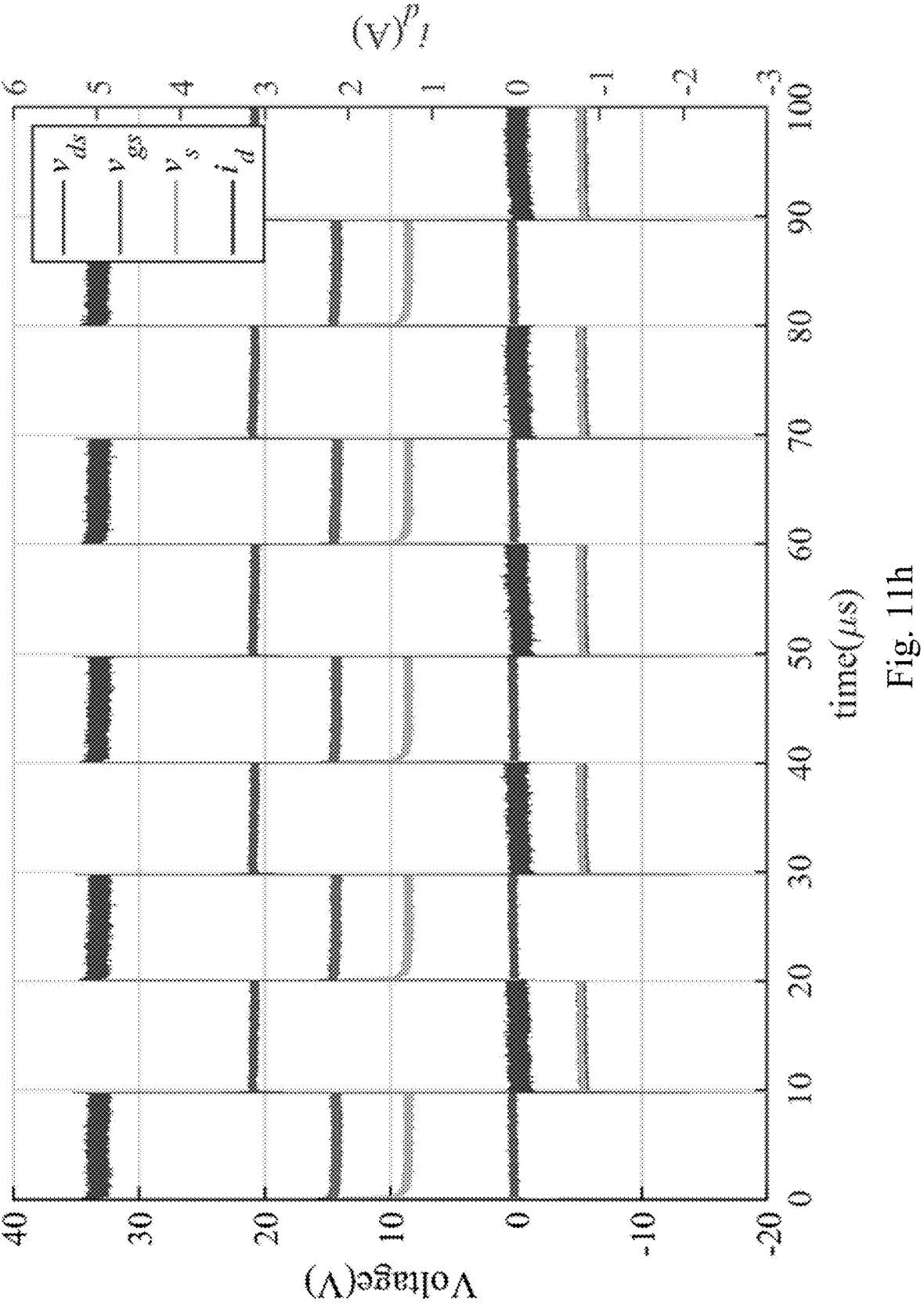
FIG. 11*h* shows the waveforms of $v_{ds}$, $v_{gs}$, $v_s$ and $i_d$ under D=0.5, when $R_{gss}$ equals to 10 kΩ in the simulation.
Figure 11I:
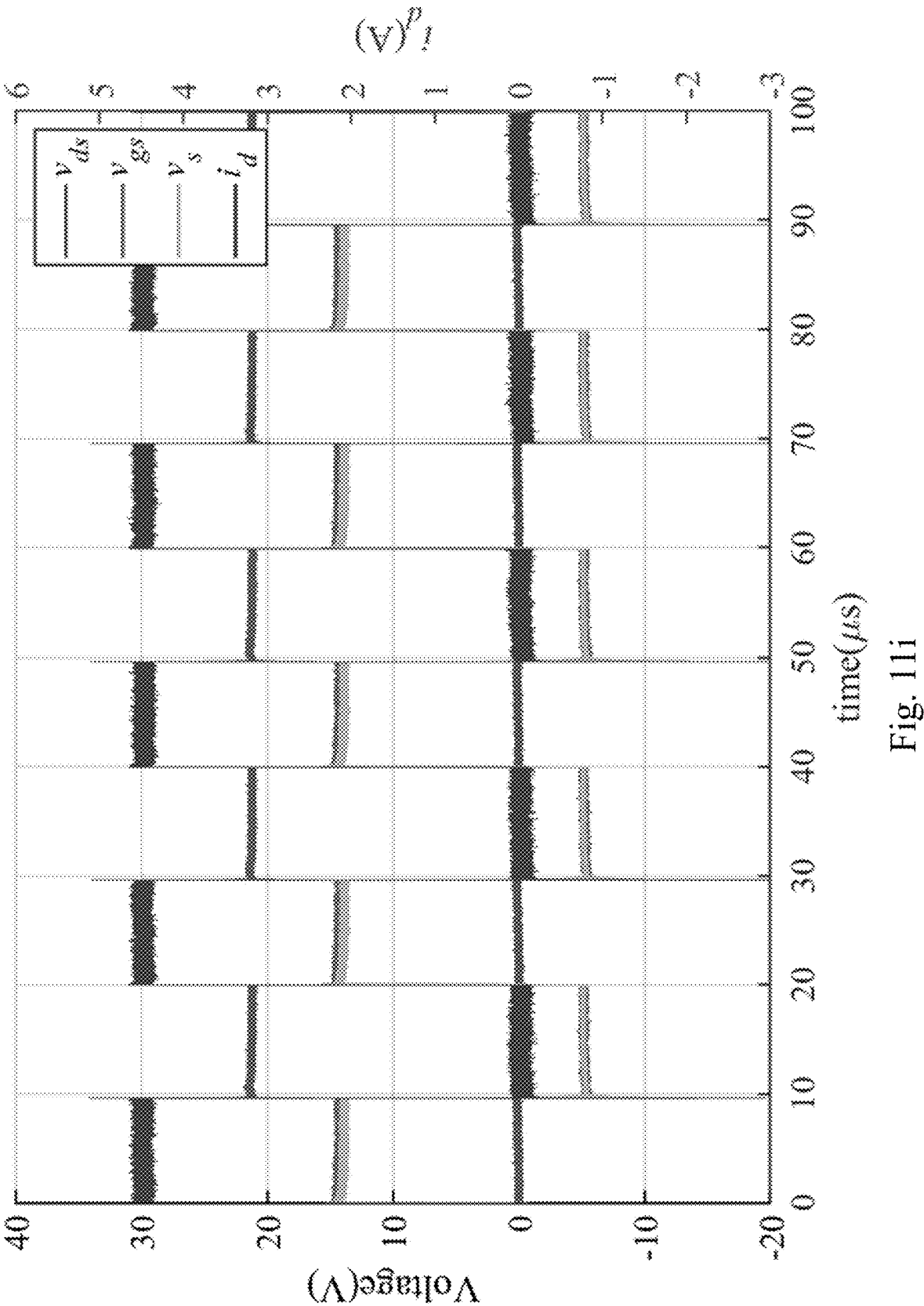
FIG. 11*i* shows the waveforms of $v_{ds}$, $v_{gs}$, $v_s$ and $i_d$ under D=0.5, when $R_{gss}$ equals to 4.7 kΩ in the simulation.
Figure 12A:
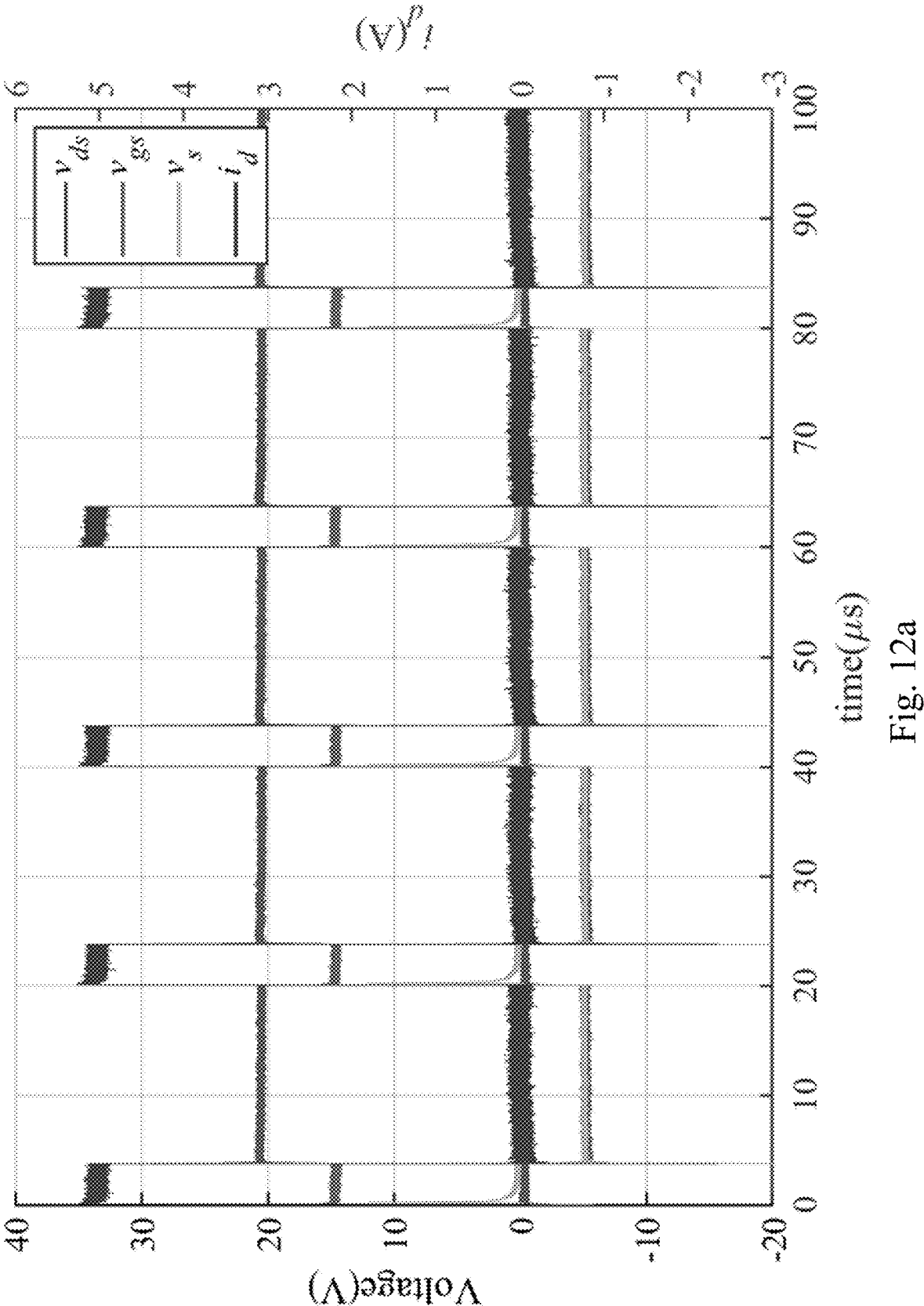
FIG. 12*a* shows the waveforms of $v_{ds}$, $v_{gs}$, $v_s$ and $i_d$ under D=0.2, when $R_{gss}$ equals to ∞, in a simulation of the circuit in FIG. 5.
Figure 12B:
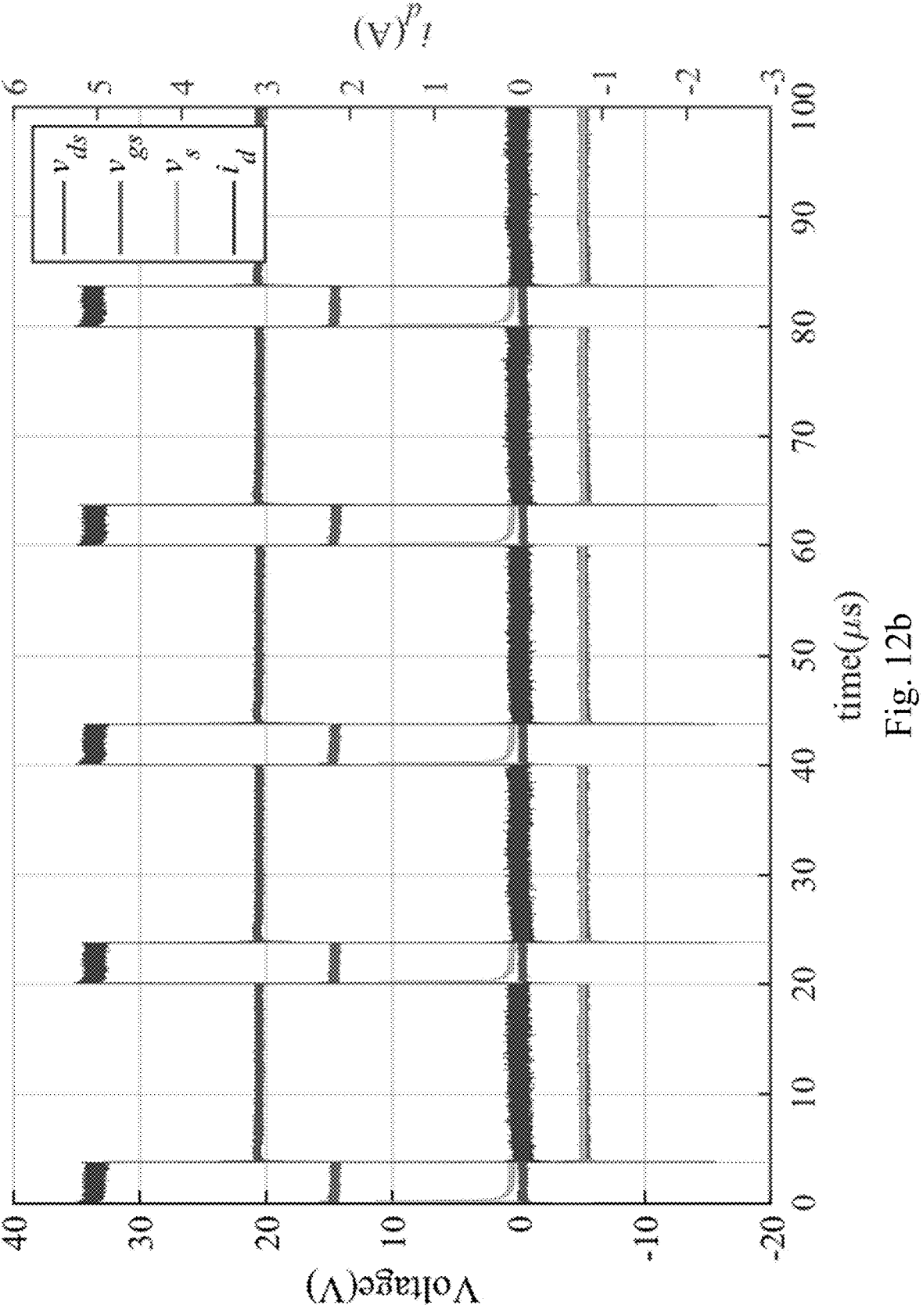
FIG. 12*b* shows the waveforms of $v_{ds}$, $v_{gs}$, $v_s$ and $i_d$ under D=0.2, when $R_{gss}$ equals to 300 kΩ in the simulation.
Figure 12C:
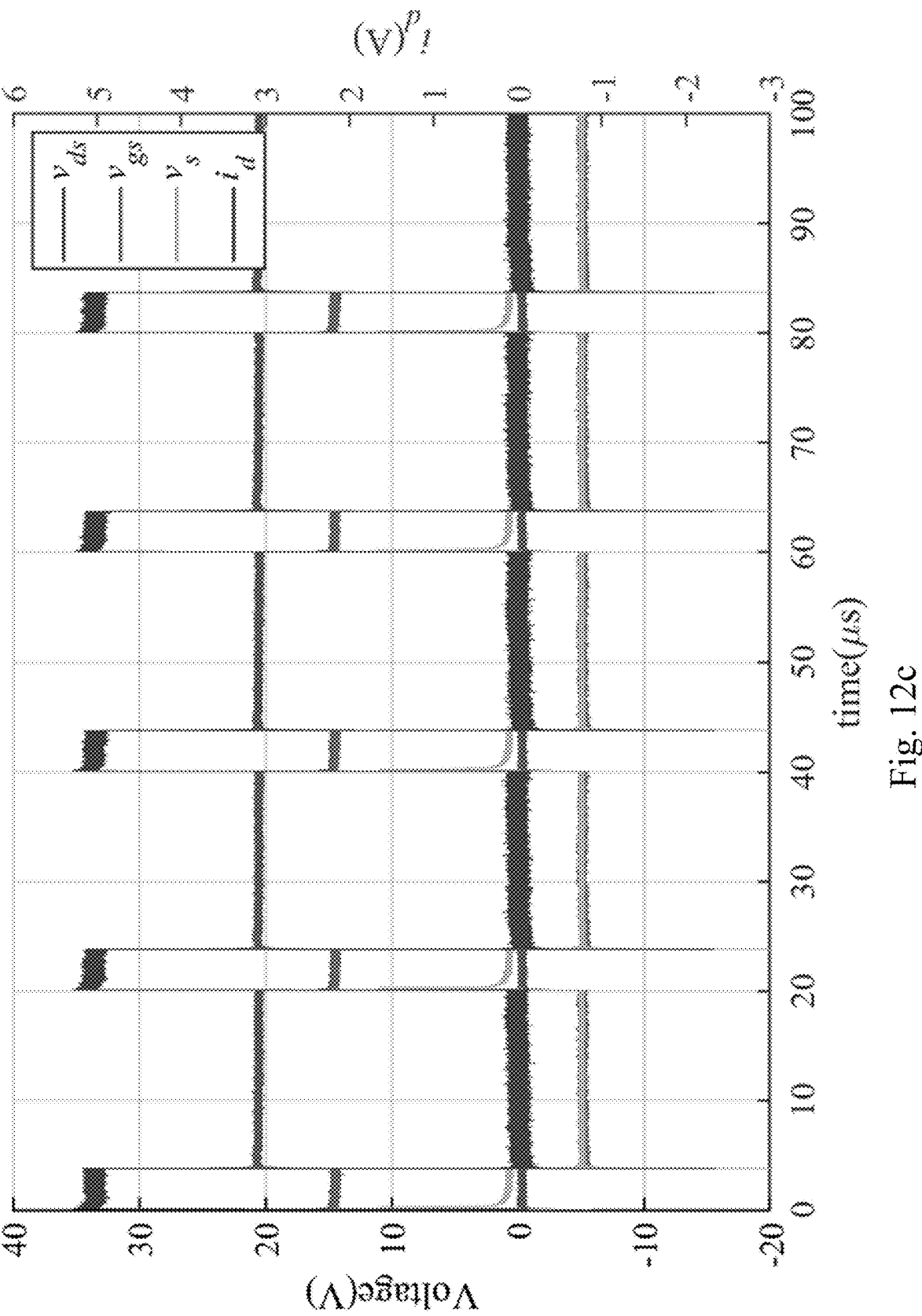
FIG. 12*c* shows the waveforms of $v_{ds}$, $v_{gs}$, $v_s$ and $i_d$ under D=0.2, when $R_{gss}$ equals to 200 kΩ in the simulation.
Figure 12D:
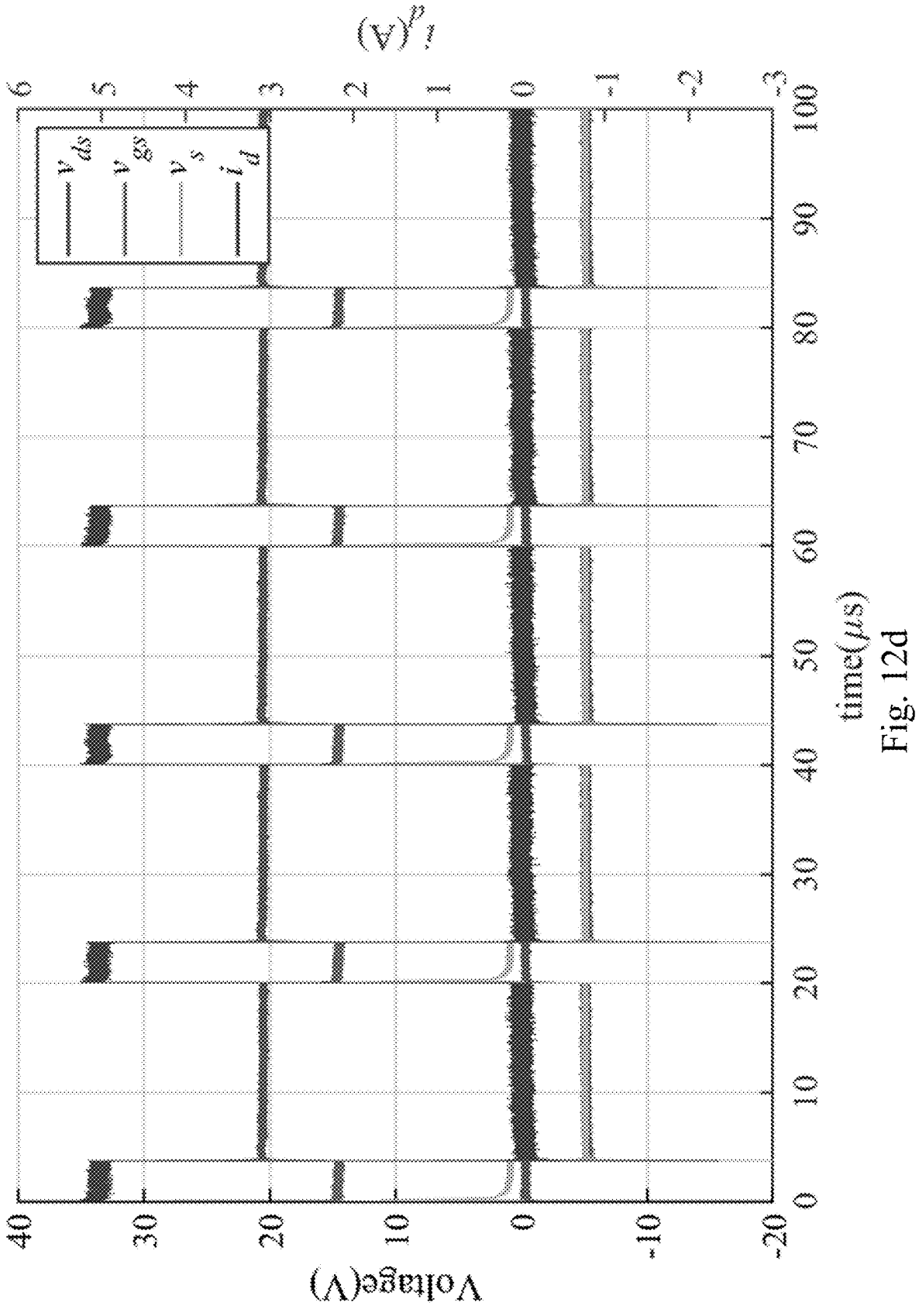
FIG. 12*d* shows the waveforms of $v_{ds}$, $v_{gs}$, $v_s$ and $i_d$ under D=0.2, when $R_{gss}$ equals to 150 kΩ in the simulation.
Figure 12E:
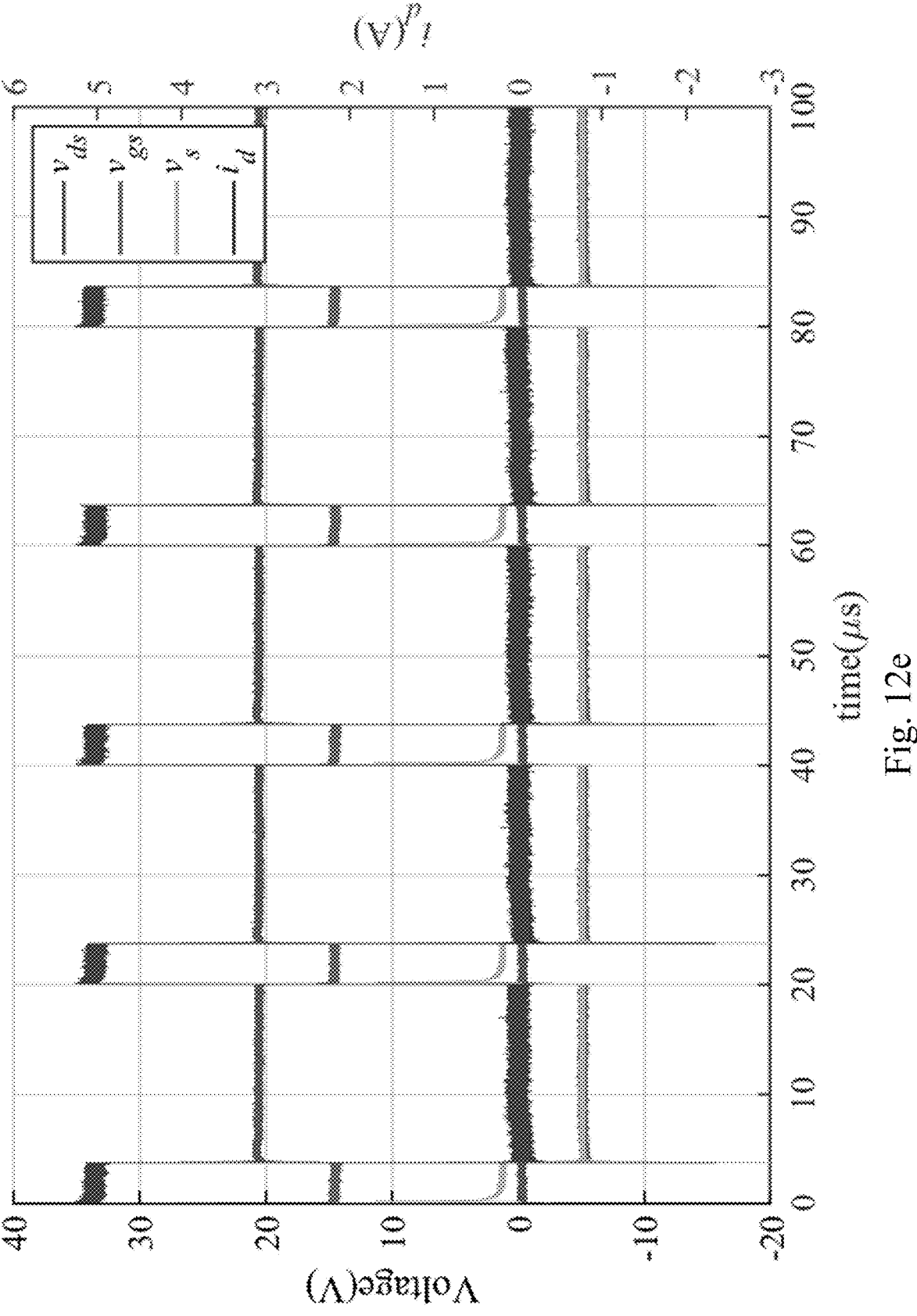
FIG. 12*e* shows the waveforms of $v_{ds}$, $v_{gs}$, $v_s$ and $i_d$ under D=0.2, when $R_{gss}$ equals to 100 kΩ in the simulation.
Figure 12F:
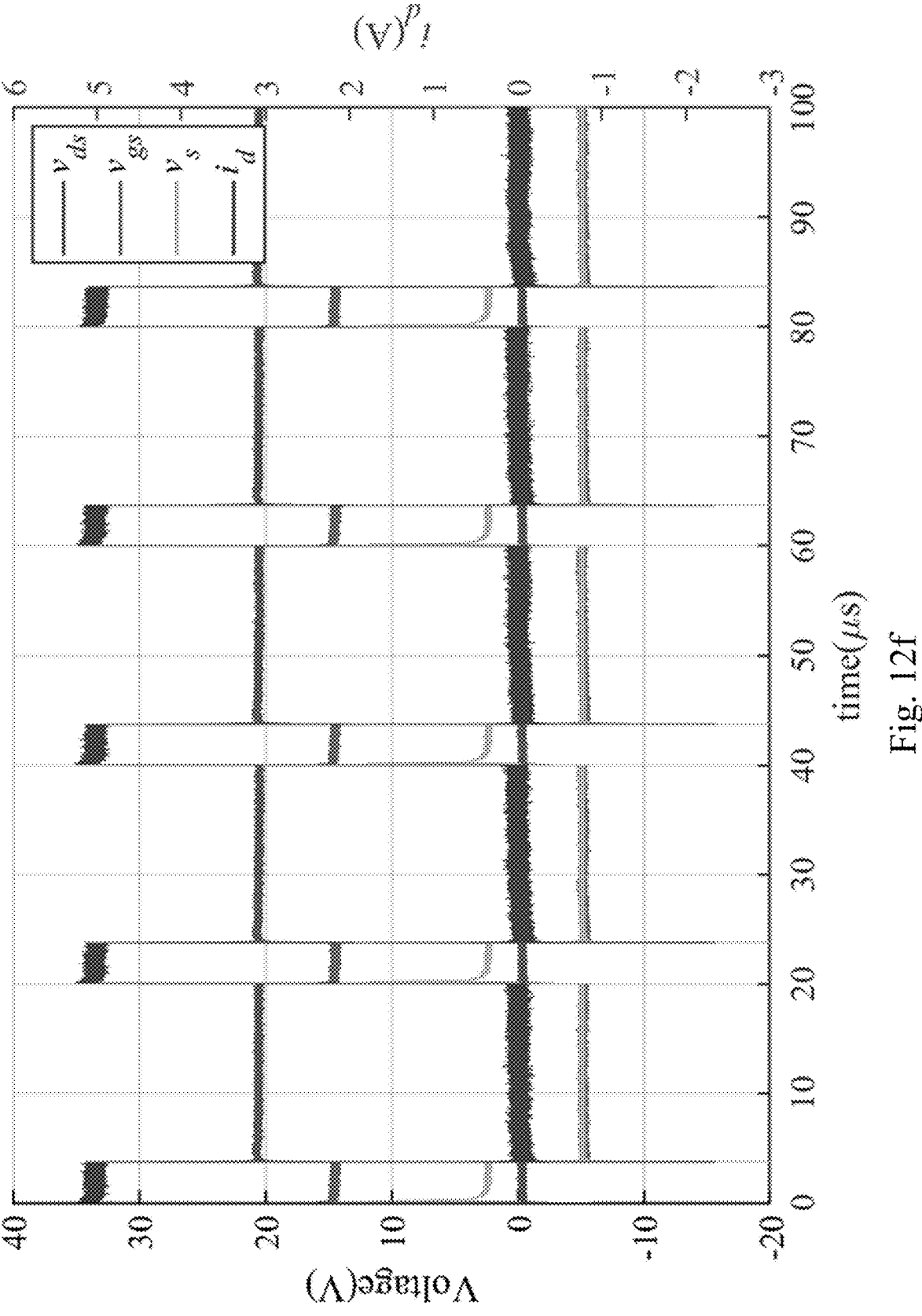
FIG. 12*f* shows the waveforms of $v_{ds}$, $v_{gs}$, $v_s$ and $i_d$ under D=0.2, when $R_{gss}$ equals to 47 kΩ in the simulation.
Figure 12G:
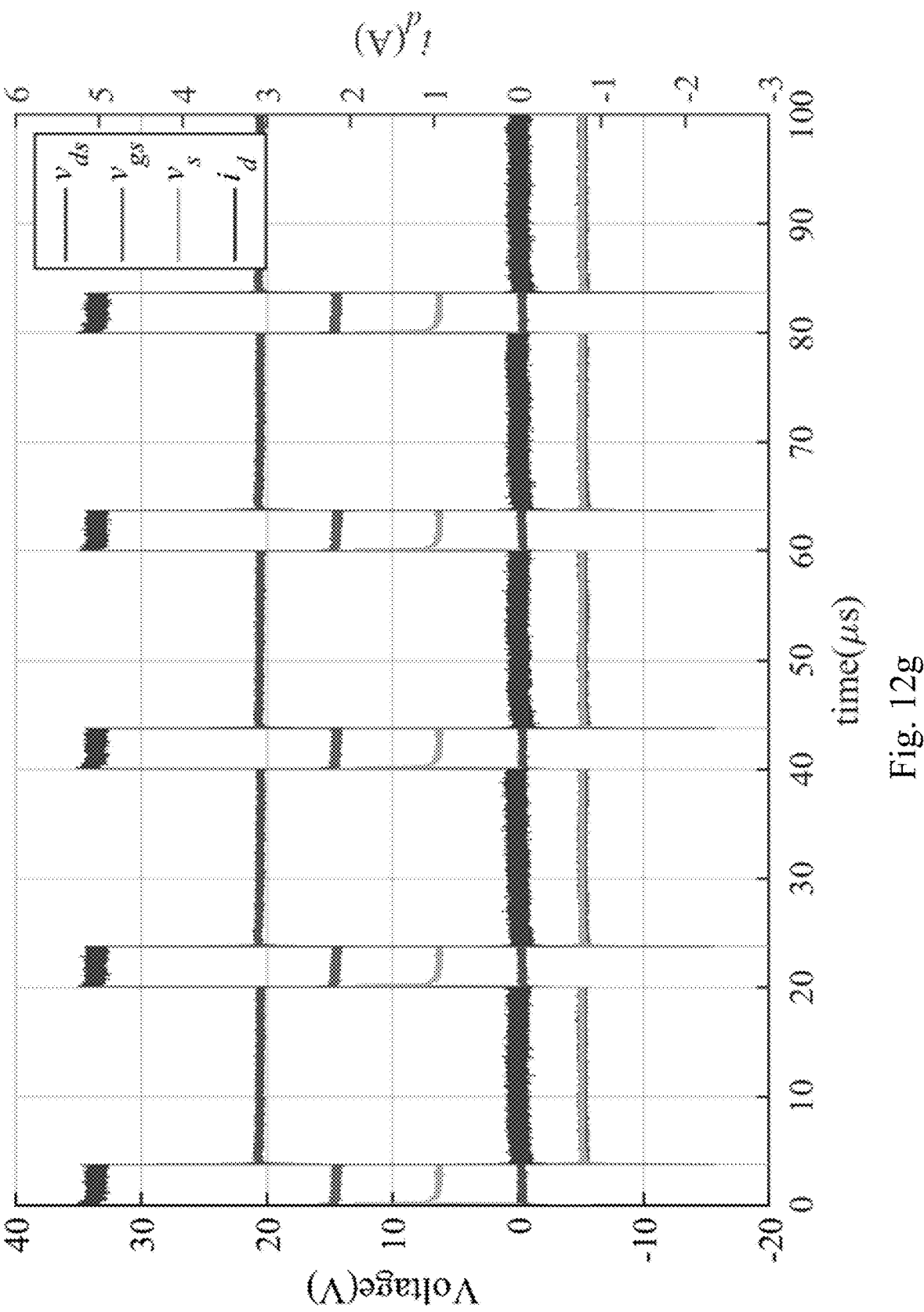
FIG. 12*g* shows the waveforms of $v_{ds}$, $v_{gs}$, $v_s$ and $i_d$ under D=0.2, when $R_{gss}$ equals to 15 kΩ in the simulation.
Figure 12H:
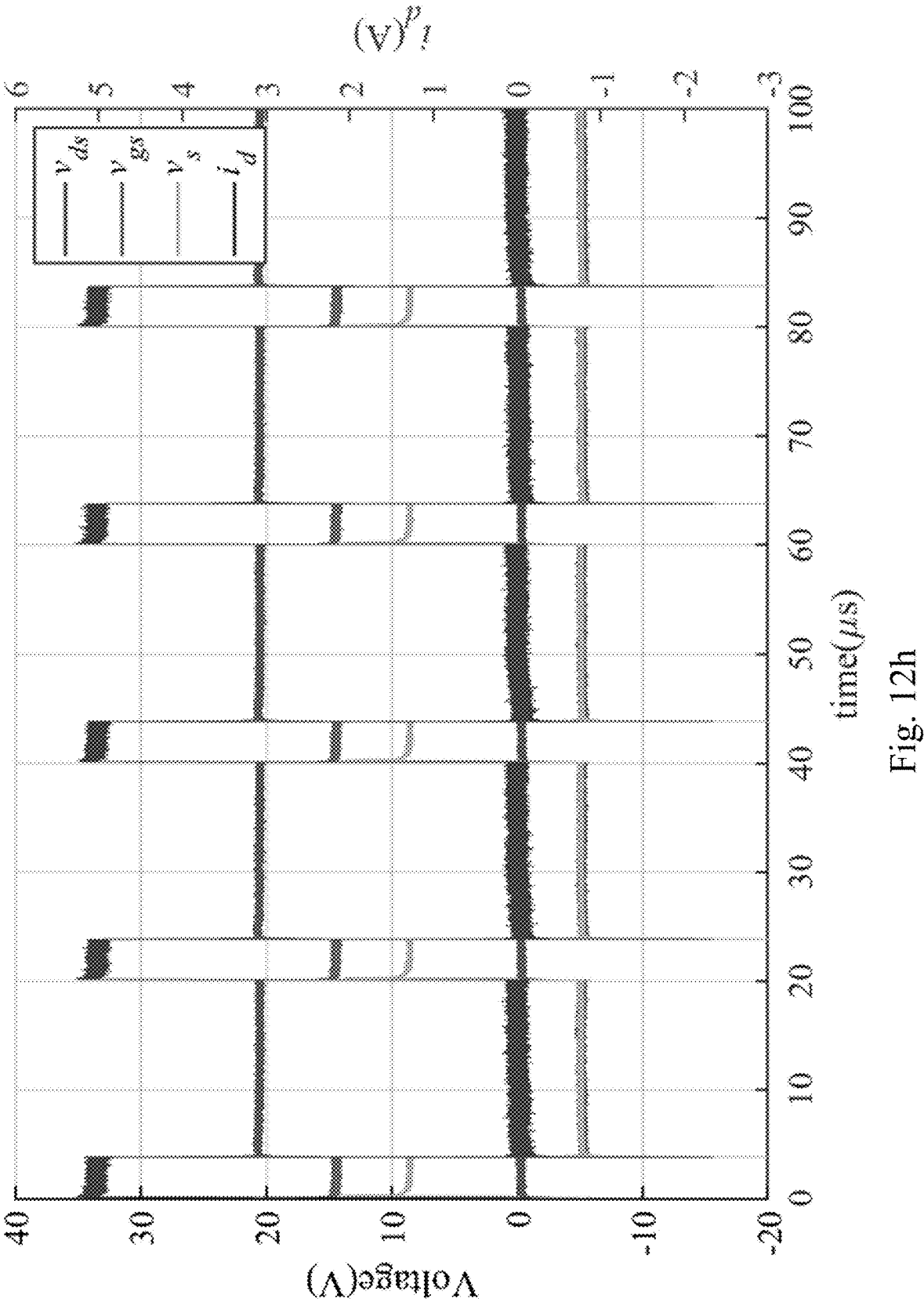
FIG. 12*h* shows the waveforms of $v_{ds}$, $v_{gs}$, $v_s$ and $i_d$ under D=0.2, when $R_{gss}$ equals to 10 kΩ in the simulation.
Figure 12I:
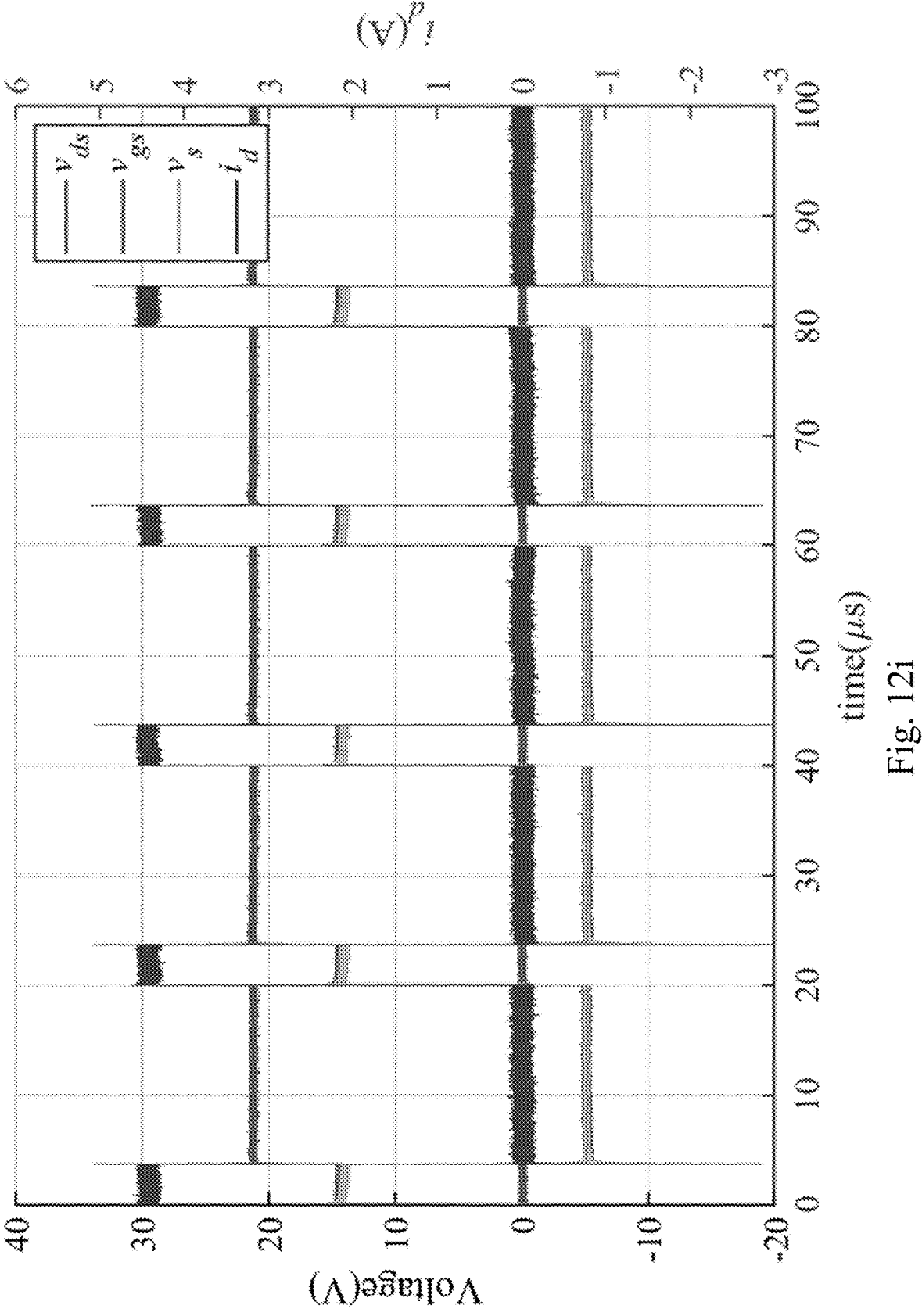
FIG. 12*i* shows the waveforms of $v_{ds}$, $v_{gs}$, $v_s$ and $i_d$ under D=0.2, when $R_{gss}$ equals to 4.7 kΩ in the simulation.
Figure 13A:
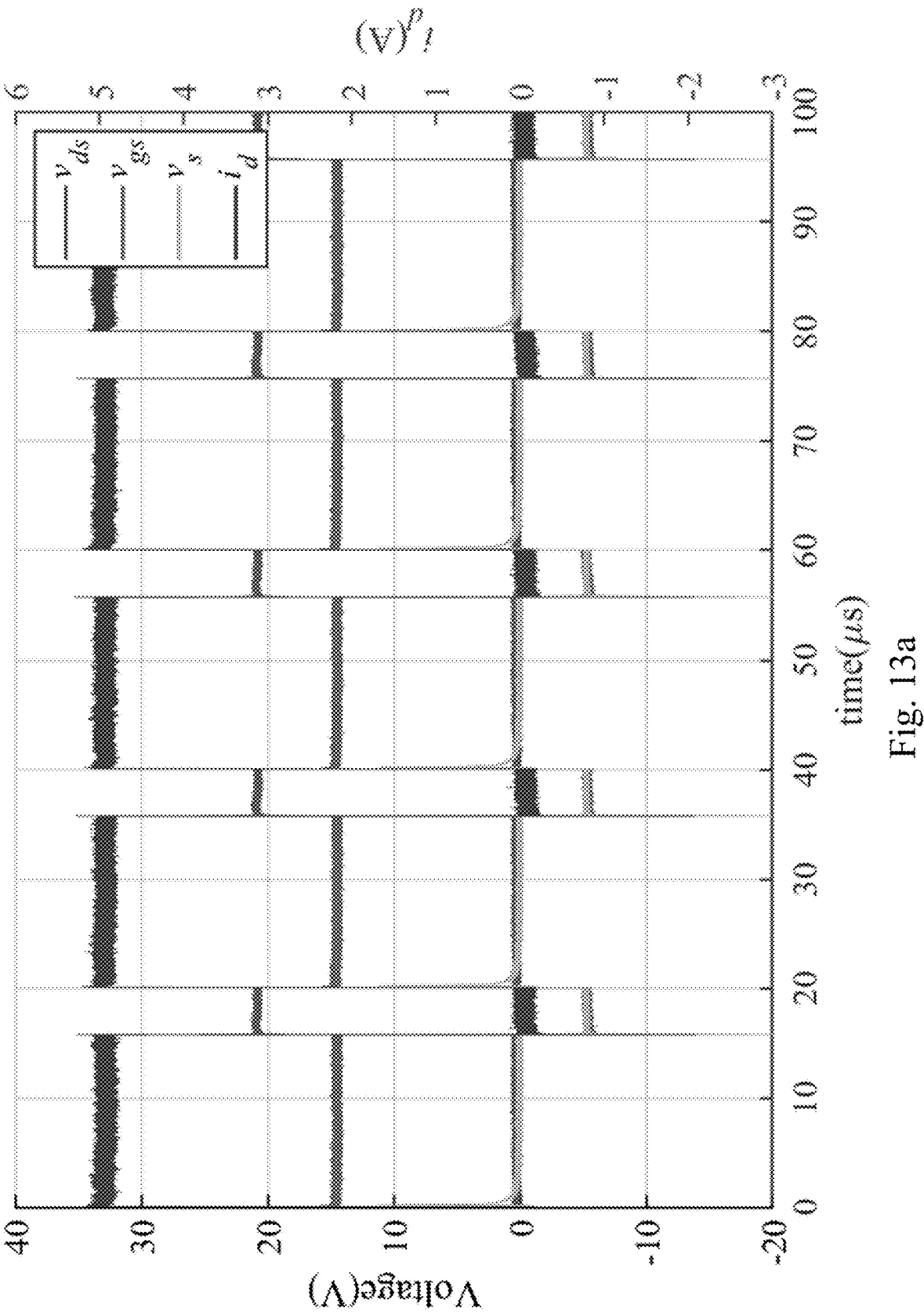
FIG. 13*a* shows the waveforms of $v_{ds}$, $v_{gs}$, $v_s$ and $i_d$ under D=0.8, when $R_{gss}$ equals to ∞, in a simulation of the circuit in FIG. 5.
Figure 13B:
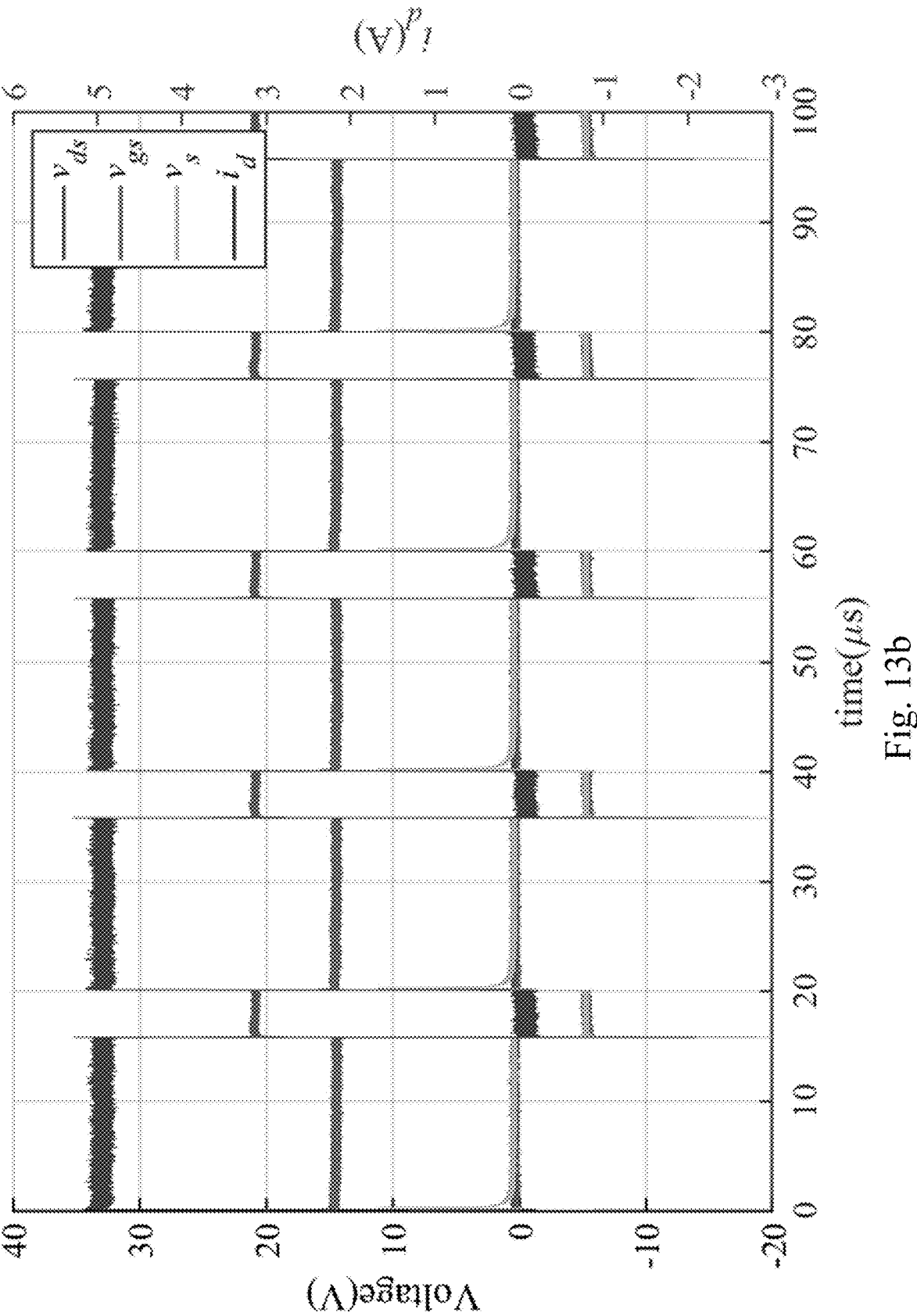
FIG. 13*b* shows the waveforms of $v_{ds}$, $v_{gs}$, $v_s$ and $i_d$ under D=0.8, when $R_{gss}$ equals to 300 kΩ in the simulation.
Figure 13C:
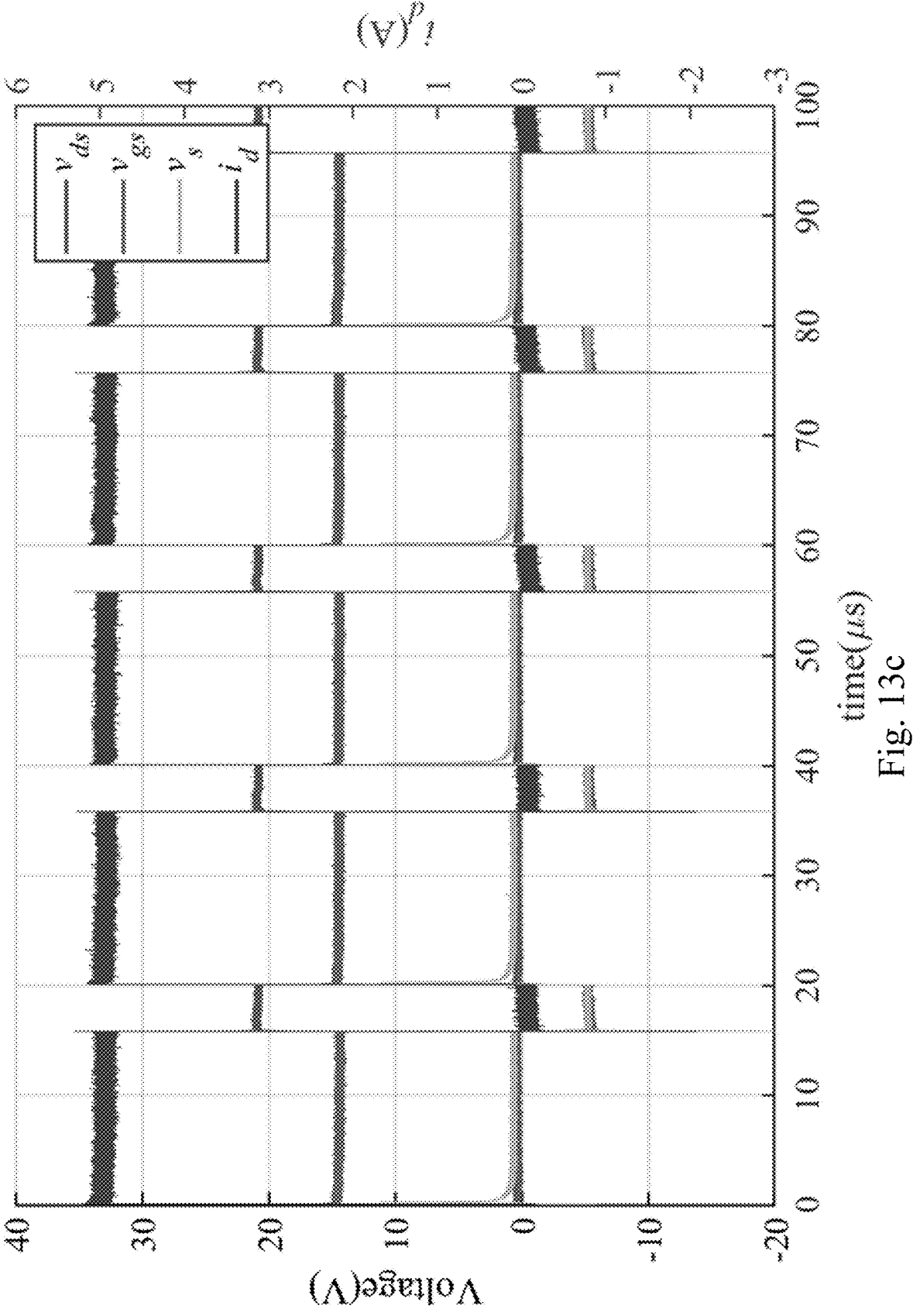
FIG. 13*c* shows the waveforms of $v_{ds}$, $v_{gs}$, $v_s$ and $i_d$ under D=0.8, when $R_{gss}$ equals to 200 kΩ in the simulation.
Figure 13D:
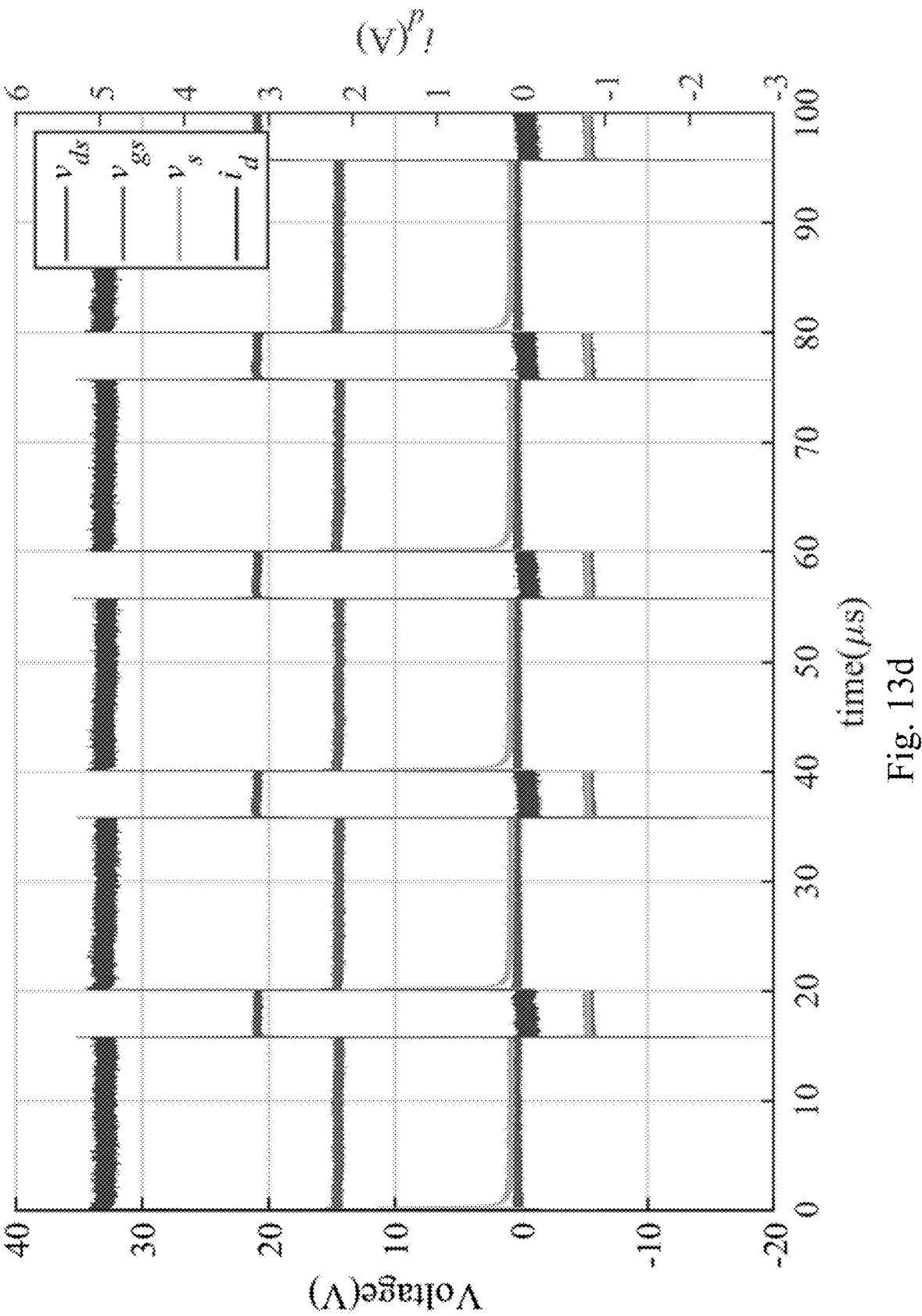
FIG. 13*d* shows the waveforms of $v_{ds}$, $v_{gs}$, $v_s$ and $i_d$ under D=0.8, when $R_{gss}$ equals to 150 kΩ in the simulation.
Figure 13E:
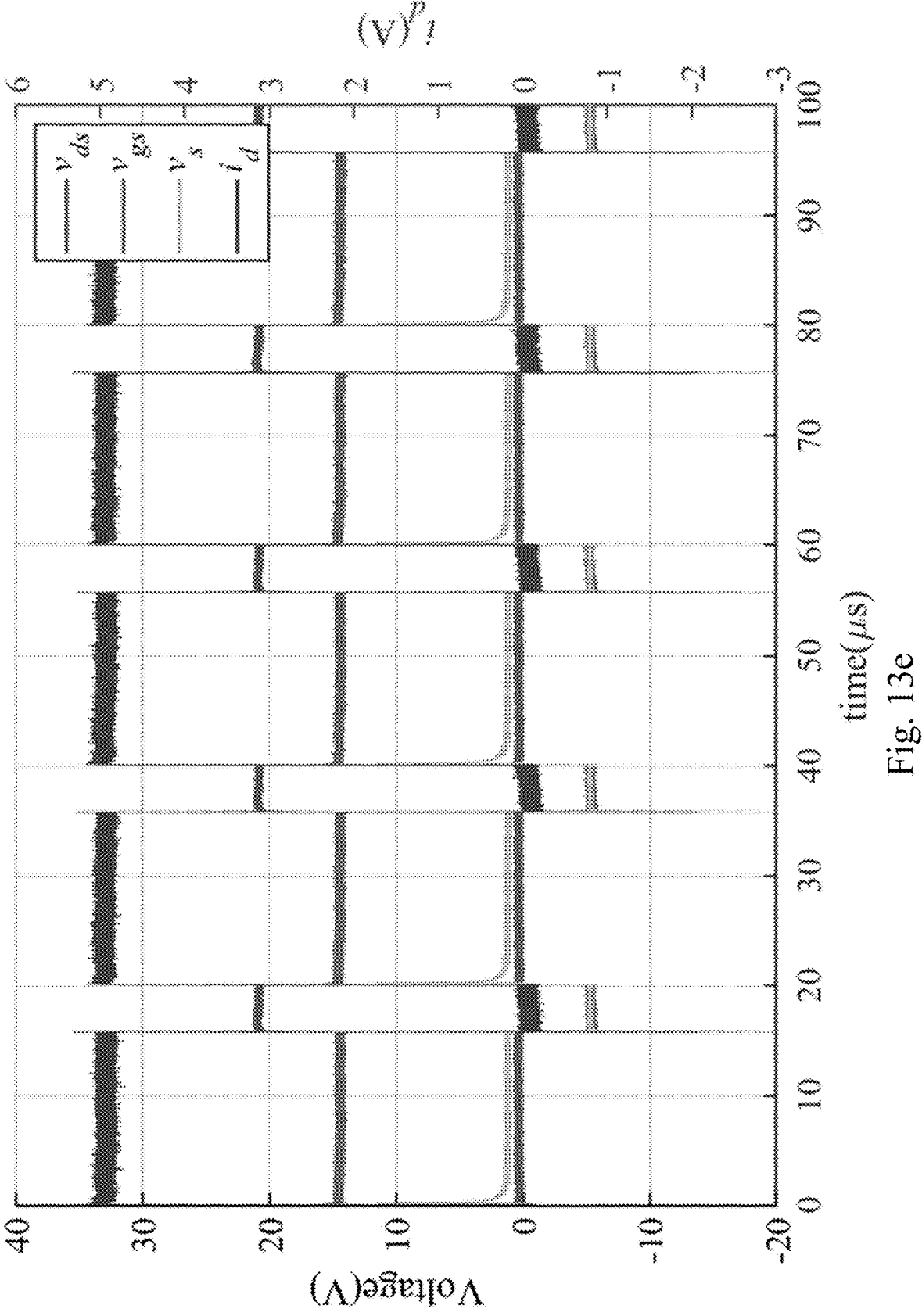
FIG. 13*e* shows the waveforms of $v_{ds}$, $v_{gs}$, $v_s$ and $i_d$ under D=0.8, when $R_{gss}$ equals to 100 kΩ in the simulation.
Figure 13F:
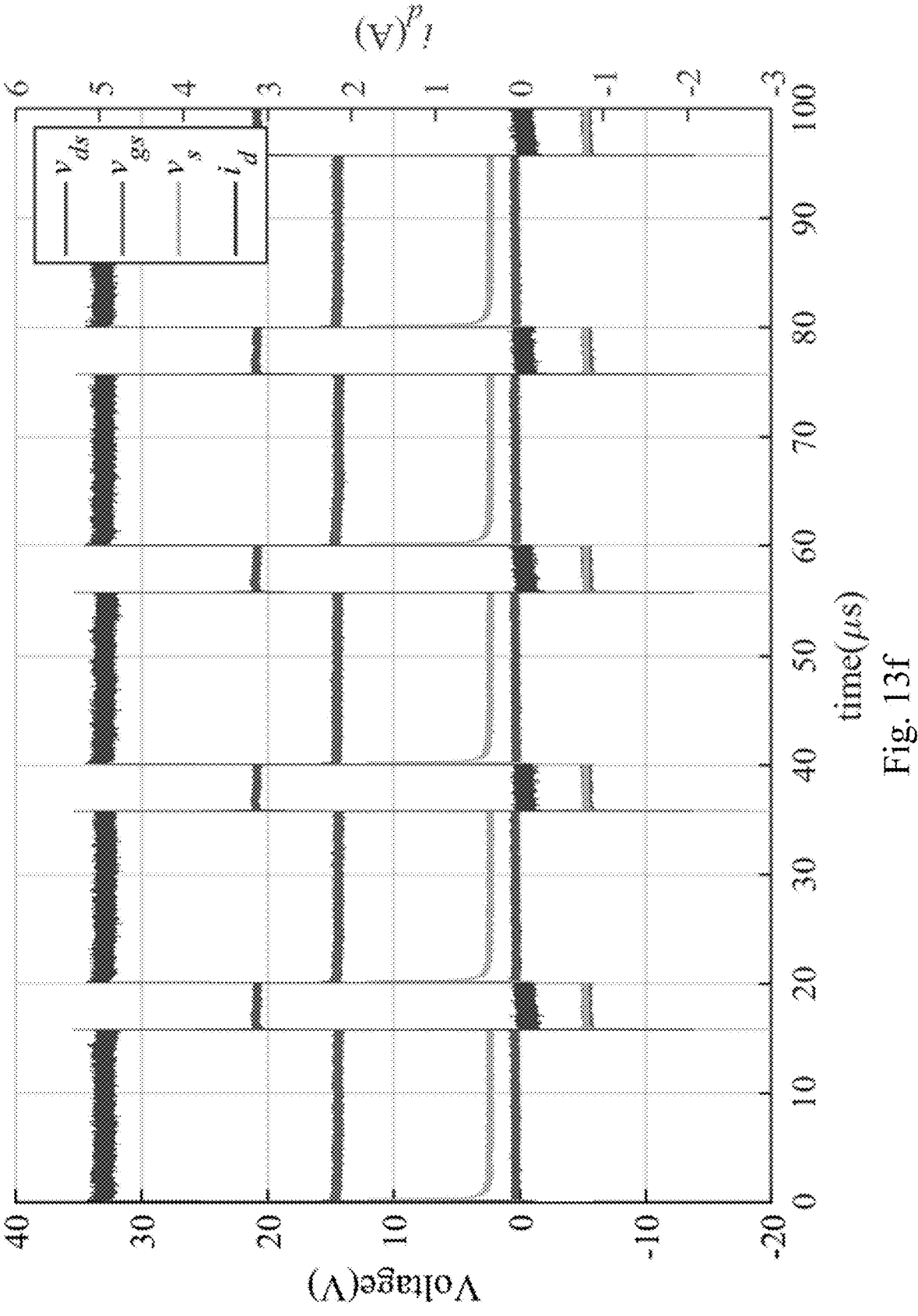
FIG. 13*f* shows the waveforms of $v_{ds}$, $v_{gs}$, $v_s$ and $i_d$ under D=0.8, when $R_{gss}$ equals to 47 kΩ in the simulation.
Figure 13G:
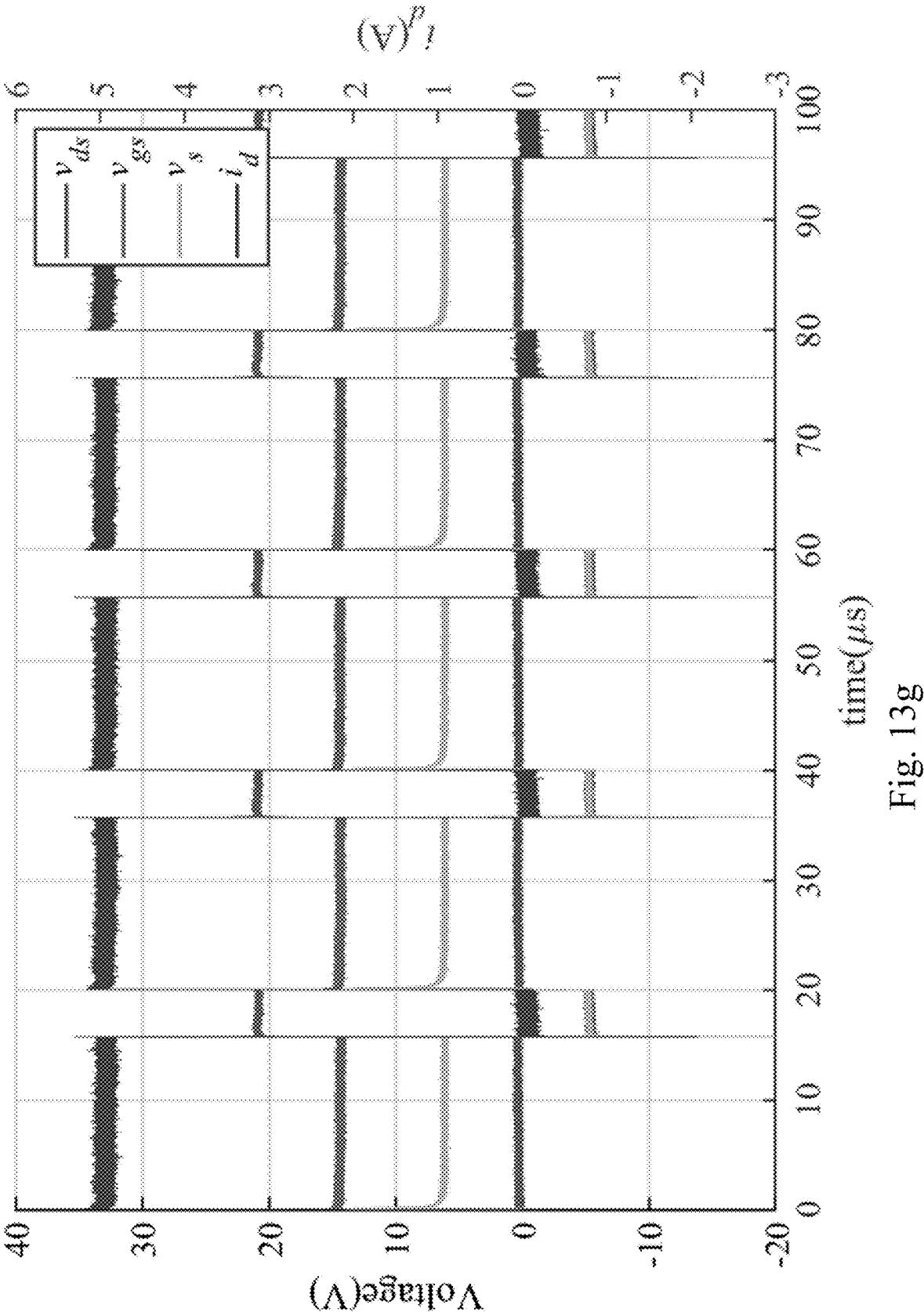
FIG. 13*g* shows the waveforms of $v_{ds}$, $v_{gs}$, $v_s$ and $i_d$ under D=0.8, when $R_{gss}$ equals to 15 kΩ in the simulation.
Figure 13H:
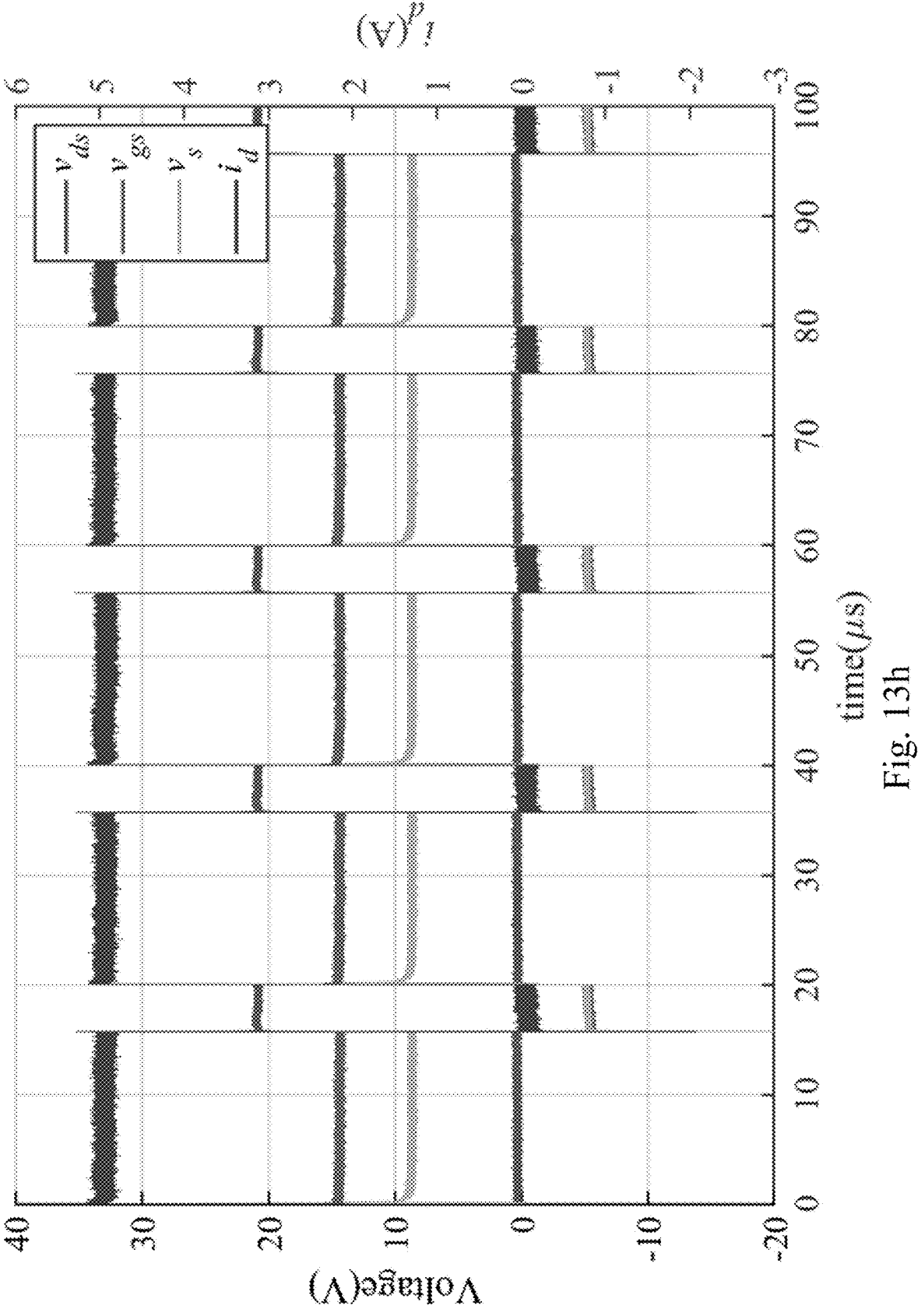
FIG. 13*h* shows the waveforms of $v_{ds}$, $v_{gs}$, $v_s$ and $i_d$ under D=0.8, when $R_{gss}$ equals to 10 kΩ in the simulation.
Figure 13I:
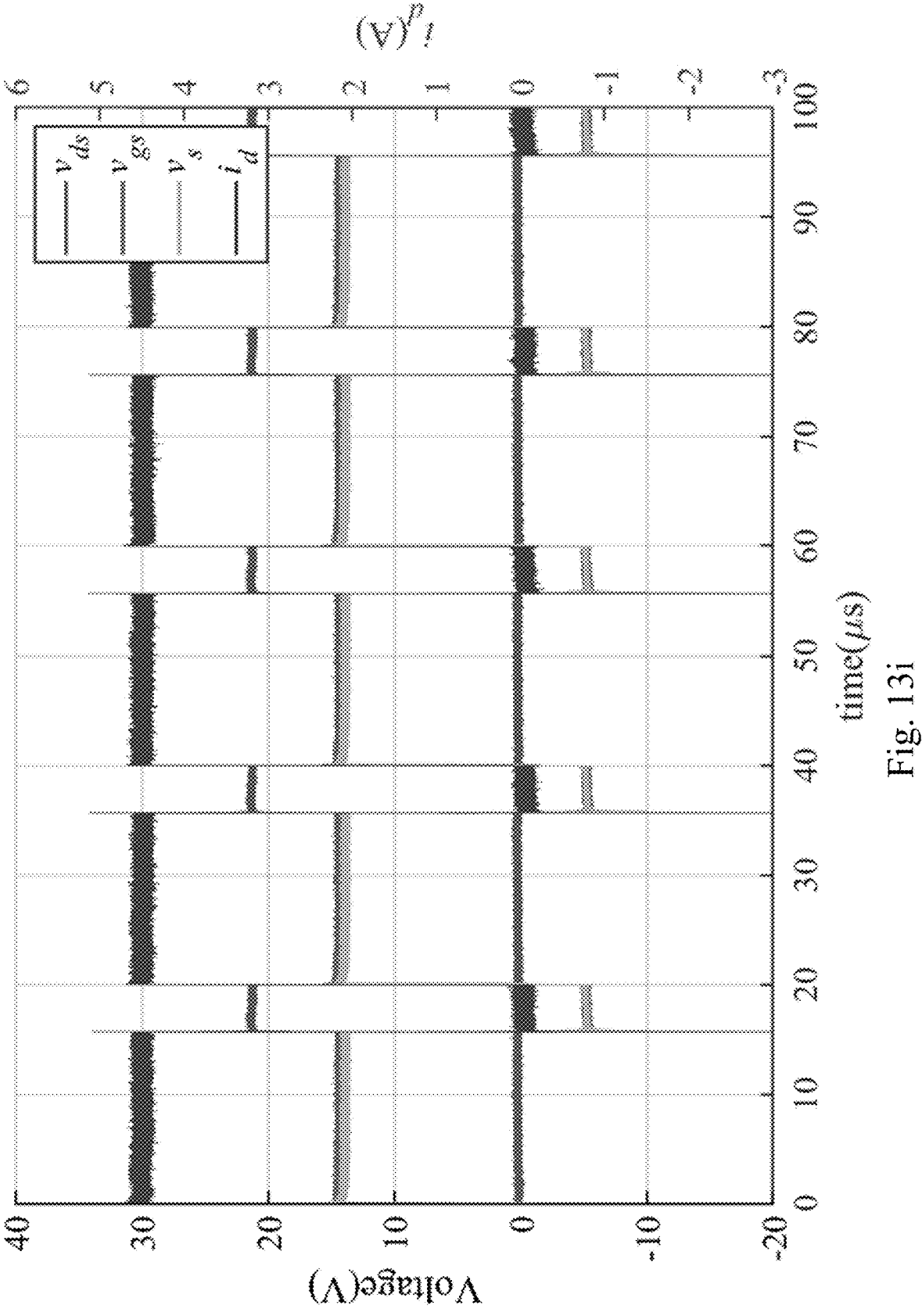
FIG. 13*i* shows the waveforms of $v_{ds}$, $v_{gs}$, $v_s$ and $i_d$ under D=0.8, when $R_{gss}$ equals to 4.7 kΩ in the simulation.

The measured waveforms of the drain-source voltage, $v_{ds}$, gate-source voltage, $v_{gs}$, output voltage of the gate driver, $v_g$, and drain current. $i_d$, upon turning off the SiC MOSFET for the three circuits are given in FIGS. 10a-10c respectively. The drain current before turning off is 4.6 A. The transient and steady-state characteristics are given in Table IV. The nomenclature of the symbols is given as follows:

$V_{ds,OFF}$: Steady-state off-state value of $v_{ds}$ $t_{ds,r}$: Rise time of $v_{ds}$ (10% to 90% of the steady-state value)

$v_{g,OFF}$: Steady-state off-state value of $v_g$ $t_{g,f}$: Fall time of $v_g$ (90% to 10% of the steady-state value)

$V_{gs,OFF}$: Steady-state off-state value of $v_{gs}$ $t_{gs,f}$: Fall time of $v_{gs}$ (90% to 10% of the steady-state value)

$I_{d,OFF}$: Steady-state off-state value of $i_d$ $t_{d,f}$: Fall time of $i_d$ (90% to 10% of the steady-state value)

TABLE IV

Transient and Steady-State Characteristics

| Parameter | Circuit shown in FIG. 5 | Circuit shown in FIG. 8a | Circuit shown in FIG. 8b |
|---|---|---|---|
| $V_{ds}$ | 20.9 V | 20.9 V | 20.9 V |
| $t_{ds,r}$ | 4.2 ns | 4.2 ns | 4.2 ns |
| $V_g$ | −6 | −6 | −6 |
| $t_{g,f}$ | 9.4 ns | 9 ns | 9.6 ns |
| $V_{gs}$ | −5.6 | −5.6 | −6 |
| $t_{gs,f}$ | 10.8 ns | 10.8 ns | 11 ns |
| $I_{d,OFF}$ | 0 A | 0 A | 0 A |
| $t_{d,f}$ | 3.2 ns | 3.2 ns | 3.4 ns |

Since the turn-off process only involves $R_{off}$ and $D_{off}$, based on the measured parameters, it can be observed that the fall time of $v_g$ and $v_{gs}$ and the turn-off time of $v_{ds}$ and $i_d$ of the circuit of FIG. 5 is nearly the same. The steady-state gate-source voltage slightly drops because of the small voltage drop across the diode.

The waveforms of $v_s$ under different values of $R_{gss}$ are observed. FIGS. 11a-11i show the waveforms of $v_s$ when $R_{gss}$ equals to 0, 300 kΩ, 200 kΩ, 150 kΩ, 100 kΩ, 47 kΩ, 15 kΩ, 10 kΩ and 4.7 kΩ, respectively. The switching frequency is 50 kHz and the duty cycle D of the SiC MOSFET is 0.5. $v_s$ takes approximately 500 ns before reaching the steady state. The steady-state value of $v_s$ against different $R_{gss}$ and gate leakage current $I_{gss}$ are tabulated in Table V.

TABLE V

Steady-state value of $v_s$ against different $R_{gss}$ and duty cycle D

| $R_{gss}$ | $I_{gss}$ | $v_s$ D = 0.2 | $v_s$ D = 0.5 | $v_s$ D = 0.8 |
|---|---|---|---|---|
| ∞ | 0 mA | 0.6 | 0.6 | 0.6 |
| 300 kΩ | 0.05 mA | 0.8 | 0.9 | 0.9 |
| 200 kΩ | 0.075 mA | 1 | 1.1 | 1.1 |
| 150 kΩ | 0.1 mA | 1.2 | 1.3 | 1.3 |
| 100 kΩ | 0.15 mA | 1.5 | 1.7 | 1.6 |
| 47 kΩ | 0.32 mA | 2.6 | 2.7 | 2.7 |
| 15 kΩ | 1.0 mA | 6.4 | 6.4 | 6.4 |
| 10 kΩ | 1.5 mA | 8.7 | 8.8 | 8.8 |
| 4.7 kΩ | 3.2 mA | 14.1 | 14.1 | 14.1 |

Figure 14:
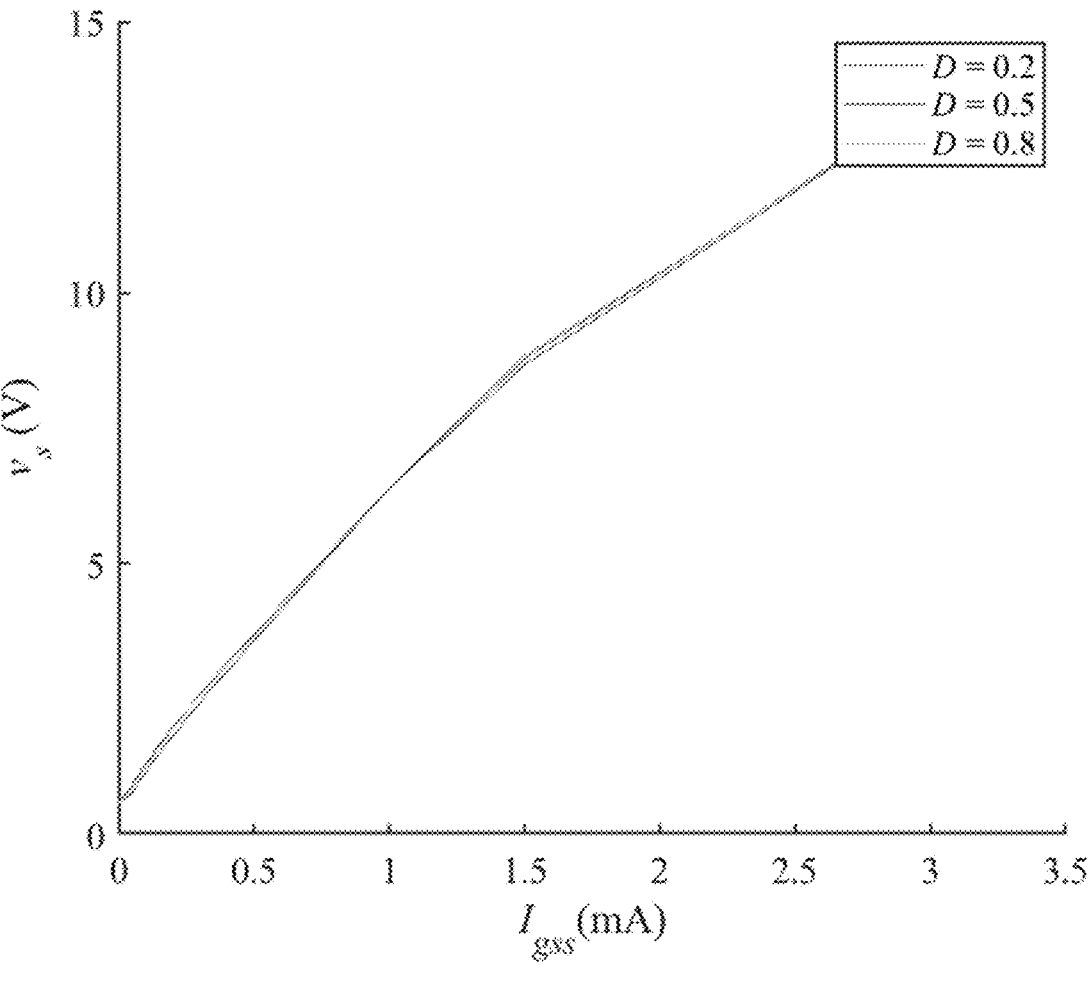
FIG. 14 shows the relationship between $v_s$ and $I_{gss}$ under the three duty cycle conditions.

With D=0.2 and D=0.8, the steady-state values of $v_s$ are given in Table V. The waveforms under these two duty cycle conditions are shown in FIGS. 12a-12i and FIGS. 13a-13i respectively. The relationships between $v_s$ and $I_{gss}$ are shown in FIG. 14. It can be observed that $v_s$ is nearly independent of the duty cycle and varies with $R_{gss}$ and thus $I_{gss}$. It can be used to detect the gate leakage current. It can be sensed by a microcontroller to detect the gate leakage condition of the SiC MOSFET.

In summary, one can see that the circuit shown in FIG. 5 provides a gate driving circuit including a current mirror to perform switching operation and monitoring the gate source leakage current simultaneously. The basic structure is a current mirror that mirrors the gate leakage current $i_g$ to a sensing resistor $R_s$. It includes the basic structure for measuring $i_g$, a bypass circuit for improving the switching speed, and a discharge circuit to enhance the dynamic response. The circuit has been tested on a 100 W switching circuit. The experimental results show that the switching speed of the MOSFET when using the proposed circuit is nearly the same as using a polarized network or a single $R_g$. Then, by inserting $R_{gss}$, the results show that the proposed circuit can perform sensing of the current through $R_{gss}$. Moreover, with the duty cycle of the MOSFET varying from 20% to 80%, the experimental results show that the sensing operation of the circuit of FIG. 5 is independent of the duty cycle of the gate signal.

The exemplary embodiments of the present invention are thus fully described. Although the description referred to particular embodiments, it will be clear to one skilled in the art that the present invention may be practiced with variation of these specific details. Hence this invention should not be construed as limited to the embodiments set forth herein.

While the invention has been illustrated and described in detail in the drawings and foregoing description, the same is to be considered as illustrative and not restrictive in character, it being understood that only exemplary embodiments have been shown and described and do not limit the scope of the invention in any manner. It can be appreciated that any of the features described herein may be used with any embodiment. The illustrative embodiments are not exclusive of each other or of other embodiments not recited herein. Accordingly, the invention also provides embodiments that comprise combinations of one or more of the illustrative embodiments described above. Modifications and variations of the invention as herein set forth can be made without departing from the spirit and scope thereof, and, therefore, only such limitations should be imposed as are indicated by the appended claims.

For example, although specific current mirror and discharging circuits are illustrated in FIGS. 4-5 with accompany descriptions, these are only those used in some embodiments of the invention. In a general sense, the current mirror structure can vary as long as its purpose remains consistent: to measure the gate current and mirror it to a sensing resistor. Similarly, the bypass switch can take on different structures as long as it effectively bypasses the current mirror during the turn-on process to drive the MOSFET. The specific design and structure of these modules/components can be adapted to suit the requirements and constraints of the system while still fulfilling their intended functions.

What is claimed is:

1. An apparatus for measuring a gate leakage current of a MOSFET, comprising:
    a) a current mirror adapted to be connected to a gate of the MOSFET; an input current path of the current mirror adapted to receive the gate leakage current of the MOSFET;
    b) a gate driver adapted to generate a driving signal for the MOSFET;
    c) a sensing resistor connected to the current mirror; the sensing resistor being located on an output current path of the current mirror; and
    d) d) a bypass switch connected in parallel to the current mirror; the bypass switch adapted to bypass the current mirror during a turn-on process of the MOSFET.

2. The apparatus of claim 1, further comprises a turn-on resistor and a turn-off resistor, both of which are adapted to be connected to the gate of the MOSFET.

3. The apparatus of claim 2, wherein the turn-on resistor is located on the input current path of the current mirror; the turn-off resistor having one end adapted to be connected to the MOSFET, and another end connected to the gate driver.

4. The apparatus of claim 1, wherein the current mirror comprises a first transistor and a second transistor having their base connected together; a collector of the first transistor adapted to be connected to the gate of the MOSFET; a collector of the second transistor connected to the sensing resistor.

5. The apparatus of claim 4, wherein the collector of the first transistor is connected directly to the base of thereof; the apparatus further comprising a diode that is connected between the collector and the base of the second transistor.

6. The apparatus of claim 4, wherein an emitter of the first transistor and an emitter of the second transistor are connected directly to the gate driver.

7. The apparatus of claim 1, wherein the bypass switch comprises a third transistor; the third transistor located on a current path from the gate driver to the MOSFET.

8. The apparatus of claim 7, wherein an emitter of the third transistor is connected to the gate driver; a collector of the third transistor adapted to connect to the MOSFET; a base of the third transistor connected to the gate driver through a RC circuit.

9. The apparatus of claim 1, wherein one end of the sensing resistor is connected to the current mirror, and another end of the of the sensing resistor is connected to a source of the MOSFET.

10. An apparatus for measuring a gate leakage current of a MOSFET, comprising:
    a) a current mirror adapted to be connected to a gate of a MOSFET; an input current path of the current mirror adapted to receive a gate leakage current of the MOSFET; the current mirror comprising a first transistor and a second transistor having their base connected together; a collector of the first transistor adapted to be connected to the gate of the MOSFET; a collector of the second transistor connected to the sensing resistor;
    b) a gate driver adapted to generate a driving signal for the MOSFET;
    c) a sensing resistor connected to the current mirror; the sensing resistor being located on an output current path of the current mirror; and
    d) a discharging circuit connected to the current mirror; the discharging circuit adapted to shorten a timer period required for the first transistor and the second transistor to transit from a saturation mode to a linear mode.

11. The apparatus of claim 10, wherein the discharging circuit comprises a comparator which has a first input connected to a reference voltage and a second input connected to the sensing resistor, a fourth transistor having a base connected an output of the comparator; a fourth resistor adapted to be connected between a collector of the fourth transistor and the gate of the MOSFET; and a third resistor connected between the base of the fourth transistor and a collector of the first transistor.

12. The apparatus of claim 11, further comprises a diode connected between the base and the collector of the fourth transistor.

* * * * *